(12) United States Patent
Sanderford, Jr. et al.

(10) Patent No.: US 7,705,777 B2
(45) Date of Patent: Apr. 27, 2010

(54) MOBILE MULTIFREQUENCY TRANSMITTER TRANSMITTING ON FREQUENCIES BASED ON GEOGRAPHIC LOCATIONS AND A METHOD THEREOF

(75) Inventors: H. Britton Sanderford, Jr., New Orleans, LA (US); Robert E. Rouquette, Kenner, LA (US); Gary A. Naden, Mandeville, LA (US); Marc L. Read, Mandeville, LA (US); Gordon J. Boudreaux, Arabi, LA (US); Michael R. Brown, Mandeville, LA (US)

(73) Assignee: M&FC Holding, LLC, Pittsburgh, PA (US)

( * ) Notice: Subject to any disclaimer, the term of this patent is extended or adjusted under 35 U.S.C. 154(b) by 0 days.

(21) Appl. No.: 11/562,716

(22) Filed: Nov. 22, 2006

(65) Prior Publication Data

US 2007/0071114 A1  Mar. 29, 2007

Related U.S. Application Data

(60) Division of application No. 10/662,530, filed on Sep. 16, 2003, now Pat. No. 7,477,694, which is a continuation of application No. PCT/US02/06674, filed on Mar. 29, 2002.

(60) Provisional application No. 60/279,671, filed on Mar. 30, 2001.

(51) Int. Cl.
G01S 1/00 (2006.01)
H04B 7/185 (2006.01)

(52) U.S. Cl. .................... 342/357.12; 342/357.06; 342/357.15

(58) Field of Classification Search .............. 342/352, 342/358, 357.06, 357.12, 357.15, 357.01, 342/357.08, 357.09; 375/130, 141, 259, 375/135, 146, 250, 260; 455/3.01, 3.05, 455/427, 12.1, 437, 438, 441, 456.1, 456.2, 455/456.3
See application file for complete search history.

(56) References Cited

U.S. PATENT DOCUMENTS

| 4,110,814 A | 8/1978 | Britton et al. |
| 4,799,062 A | 1/1989 | Sanderford, Jr. et al. |
| 4,843,613 A | 6/1989 | Crowle |

(Continued)

FOREIGN PATENT DOCUMENTS

| GB | 2 179 480 | 3/1987 |
| GB | 2 330 261 | 4/1999 |

Primary Examiner—Young T. Tse
(74) Attorney, Agent, or Firm—Oblon, Spivak, McClelland, Maier & Neustadt, L.L.P.

(57) ABSTRACT

A mobile multifrequency transmitter includes a self-locator, a frequency selector, and a communication unit. The self-locator is configured to determine a current self location without transmitting an outgoing signal, and to provide the self location to the multifrequency transmitter. The frequency selector is configured to select a usable frequency based on the current self location. The communication unit is configured to transmit on said selected usable frequency. A mobile communication method includes the steps of obtaining a current self location from a self-locator without transmitting an outgoing signal, looking up in a database an allowable frequency band corresponding to the current self location, and transmitting on the allowable frequency band. Thus, the mobile multi-frequency transmitter is capable of handling an automatic frequency switchover without the need for higher level cellular direction.

11 Claims, 68 Drawing Sheets

U.S. PATENT DOCUMENTS

| | | | |
|---|---|---|---|
| 4,977,577 A | 12/1990 | Arthur et al. | |
| 5,067,136 A | 11/1991 | Arthur et al. | |
| 5,095,493 A | 3/1992 | Arthur et al. | |
| 5,119,396 A | 6/1992 | Sanderford, Jr. | |
| 5,265,120 A | 11/1993 | Sanderford, Jr. | |
| 5,311,197 A * | 5/1994 | Sorden et al. | 342/457 |
| 5,311,541 A | 5/1994 | Sanderford, Jr. | |
| 5,377,222 A | 12/1994 | Sanderford, Jr. | |
| 5,408,217 A | 4/1995 | Sanderford, Jr. | |
| 5,598,427 A | 1/1997 | Arthur et al. | |
| 5,627,547 A * | 5/1997 | Ramaswamy et al. | 342/357.08 |
| 5,745,075 A * | 4/1998 | Enge et al. | 342/367 |
| RE35,829 E | 6/1998 | Sanderford, Jr. | |
| 5,953,368 A | 9/1999 | Sanderford, Jr. et al. | |
| 5,966,411 A | 10/1999 | Struhsaker | |
| 5,987,058 A | 11/1999 | Sanderford, Jr. et al. | |
| 5,999,561 A | 12/1999 | Naden et al. | |
| 6,031,883 A | 2/2000 | Sanderford, Jr. et al. | |
| 6,154,500 A | 11/2000 | Dorenbosch et al. | |
| 6,154,656 A * | 11/2000 | Camp, Jr. | 455/456.2 |
| 6,282,419 B1 * | 8/2001 | Findikli | 455/434 |
| 6,285,281 B1 * | 9/2001 | Gatto | 340/539.26 |
| 6,329,946 B1 * | 12/2001 | Hirata et al. | 342/357.12 |
| 6,331,836 B1 * | 12/2001 | Jandrell | 342/357.12 |
| 6,335,953 B1 | 1/2002 | Sanderford, Jr. et al. | |
| 6,714,789 B1 * | 3/2004 | Oh et al. | 455/456.1 |

* cited by examiner

CASE I   Initial Message Weaker than the Second
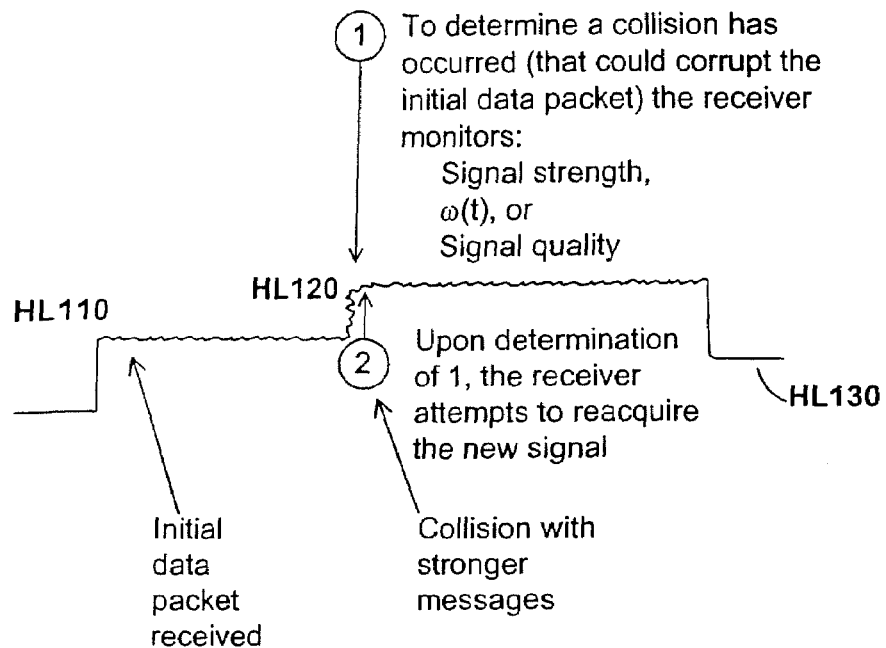
CASE II   Initial Message Stronger than the Second
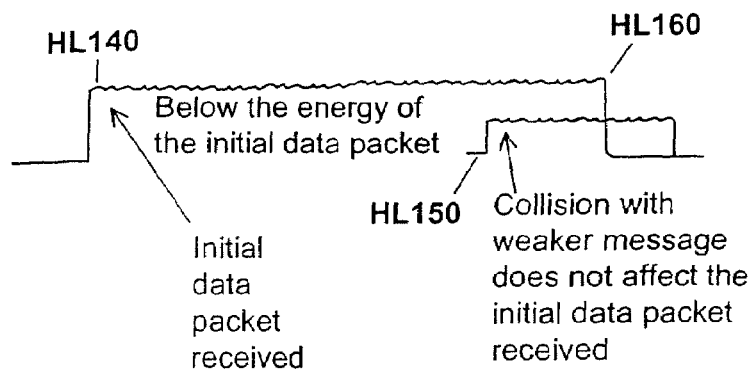
This method typically prevents the loss of both colliding data packets and therefore, meets the sloted ALOHA form (there is no "2" in the exponent)
Slotted ALOHA: $e^{-\lambda NT}$     Non-slotted ALOHA: $e^{-2\lambda NT}$
FIGURE 2

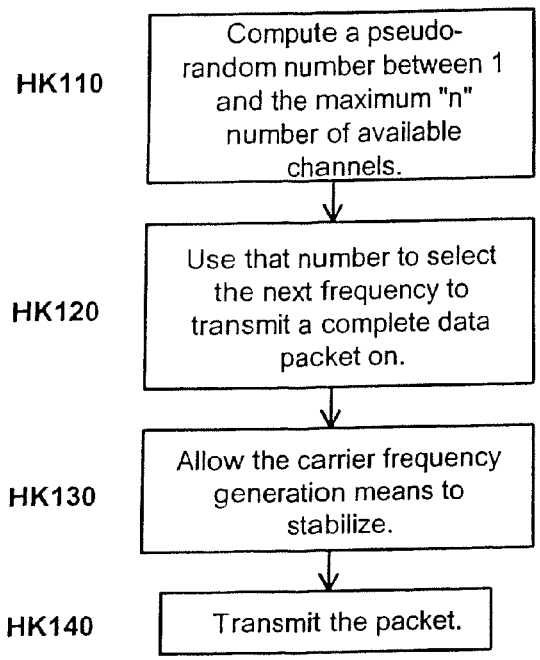
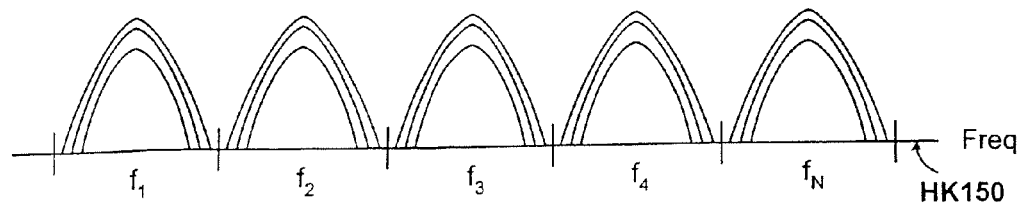
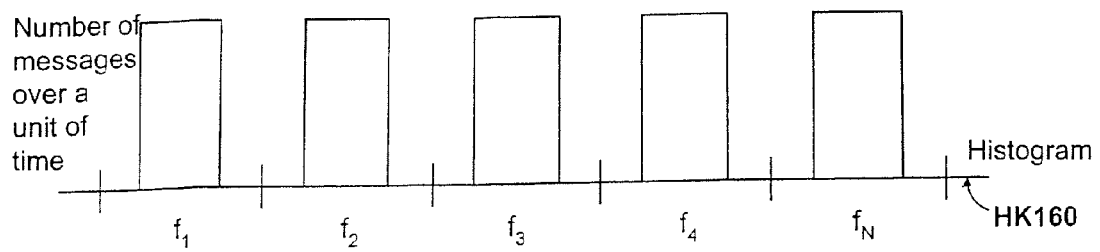
FIGURE 4

Bandwidth Efficient, Non-channelized Spectrum Utilization

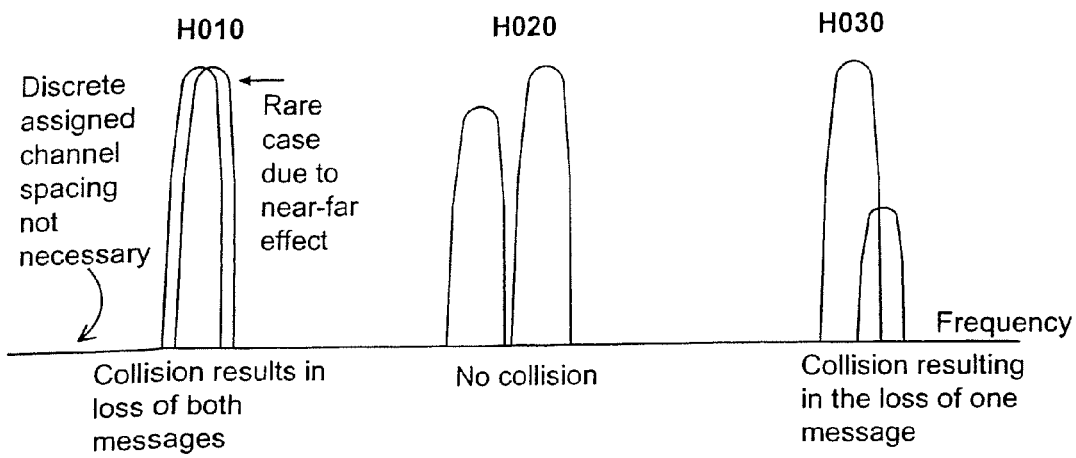

This method creates additional channel capacity

1) Utilizing channel spacing smaller than signal BW & guard band
2) Vary the transmitted frequency of transmissions so that channel overlap causes a statistical loss that is overcome by redundant transmissions and follows the form:

$$P_s = 1 - [1 - e^{-(2\lambda NT/P)}]^M$$

Assumes that a data collision in a channel causes loss of both messages where:

$P_s$ = Probability of successful reception of "B" base stations
$\lambda$ = 1/time between transmissions
$N$ = Number of remote end-points in the coverage range of a base station - one
$T$ = Time duration of a data packet
$M$ = Number of times that a transmission is redundantly transmitted by a given end-point
$P$ = Signal BW/available system BW

FIGURE 5 data payload portion can contain a history of past readings:
present reading, $\Delta_1$ from last reading, $\Delta_2$ from $\Delta_1$,..., $\Delta_{N+1}$ from $\Delta_N$

Previous Data History Added to Packets to Increase Reliability

Conventional Approach:

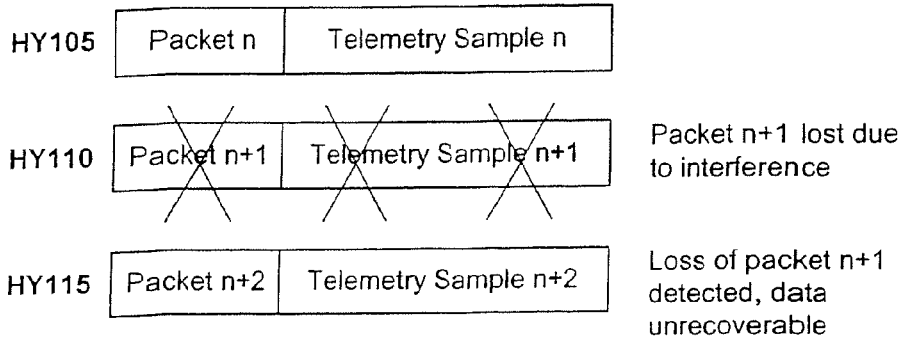

Probability of Telemetry Sample Loss ($P_{TSL}$)
= Probability of Packet Loss ($P_{PL}$)

EX) If $P_{PL}$ = 20%
then $P_{TSL}$ = 20%

Present Invention Approach:

The current telemetry sample in addition to the amount of change to the M previous samples

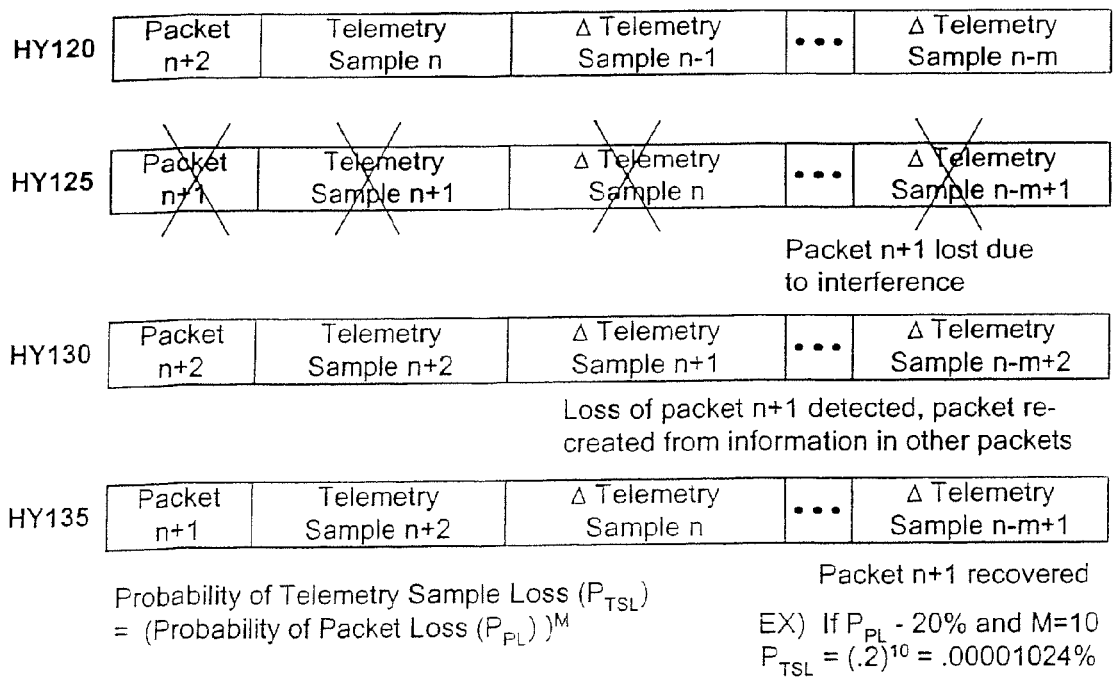

Probability of Telemetry Sample Loss ($P_{TSL}$)
= (Probability of Packet Loss ($P_{PL}$) )$^M$ EX) If $P_{PL}$ - 20% and M=10
$P_{TSL}$ = $(.2)^{10}$ = .00001024%

FIGURE 9

Message Sequence Numbers for Missed Message

|  |  | Message | Detection and Security |
|---|---|---|---|
| HV110 | Remote Endpoint #123456789 — Sequence 3210 | Message n | Sequence indicates that the next message should be 3211 |
| HV115 | Remote Endpoint #123456789 — Sequence 3212 | Message n + 1 | Sequence indicates that message 3211 was missed and should be recreated |
| HV120 | Remote Endpoint #123456789 — Sequence 3213 | Message n + 2 | Normal expected sequence |
| HV125 | Remote Endpoint #123456789 — Sequence 1201 | Message n + 3 | Illegal message from invalid endpoint, sequence grossly in error. Security violation detected. |
| HV130 | Remote Endpoint #123456789 — Sequence 3214 | Message n + 4 | Normal expected sequence |

FIGURE 11

Data Concentrator Operation

Conventional Cellular Radio Systems Utilize Sectored Antennas to Increase Capacity Requires 3 Sets of receiver hardware The instant invention utilizes a single omni-directional antenna with overlapping coverage of adjacent cells to reduce cost and with the combined messages from adjacent cells to provide macro diversity and resistance to shading.

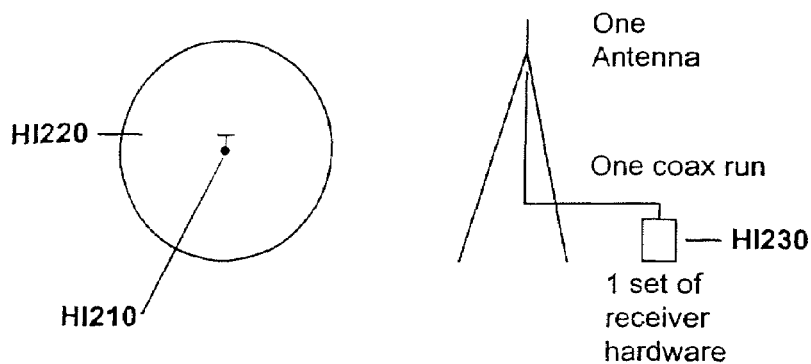

$$P_s = 1 - [1 - e^{-\lambda NT}]^{MB}$$

$P_s$ = Probability of success of "B" base stations
$\lambda$ = 1/time between transmissions
N = Number of remote end-points in the coverage range of a base station - one
T = Time duration of a data packet
M = Number of times that a transmission is redundantly transmitted by a given end-point
B = Number of base stations that are in radio range of the remote end-point

FIGURE 14

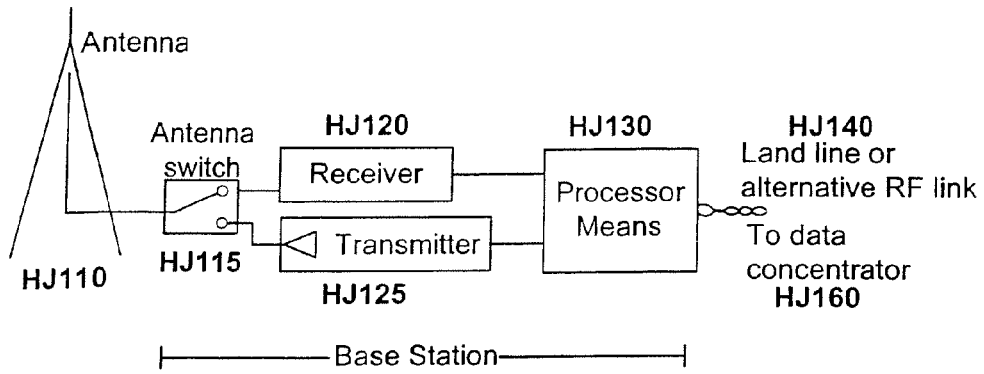

- Base station operates in half duplex mode to reduce cost. In full duplex mode, unless transmit and receive frequencies are widely spaced the base station transmission would de-sense its own receiver.

- Outbound transmissions to two-way remote end-points are limited to approximately a 1% duty cycle. The 1% is then added to the ALOHA channel capacity and has minimal system impact.

$$P_s = 1 - \left[1 - e^{-(\lambda NT + 1\%)}\right]^M$$

$P_s$ = Probability of successful reception
$\lambda$ = 1/time between transmissions
N = Number of remote end-points in the coverage range of a base station - one
T = Time duration of a data packet
M = Number of times that a transmission is redundantly transmitted by a given end-point

FIGURE 15

Method to Allow Wide Geographic Freedom Over
Different Licensed Frequency Bands in a Mobile Tracking
System Without the Need of Externally Controlled Frequency
Switch-over and Management
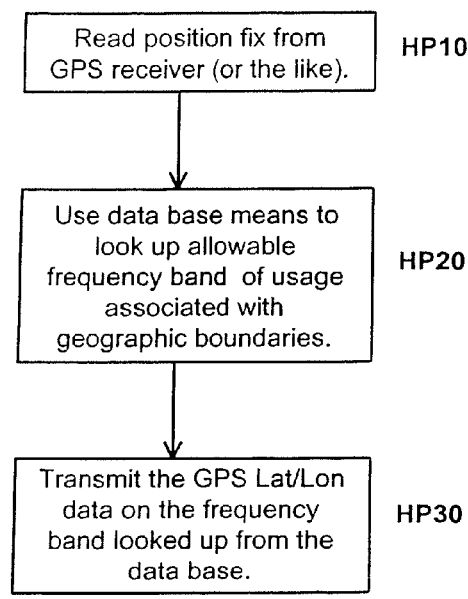
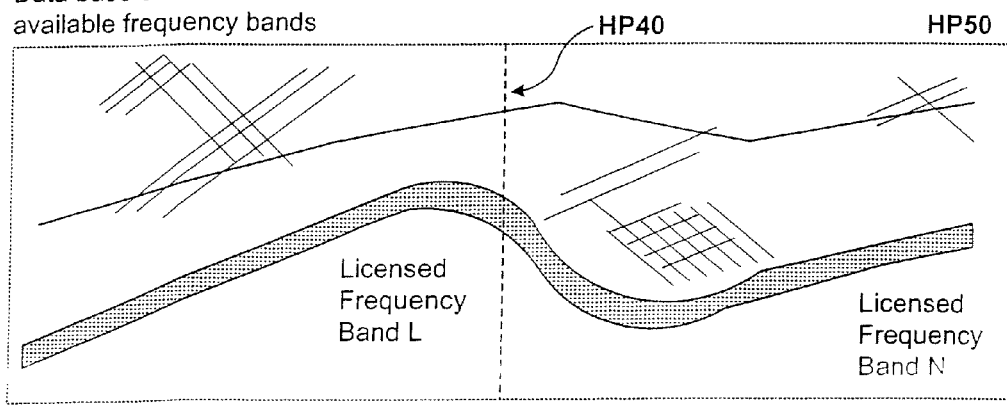
FIGURE 17

Example of Automatic Frequency Selection for
Transmit-only System Sending GPS Data for Remote Location

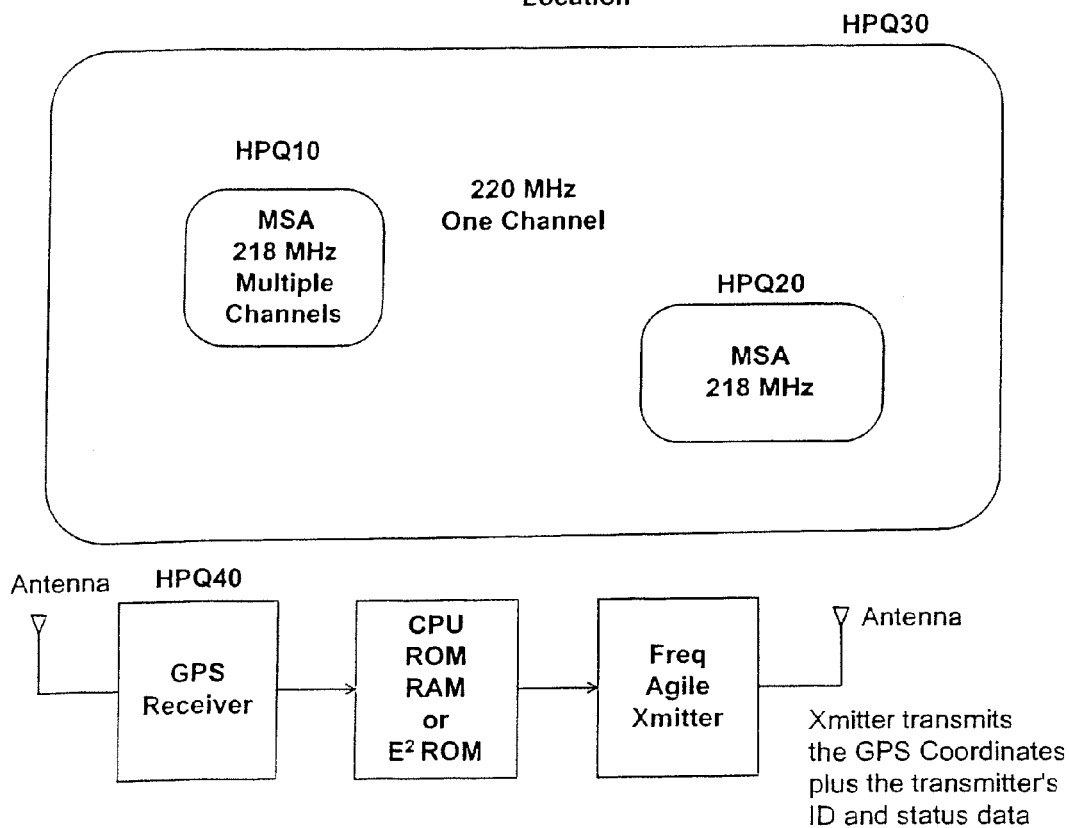

CPU (μc) is loaded with MSA boundaries. The CPU reads coordinates from GPS receiver. The CPU determines if the coordinates are in the bounds of the MSA. If yes, the CPU sets the frequency agile transmitter to 218 MHz (one of several available channels); if no, the CPU sets the frequency agile transmitter to 220 MHz. In this method more message traffic can be supported with multiple MSA channels.

FIGURE 18

Selectable Enhanced Signal Margin Without the Cost of Higher Output Power Transmitter Amplifier Stages

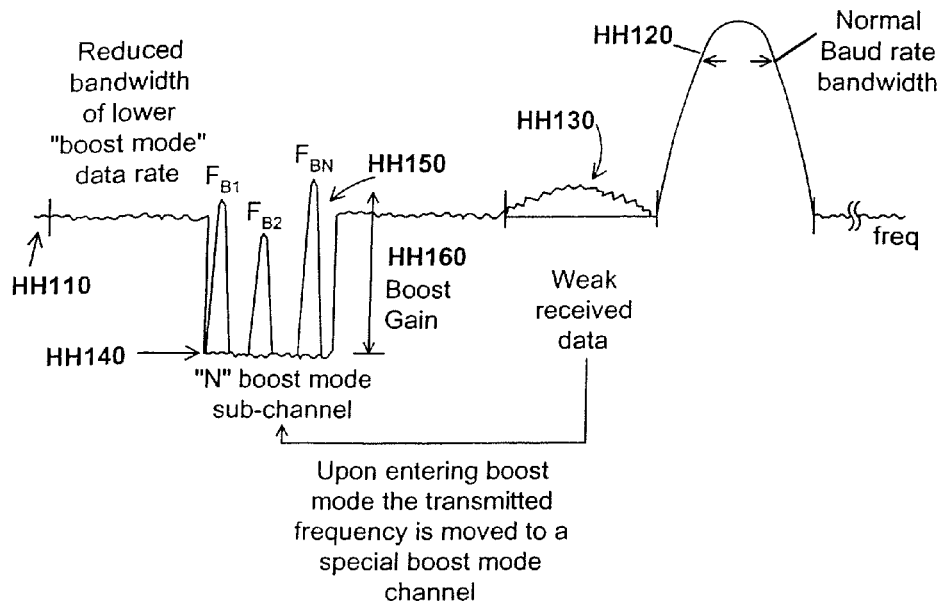

$$\text{SNR improvement} = 10 \log \frac{\text{Normal Baud Rate}}{\text{Lower (Boost) Baud Rate}}$$

$$10 \log \frac{16.64 \text{ kb/s}}{520 \text{ bps}}$$

$$= 15 \text{ dB}$$

15dB boost mode can overcome the 10-15 dB loss from mounting a remote end-point in a buried water meter.

To match this signal margin improvement, the remote end-point transmitter would have to transmit 32 times more signal power.

FIGURE 20

Boost Mode Channel Load Leveling

Number transmitted packets reduced by $\propto \dfrac{\text{Normal Baud}}{\text{Lower ("Boost") Baud}}$

FIGURE 22

Separate Boost Channel is Assigned to Avoid the Channel
Roll Off of Strong Transmitters Adjacent Channels

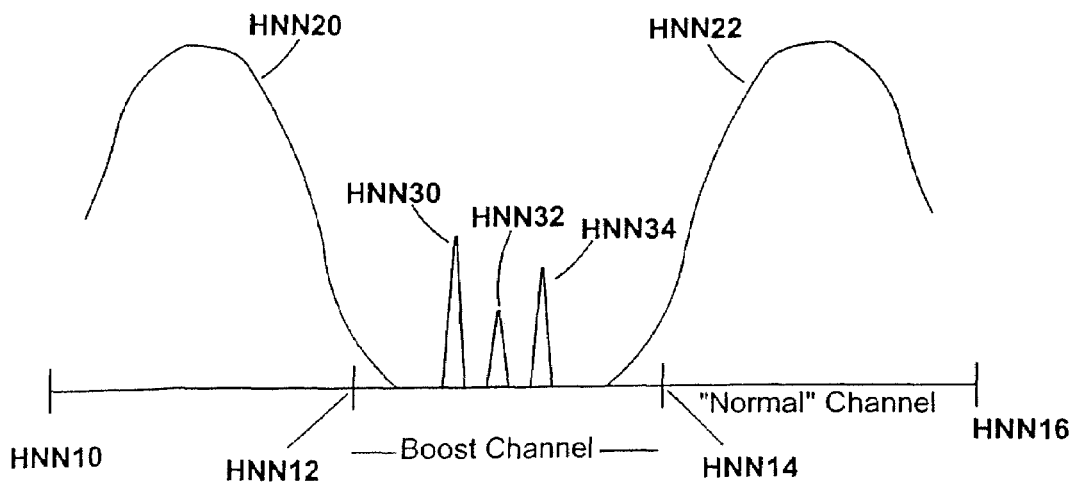

The boost sub-channels are concentrated in the middle of the
channel assigned to receive boost mode transmission.

Bleed-over from adjacent channels can be caused by frequency
drift, osicllator phase noise, PLL spurs, modulation roll off,
transmitter data filter roll-off, crystal aging or Dopler shift.

FIGURE 23

10 Channel Frequency Plan Preferred Embodiment

| Channel # | 50 KHz Each |
|---|---|
| 1 | Home Gateway, Micro Area Network [can be a unique local modulation/protocol] |
| 2 | Reserved for future battery-operated version transceiver (low traffic) |
| 3 | Boost Mode (centered in middle of channel) |
| 4 | Transmit-only remote end-point ALOHA Operation Channel A, fixed |
| 5 | Transmit-only remote end-point ALOHA Operation Channel B, fixed |
| 6 | Transmit-only remote end-point ALOHA Operation Channel C, fixed |
| 7 | Transmit-only remote end-point ALOHA operation Channel D, fixed (or alternatively mobile applications) |
| 8 | Mobile applications (transmit-only & two-way) |
| 9 | Reserved for utilities requiring an independent channel (or mobile applications) |
| 10 | Reserved for future definition [possible monitor of remote base station repeating signal to eliminate its land lines] |

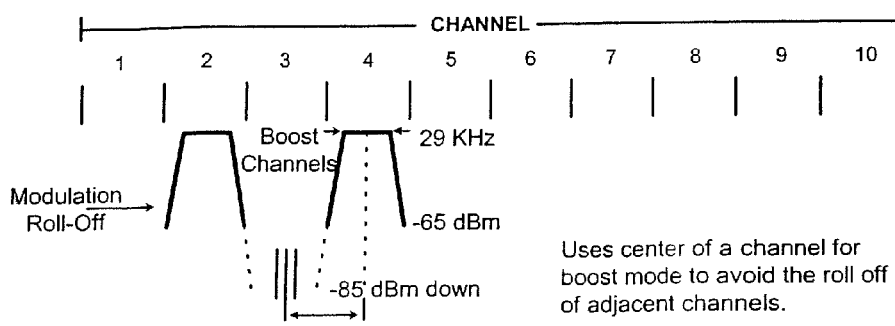

Uses center of a channel for boost mode to avoid the roll off of adjacent channels.

16.6 Kb/s Normal Mode data rate (50 kHz channel separation)
520 b/s Boost Mode (channel separation of 4.2 kHz)
Boost mode assumed in 1 out of 32 installations:
    (16.6 kb/s ÷ 520 Baud) = 32X normal message duration
    The 5 transmit-only ALOHA channels (4,5,6,7 & 8) can all share 5 Boost Mode channels
    (Approximately 5 boost channels could be received simultaneously, but 8 can fit.)
    10 Log (16.6 kb/s ÷ 520 Baud) = 15 dB improvement over the normal mode Baud rate
Assumes transmit-only and transceiver remote end-point devices are statistically close to desired frequency; since this is an ALOHA system, it will have a limited impact on throughput (reduces demands on guard band). Alternatively, transceivers can use base station as pilot tune to eliminate its own frequency error.
Fixed location transmit-only remote end-point devices operate in channel A, B, C or D; and mobile GPS locatable transmitters operate in channels 8 and 9.
Remote transceivers have 2 main purposes
    1) As repeaters of transmit-only remote end-point devices
    2) As controllers of remote end-points (outputs)
Home gateway positioned adjacent to a remote end-point transceiver channel; the remote end-point transceiver can switch frequencies "instantly" in DSP software providing I.F. is 110 KHz wide. This means that the base station may not have to receive in Channel 1.

FIGURE 27

Battery Life of Transmit-only Remote End-point

Avg transmit current:

$$\frac{15\text{ms}}{15 \text{ min} \cdot 60\text{s}} \cdot 550 \text{ mA} = 9.2 \text{ μA}$$

Transmit set-up current:

$$\frac{10\text{ms}}{15 \text{ min} \cdot 60\text{s}} \cdot 25 \text{ mA} = .3 \text{ μA}$$

Sleep time current & leakage         5.0 μA

Total average current:               14.5 μA

Assume a 1.4 AH lithium battery 1.4 AH • 80% derate ÷ 14.5 μA = 72,258 hrs

÷ 24 ÷ 365 = 8.2 years

Data Decision Threshold Scale Factor
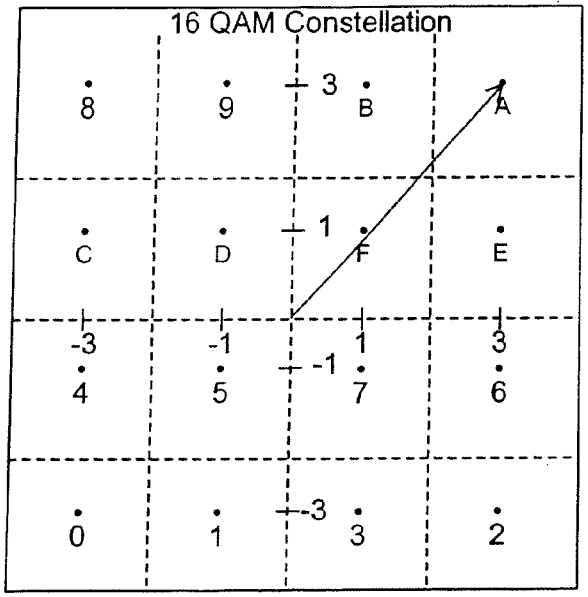
A1010
A1020
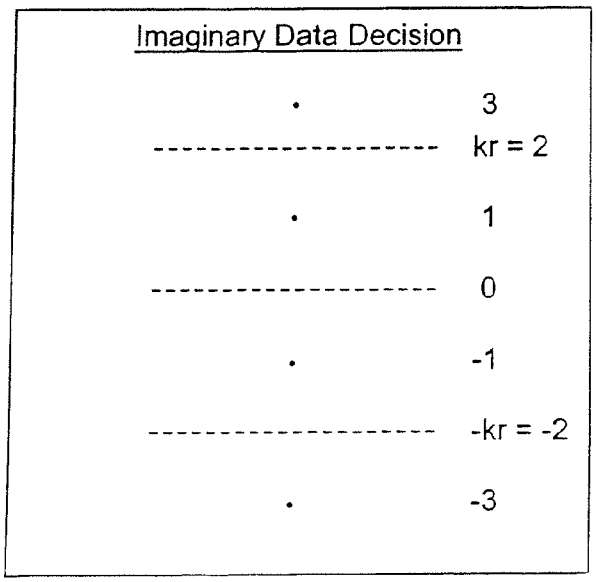
A1030
FIGURE 48

A = Task local reference & settle
B = Multichannel signal detection

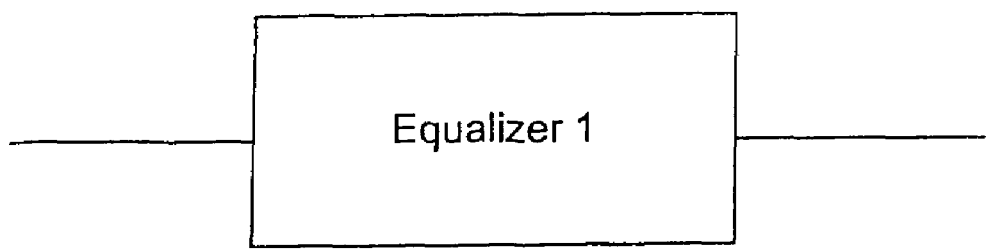
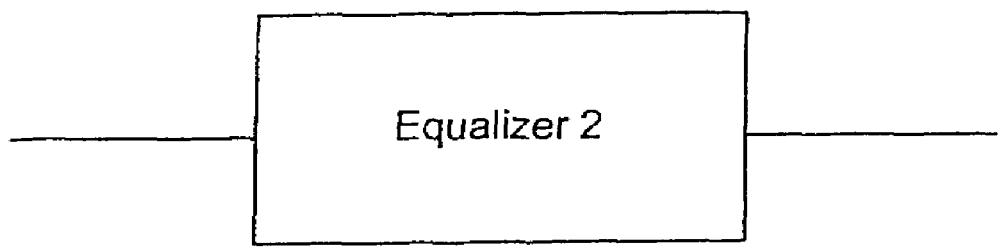
FIGURE 54

FIGURE 63

| Symbol Nibble | FSK Freq Pattern |
|:---:|:---:|
| F | 0, -1, 1, -1 |
| E | -1, -2, 2, -2 |
| D | 1, 0, 0, 0 |
| C | 2, -1, -1, 1 |
| B | -1, 2, 2, -2 |
| A | 0, 3, 3, -3 |
| 9 | 2, 1, 1, -1 |
| 8 | 3, 0, 0, 0 |
| 7 | -1, -1, 0, -1 |
| 6 | -2, -2, 1, -2 |
| 5 | 0, 0, -1, 0 |
| 4 | 1, 1, -2, 1 |
| 3 | -2, 1, -1, -2 |
| 2 | -3, 2, 0, -3 |
| 1 | -1, 0, -2, -1 |
| 0 | 0, 3, -3, 0 |

MOBILE MULTIFREQUENCY TRANSMITTER TRANSMITTING ON FREQUENCIES BASED ON GEOGRAPHIC LOCATIONS AND A METHOD THEREOF

CROSS REFERENCE TO RELATED PATENT DOCUMENTS

This application is a divisional of and claims the benefit of priority under 35 USC §120 from U.S. Ser. No. 10/662,530, filed Sep. 16, 2003, which is a continuation of PCT application PCT/US02/06674 filed on Mar. 29, 2002, which is a 119(e) of Provisional Application No. 60/279,671, filed Mar. 30, 2001, the entire contents of which are incorporated herein by reference.

BACKGROUND OF THE INVENTION

1. Field of the Invention

The present invention is directed toward communication related systems, wide area and local area networks, apparatuses and methods as well as computer based digital signal processing mechanisms and methods used therein. More particularly, the invention is directed toward communication systems, methods, and apparatuses that use signals that are modulated using a combination of FSK modulation and QAM submodulation.

2. Discussion of the Background

It would be advantageous if a remote environmental monitor, a utility meter (e.g., water, gas, or electric), a security system, a mobile data application, or other remote device, hereafter referred to as a "remote endpoint," could communicate with a base station receiver which in turn would forward the endpoint information (e.g., impurity count, meter read, alarm, or position fix) to some central location. This central location could be part of a wide area network (WAN), or a local area network (LAN).

WAN Applications

Cost to Acquire Remote Endpoint Data

The cost to acquire information from remote endpoints includes (using a remote meter monitoring application as an example) the cost of the meter interface, the meter transmitter (or transceiver), the remote receiver (or transceiver), as well as the forwarding infrastructure, including radio spectrum costs. For example, if the remote receiver has a very limited range such that it can only communicate with one meter, then the cost of that receiver must be fully burdened into the cost to acquire the meter information. Additionally, the cost to install and maintain that remote receiver must be fully burdened as well.

It would therefore be desirable to have a remote receiver (transceiver) communicate with as many endpoints as possible. It would be advantageous if the remote receivers were each able to cover as great a range as possible. Having sufficient range would eliminate costly intermediate tiers of repeaters and/or store-and-forward hand-off devices. It would be advantageous if a radio system that could communicate over many miles were very reliable since the loss of a base station that is responsible for receiving data from thousands or tens of thousands of remote endpoints could be devastating.

Furthermore, it would advantageous if the system were not readily susceptible to jamming. Any source of interference within "view" (i.e., listening range) of a receiver can severely degrade the reliability of the system. Such degradation in reliability translates into a reduced range of the system. A five-block range creates a view area of approximately 0.8 square miles. A 10-mile range creates a view of 314 square miles. Accordingly, an increase in range brings a quadratic increase in the probability of an in-view interference source (the area in a circle is a function of the square of the range).

Conventional approaches for wide area remote monitoring, may be broadly categorized into three groups: short range, long range, and very long range (i.e., satellite).

Short Range Products (One Mile or Less)

Products falling into this category generally have high infrastructure costs associated with them. Large numbers of remote receivers must be bought, installed and maintained. By their nature, short-range devices require either a receiver dedicated to a single endpoint, or intermediate transceivers set up in a cellular or repeater fashion to create multiple tiers of data handoff. Some shorter-range strategies require that a receiver be co-located with a cable box, home computer, modem, or in a drive-by vehicle. These approaches do not yield ubiquitous coverage area and/or are poorly controlled and thus not a reliable alternative.

Long Range Products (One Mile or More)

Conventional long-range communications services for multi-point-to-point monitoring are based on two-way communications. Two-way handshaking is needed to dynamically assign frequency channel usage amongst customers. In the case of voice and two-way messaging, it is a logical requirement (users "talk" and "listen")

Very Long Range Products (Satellite)

A satellite's greatest advantage, range, is also a weakness. As the range (footprint) increases, the number of endpoints in view increases quadratically, and so does required bandwidth. A competitive satellite system would require approximately 200 MHz of bandwidth to equate to 500 KHz of terrestrial base stations. This will considerably impede satellites from servicing dense applications that require updates every 15 minutes. In addition, present satellite systems are two-way (a requirement for licensed frequency dynamic allocation). This creates a permanent three times or greater cost disadvantage for such systems (present satellite transceivers have at least a 20 times cost disadvantage due to other factors such as very tight ppm budgets). Further, the required update rates would yield unacceptable battery life.

Most of the LAN data communications suppliers and standards (IEEE 802.11, Bluetooth, Swap Home RF, ultrawide bandwidth, etc.) are focused on the high data rate (1-10 million bits per second) market required for PC-to-PC connection.

These higher data rates significantly reduce range and therefore require more closely spaced base stations. This in turn increases hardware and installation cost. This also can increase the requirement for repeaters.

SUMMARY OF THE INVENTION

The inventors of the present invention have recognized that conventional approaches to remote monitoring are inadequate from both a technical and a cost effectiveness perspective. Accordingly, an object of the present invention is to address these identified inadequacies, as well as others, to provide a system for remote monitoring that has advantageous performance characteristics, is reliable, and is cost effective making it an option for a vast range of potential applications for remote monitoring.

The inventors of the present invention have recognized that remote monitoring solutions should not be bound to either a WAN or a LAN environment. Accordingly, the present inventors have devised an approach to remote monitoring that is not limited to any network topology, but rather, may be customized to meet the unique needs of any installation. The present invention is applicable to systems that exist in a LAN environment, or a WAN environment. A WAN in the present invention can be any large geographic area, for example an entire metropolitan area. A LAN in the instant invention may be any smaller environment, for example a commercial building, an industrial plant or a campus of contiguous buildings and facilities.

The inventors of the present invention have further recognized that the use of middle layer repeaters limits the flexibility of a remote monitoring system, and for some applications, makes the remote monitoring cost-prohibitive. Accordingly, the present invention does not mandate a middle-tier repeater layer and enjoys a significantly lower cost infrastructure than the existing alternatives.

The inventors of the present invention have further recognized that one-way communication systems may be built at a significant cost savings and complexity savings over bi-directional communication systems. Accordingly, the present invention primarily uses one-way transmit-only devices with the advantage of three times or greater product cost savings over a two-way device. Furthermore, the present inventors have recognized that a transmit-only architecture provides a huge battery life advantage over two-way systems that must also power a receiver. This advantage makes the present invention an attractive option for certain applications that heretofore have been unable to practically consider remote monitoring. Further yet, two-way systems typically have a longer synchronization/handshaking time. This translates into longer on-air time, use of greater bandwidth and shorter battery life.

One embodiment of the present invention operates at 16.6 kb/s and is well suited to ranges between 5 to 100 kb/s. This is advantageous from several perspectives. First, higher data rates translate into lower range. Systems operating at a 2 megabit per second data rate would have reduced range corresponding to the instant invention transmitting at about 100 times less power ($10*\log(2\times10^6/16.6\times10^3)$). Second, lower data rate products that are power pole mounted, such as Whisper, must remain on the air longer than the devices of the present invention (approximately 20 times or more, due to data rate and initial preamble acquisition), and are not optimized to operate in a transmit-only mode. This reduces the number of remote endpoints that can be read by one receiver, increases infrastructure cost, and considerably reduces battery life in applications such as water and gas meters. Higher data rate (e.g., 128 kb/s), power pole mounted products, such as Metrocom's Ricochet, have other deficiencies. Ricochet systems must repeat data messages from pole mounted data collectors in a bucket brigade fashion. This wastes radio bandwidth and adds complex routing hardware and software.

One WAN-based embodiment of the present invention is configured to operate in licensed frequency bands such as 218 MHz, 220 MHz and 700 MHz.

The present invention is equally applicable to local area network environments that can have simple point-to-point, or more complex multi-point-to-point configurations. The 'point' can be a small base station or a network of interconnecting base stations. Those interconnections can be hard wired or wireless where the base stations form interconnections via smart and dumb repeaters. One LAN-based embodiment of the present invention is configured to operate primarily in unlicensed bands such as 868 MHz, 915 MHz, 2.4 GHz and 5.8 GHz.

According to the present invention, several novel methods are combined to reduce remote endpoint cost, and to increase the system's overall range (e.g., up to 10 miles, or even greater distances). This increased range in turn leads to the feasibility of a novel system architecture which includes geographically dispersed tower receiver base stations which connect to one or more data concentrators.

In one embodiment of the present invention, range is increased by using a novel form of FSK data modulation that eliminates the effect of message DC, allowing direct VCO modulation at full data rate. The inventors of the present invention have also invented novel DSP receiver algorithms that achieve near theoretic sensitivity at full data rate while rapidly eliminating the frequency uncertainty caused by low cost crystals used in the remote endpoint.

Conventional systems typically achieve much shorter ranges and, therefore, quadratically smaller service coverage areas. This shorter range in operation corresponds to a quadratically smaller number of monitorable endpoint devices. It also corresponds to a quadratically larger number of base station receivers required to cover a region, and an increase in the infrastructure required for data collection. For example, in Arthur et al. (U.S. Pat. No. 4,977,577), Sanderford et al., (U.S. Pat. No. 5,987,058), Rouquette et al. (U.S. Pat. No. 5,920,589), and Sanderford et al., (U.S. Pat. No. 5,953,368) a range of approximately ½ mile was achieved when monitoring a data collector from a power pole approximately 30 feet off of the ground. The resulting coverage area was 0.79 square miles. The present invention has an increased range of at least 10 miles when an antenna is elevated 200 feet on an existing communications tower. The resulting coverage area with the present invention is 314 square miles, or 400 times the coverage area of conventional systems. The inventors of the present invention have recognized that by achieving such an expansive range, that it is economically practical to provide 3× or more overlapping coverage, which provides excellent signal path redundancy. It would require 400 data collectors based on conventional systems with no redundancy overlap to match the coverage area of one data collector based on the present invention. Adding overlap to achieve the performance of the present invention only increases this number. In order to cover a large city using conventional systems, thousands of power pole mounted data collectors would be needed. A further deficiency of conventional data collectors is that they must be connected by some method, but it is cost prohibitive to use copper or fiber connection.

It is impractical to install, pay for and maintain thousands of landline/phone connections in order to collect data at a central point. Conventional systems use RF repeater or other RF backhaul means. This wastes bandwidth, can double hardware costs (can require a second set of radio hardware) at each power pole mounted data collector and typically leads to complex routers and/or smart databases to reduce communications traffic on the backhaul.

The inventors of the present invention have further recognized that by achieving such gains in coverage range, so few tower base stations are required that system architectures can be configured that are very elegant yet completely scalable. In one embodiment of the present invention, each tower mounted base station uses a landline connected directly to a centralized data concentrator. A typical city may be covered with 10 to 14 tower base stations, a city the size of Dallas with 40 to 50.

The inventors of the present invention have recognized that the proliferation of communication towers due to the expansion of the cellular telephone industry provides an advantageous alternative to pole mounting. Ten years ago, the construction of a tower and right-of-way acquisition may cost $125,000 to $250,000 each. Today, space on a communication tower can be rented for $500 to $1,000/month. In addition, these towers are already in ideal locations, elevations and ergonomic deployments required to meet the need of cellular and other communications systems. Further, these tower sites have existing power and phone lines accessible, and do not require the permission of local utilities to access.

The present invention achieves excellent signal path redundancy while greatly simplifying the message routing and hand-off overhead typical in conventional cellular phone systems. Cellular telephone systems must be two-way in order to provide two-way voice communication, and frequency channel allocation. The present invention, in some embodiments, is implemented as a one-way communication system, and in other embodiments as a half duplex two-way. Conventional cellular telephone systems carefully design terrain coverage to minimize the overlap of one cell into another. Furthermore, conventional cellular telephone systems use 7 frequency channels to insure that each adjacent cell operates on a different frequency than its neighbors. This method is well known in the art and referred to as frequency re-use. The inventors of the present invention have recognized that by reusing the same frequencies in adjacent cells, that a 7× efficiency of frequency usage can be achieved in an ALOHA system.

Cellular phone systems therefore, do not typically enjoy the benefits of simultaneous redundant reception of a remote phone conversation. However, as recognized by the present inventors, this redundancy would be very valuable in a data system (especially a transmit-only one) where there is no caller to say, "can you repeat that last sentence." As an example, if a single channel were 95% reliable in a conventional system, the effect of a 3× tower base station coverage according to the system of the present invention would be given by:

$P(\text{success})_{conventional} = 0.95$ $P(\text{failure})_{conventional} = 1 - 0.95 = 0.05$ (single base station)

$P(\text{failure})_{present\ invention} = 0.05 \times 0.05 \times 0.05 = 0.000125$ $P(\text{success})_{present\ invention} = 1 - 000125 = 0.999875$ In addition to drastically reduced infrastructure cost and increased reliability, the instant invention architecture provides resistance to signal fading, shading, vandalism, near-far effect (power control), mobile hand-off, and more as described herein.

The present invention relates to a communication system using techniques and devices that are flexible in scope, design, and capability. Further, the present invention relates to communication systems that may be configured for various applications. For example, the present invention relates to communication systems that are configured for point-to-point one-way communications (e.g., transmitter to receiver), point-to-point two-way communications (e.g., transceiver to transceiver), many-to-one one-way communications (e.g., transmitter to receiver), many-to-one two-way communications (e.g., transceiver to transceiver), point-to-many one-way communications (e.g., many receiving endpoints, including either overlapping or non-overlapping receive areas of coverage), point-to-many two-way communications (e.g., transceiver to transceiver, including either overlapping or non-overlapping coverage areas) many-to-many one-way communications (e.g., transmitter to receiver, including either overlapping or non-overlapping receive areas of coverage), or repeater applications including any combination of transmitter, receiver and transceiver devices.

In one embodiment, the present invention relates to cost-effective transmitters and receiver architectures that use readily available components to implement novel narrowband modulation and demodulation techniques to provide a superior data communication capability. Burst telemetry is efficiently transmitted and received using packet data radio communications. The data is communicated in a bandwidth efficient manner maximizing a data rate per unit of bandwidth. The modulation/demodulation techniques described herein are designed to provide an extended communication range and to avoid a false signal detection (also referred to herein as a false 'trip').

Both frequency domain and time domain modulation techniques are used to create a modulation domain signal that can be used at the receiver to minimize false trips. The modulation techniques of the present invention provide for improvements over traditional narrowband FSK, M-ary FSK, BPSK, QPSK, or other constant-envelope techniques for transmitting and receiving burst data as packet data radio signals.

The present invention uses angle modulation (i.e., constant-envelope) techniques, which can be accomplished using low cost, nonlinear amplification techniques at the transmitter. The present invention uses a modulation technique that combines M-ary FSK with a QAM submodulation, both of which may be implemented with low cost components at the transmitter.

The present invention allows for a method of shaping the transmit spectrum in a constant envelope method that suppresses spectral regrowth even if nonlinear amplification methods are employed. The resulting benefit is that typical class-C type amplification techniques can be used for transmitting the modulated signal without losing the benefit of the data rate to spectral use ratio. This fundamentally provides cost and power utilization benefit to the transmitter.

The present invention provides for a method of efficiently maximizing the data rate in a given bandwidth of frequency utilization while providing excellent signal detection and false trip avoidance at the receive component.

The present invention compensates for frequency error between the transmitter and receiver components with a minimum of link budget impact. The frequency error tolerant system described herein provides for low cost system frequency references at transmit and receive endpoints. Methods described herein define a way for the system to achieve maximum sensitivity and corresponding range while simultaneously allowing for frequency error without the need for automatic frequency control (AFC) or Costas loop (feedback) frequency correction. The present invention in one embodiment employs processing methods at the receive component which are feed-forward, achieving sensitivity approaching closed loop coherent systems without incurring the cost or the long acquisition times of the feedback elements. Alternatively, but with added cost and energy consumption, the frequency error can be eliminated using classical feedback error correcting methods thus simplifying the FM demodulator.

The present invention provides for methods of resolving narrow frequency errors as well as wide frequency errors. Narrow frequency errors are those errors that occur inside the passband of the received processing thread while wide frequency errors force the receiver component to adapt alternative techniques described herein.

The present invention provides for single channel as well as multichannel receive architectures, detailing cost effective methods for implementing wide-area cellular as well as point-to-point networks.

The present invention provides for low power transmit components and methods to conserve battery life and thus reduce transmitter cost and power requirements.

The present invention provides dynamic and adaptive signal detection and acquisition techniques which utilize parameters of the transmit modulation to achieve superior false trip avoidance and rapid signal acquisition.

The present invention provides for transmit-only endpoints without power control due to the wide dynamic range receive component which receives packet data, burst messages. The transmitters are fundamentally low cost since they do not require a return communication channel nor power control.

The present invention has utility in point-to-point applications as well as cellular and redundant cellular topologies. All application topologies enjoy a fundamentally low cost implementation that can use the transmit-only endpoint devices without power control.

The present invention describes a method for producing the transmit carrier frequency using extremely low cost pulse width modulation (PWM) components readily available as a sub-element in many commercially available microcontrollers. The methods described herein provide for low cost transmitters using commonly available elements. Furthermore, additional methods described herein detail ways to compensate at the receive component for signal degradation created in the fundamentally low cost transmitter due to non-ideal elements.

Consistent with the title of this section, the above summary is not intended to be an exhaustive discussion of all the features or embodiments of the present invention. A more complete, although not necessarily exhaustive, description of the features and embodiments of the invention is found in the section entitled "DESCRIPTION OF THE PREFERRED EMBODIMENTS."

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 2 illustrates colliding data packets;

FIG. 4 illustrates frequency channel usage load leveling;

FIG. 5 illustrates bandwidth efficient, non-channelized spectrum utilization;

FIG. 9 illustrates differential history values contained in data message;

FIG. 11 illustrates message sequence numbers for missed message;

FIG. 14 illustrates omni-directional antenna usage;

FIG. 15 illustrates base station configuration;

FIG. 17 illustrates a method to allow wide geographic freedom over different licensed frequency bands in a mobile tracking system without the need of externally controlled frequency switchover and management;

FIG. 18 illustrates an example of automatic frequency selection for a transmit-only system sending GPS data for remote location;

FIG. 20 illustrates selectable enhanced signal margin without the cost of higher output power transmitter amplifier stages;

FIG. 22 illustrates boost mode channel load leveling;

FIG. 23 illustrates assigning separate boost channel to avoid the channel roll-off of strong transmitter in adjacent channels;

FIG. 27 illustrates a 10-channel frequency plan;

FIG. 48 illustrates data decision threshold scale factor;

FIG. 54 illustrates a demodulation equalizer option for the system of FIG. 52;

FIG. 63 illustrates 7FSK/16QAM symbol patterns;

DESCRIPTION OF THE PREFERRED EMBODIMENTS

In designing conventional cellular networks, steps are taken to ensure that adjacent cells (receivers) do not compete for a given transmitter on the same frequency. In the case of a conventional direct sequence spread spectrum communication system using CDMA, the receive devices must power control the transmit components in order to accommodate multiple users.

In one embodiment of the present invention, endpoint devices are transmit-only, and do not require power control by a receiver. Moreover, adjacent cell towers may each monitor a single endpoint at the same time using the same frequency.

Figure 1:
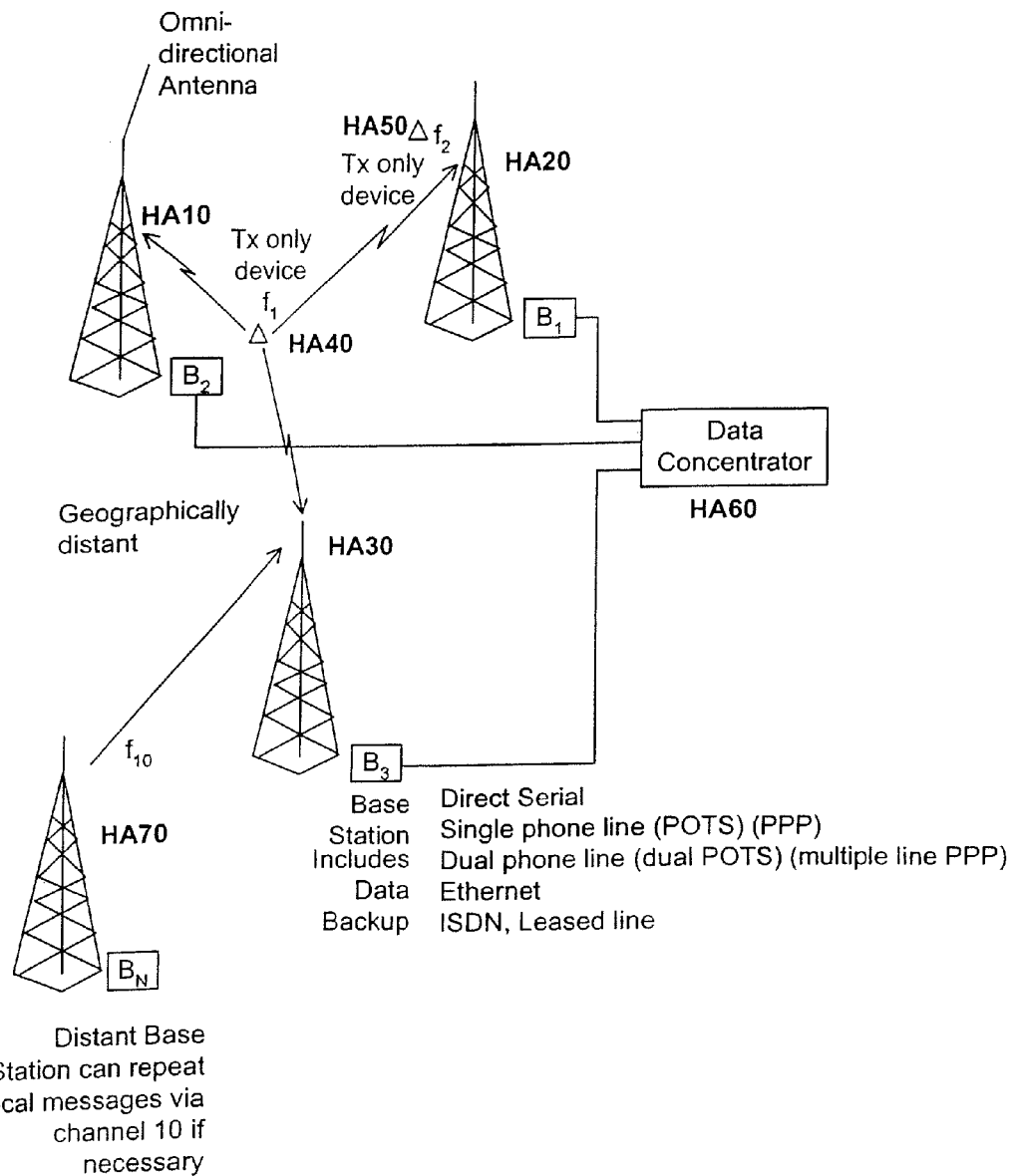
FIG. 1 illustrates base stations using overlapped coverage areas connected to a common data concentrator.

FIG. 1 illustrates a system according to one embodiment of the present invention. As shown in FIG. 1, the system includes several cellular base stations HA10, HA20, HA30 which are geographically dispersed. In one embodiment of the present invention, the base stations HA10, HA20, HA30 are dispersed across a metropolitan area. The system also includes one or more endpoints HA40, HA50 that include a transmitter. In one embodiment of the present invention, the endpoints HA40, HA50 are transmit-only devices. In an alternative embodiment, the endpoints HA40, HA50 are transceivers, which permits bi-directional communication. The endpoints HA40, HA50 are within range of at least one, and possibly multiple base stations HA10, HA20, HA30. The base stations HA10, HA20, HA30 transmit each message they receive to a Data Concentrator HA60. Messages are transmitted to the Data Concentrator HA60 through a direct serial connection in one embodiment, although other approaches could be used including, but not limited to, single phone lines (POTS/PPP), dual phone lines (Dual POTS/multilink PPP), Ethernet, ISDN, a microwave or other wireless RF link, and leased lines (frame relay).

The Data Concentrator HA60 receives all transmitted messages from all endpoints HA40, HA50 within range of all base stations HA10, HA20, HA30 connected to the Data Concentrator HA60. Since the Data Concentrator HA60 receives all messages received from all base stations HA10, HA20, HA30, and more than one base station HA10, HA20, HA30 may receive any given message from an endpoint HA40, HA50, the Data Concentrator HA60 often receives redundant messages. The Data Concentrator eliminates those redundant messages. By adding an identification parameter to each message corresponding to the endpoint HA40, HA50 transmitting the message, the elimination of redundant messages in the Data Concentrator HA60 is facilitated. The identification parameters may include, for example, data identification tags in the payload, or overhead bits.

In one embodiment of the present invention, multiple base stations HA10, HA20, HA30 operate on the same frequency, regardless of whether the coverage regions of the base stations HA10, HA20, HA30 overlap. By allowing the coverage regions of the base stations HA10, HA20, HA30 to overlap, reliability is improved as each transmitting endpoint HA40, HA50 may be observed by more than one base station HA10, HA20, HA30. If a particular base station HA10, HA20, HA30 becomes unusable due to signal degradation caused by interference, collision or obstruction, it is likely that an alternative base station HA10, HA20, HA30 will succeed in collecting data for those endpoints.

In one embodiment of the present invention, the location of the transmitting endpoint HA40, HA50 is roughly determined by the base station HA10, HA20, HA30 receiver by correlating a transmitter ID included in a received message with a received signal strength using triangulation techniques understood by those of ordinary skill in the art.

In another embodiment of the present invention, the endpoints HA40, HA50 include transceivers (i.e., for bi-directional communication). In this embodiment, the received signal strength or history of throughput collected at the various base stations HA10, HA20, HA30 is used to determine which of the base stations HA10, HA20, HA30 is to be used to communicate back to a particular endpoint HA40, HA50 device. In other embodiments, alternative approaches for two-way communication are used, including, for example, a positive handshake.

One advantage of the present invention, as shown in FIG. 1, is that it works well for transmit-only devices as the endpoints HA40, HA50 without the need for power control. As would be understood, two co-located, perfectly synchronous transmitters operating on the same frequency will effectively jam each other with respect to any given receiver. By time staggering the transmitters using pseudo-random means, the system of the present invention allows each transmitter endpoint HA40, HA50 the opportunity to communicate with a probability of success that is a function of the duty cycle of the transmitter. In the case where two endpoints HA40, HA50 transmit at the exact same instance, the fact that the endpoints HA40, HA50 are geographically separated makes it unlikely that any receiver will receive two transmissions at the same signal strength. Accordingly, greater system throughput is achieved since the stronger of the simultaneous receptions will be received by the base station stations HA10, HA20, HA30 due to FM capture or other SNR advantage. By adding more base stations HA10, HA20, HA30 (i.e., receivers), even greater system throughput is achieved.

As discussed above, having overlapping cell sites monitoring the same frequency increases system throughput. In other embodiments of the present invention, system throughput is increased through a data repeat scheme. By configuring the endpoints HA40, HA50 to redundantly transmit each message separated by a pseudo random amount of time, the probability of a successful transmission increases, and throughput is increased.

In one embodiment of the present invention, the system is a many-to-one system as depicted in HA, where the endpoint HA40, HA50 transmitters have a low duty cycle, thereby allowing for many transmitters to share a given frequency without a degradation of system throughput. Other advantages are also derived from having a low duty cycle, including, but not limited to, the ability for each endpoint HA40, HA50 device to be battery operated since the device is in a reduced power state for the majority its service life. If the duty cycle of the endpoints HA40, HA50 is very low (e.g., less than 1%, and preferably much smaller), the effective number of endpoints HA40, HA50 can become much larger while still allowing for the use of low-cost system timing components. In one embodiment of the present invention, the lowest possible cost approach is used. One way of keeping cost down is by using a pseudo-random transmission interval on the transmit-only endpoint HA40, HA50 which does not require any time synchronization as would be required by conventional time division multiple access (TDMA) cellular systems.

By using low duty cycle transmit devices for the endpoints HA40, HA50, power control is not required, since each base station HA10, HA20, HA30 receiver need only listen to one transmitter at a time on a given frequency. The receivers of the present invention are designed to simultaneously pass strong and weak signals without distortion. Reception of a weaker signal is aborted in order to acquire a stronger signal in the event of collision. Accordingly, the inventive system takes advantage of having base stations HA10, HA20, HA30 that are geographically spaced, yet overlapping in coverage to resolve traditional near-far problems associated with the simultaneous reception from both a strong and weak transmitter. As shown in FIG. 1, transmitter HA50 is closer to base station HA20 relative to transmitter HA40. In this case, the base station HA20 is more likely to receive a transmission from HA50 even if the transmitter HA40 was operating simultaneously on the same frequency. By geographically dispersing the base stations HA10, HA20, HA30, a transmission that was aborted by HA20, for example, would be received by base station HA10 and/or base station HA30.

Receiver Collision Processing

In one embodiment of the present invention, the abort algorithm, described above in the context of FIG. 1, is implemented in the receiver. The abort algorithm uses an indicator of received signal strength in making abort decisions. FIG. 2 illustrates the abort algorithm in terms of two exemplary cases, Case 1, and Case 2, which illustrate two of the most common collision events.

As shown in FIG. 2, Case 1 illustrates a case where a single receiver receives a first weak signal HL110, followed by a second, stronger signal HL120. The second, stronger signal HL120 is received prior to the completion of the first, weaker signal HL110. The abort algorithm according to one embodiment of the present invention acts to abort the reception of the first, weaker signal HL110, and immediately begin processing the later, stronger signal HL120, making this determination based on received signal strength.

In other embodiments, other parameters are used in determining that the first signal HL110 being received is no longer worth decoding. The receiver architectures according to the present invention process received signals in the modulation domain whereby a mean frequency error of a given transmitter may be measured. Should a second signal having a different receive strength be received, it is likely that the new signal will have a different mean frequency error since it originated from a different imprecise frequency source. The different mean frequency error may be used to re-start the data demodulation process. As shown in Case 1 of FIG. 2, the two received signal can be viewed in terms of either signal strength or mean frequency error.

Case 2 of FIG. 2 illustrates the case where a collision occurs when a weaker signal HL150 is received after initial trip and acquisition of a stronger signal HL140. Signal processing will typically prevent the observation of the weaker signal HL150 until the stronger signal HL140 completes its message (i.e., at the time indicated by HL160). In this situation, the weaker message HL150 is typically lost unless the overlap is small and a leader portion of the second signal HL150 remains long enough for acquisition of that signal to occur.

The above-described combined abort algorithm of the present invention prevents the loss of data from both received packets, and therefore, increases a probability of packet success from a probability following a non-slotted ALOHA form:

Non-Slotted ALOHA: $Ps=1-[1-e^{-2\lambda NT}]^M$ to a greater probability following a slotted ALOHA form:

Slotted ALOHA: $Ps=1-[1-e^{-\lambda NT}]^M$ where the term definitions are defined as:

Ps=probability of packet success;
=1/average time interval between transmissions;
N=number of simultaneous transmissions−1;
T=duration of single packet; and
M=redundancy of a packet at endpoint.

Non-slotted ALOHA and slotted ALOHA schemes are understood by those of ordinary skill in the digital communications art, and are described in detail in Sklar, B., "Digital Communications: Fundamentals and Applications," Second Edition, ISBN 0-13-084788-7, Prentice Hall, 2001, the entire contents of which is incorporated herein by reference.

Accordingly, overall receiver throughput is improved dramatically with the addition of an abort capability. By adding additional receivers and/or operational frequencies, exponential terms of the above equations are increased, thereby even further improving throughput.

Typically, data message lengths in packetized data applications are in a range of about 10 to 30 milliseconds (msec) with messages occurring every few seconds, minutes, hours or longer. The present invention operates with a standard data rate of 16.6 kbps. Even with messages occurring at a 30 second interval, the transmitter duty cycle remains low (0.0006666). System loading per application dictates an acceptable duty cycle based on the number of transmitters, number of receivers, and number of available operational frequencies.

Multi-Frequency Operation

In one embodiment of the present invention, each base station is configured to simultaneously monitor at least two frequencies. Each frequency may be used to monitor an independent set of transmitters separated in distance throughout the coverage area for the receiver. Multi-frequency operation of the present invention provides for several enhancements. For example, an application may be given exclusive use of a particular frequency for its transmitters. Alternatively, an application may be allocated a set of frequencies, where the transmitter selects one of the set for operation. By using multiple frequencies, the overall data bandwidth of the system can be greatly increased. As discussed above, further advantages are achievable by configuring the system to have cells with overlapping coverage areas.

Special problems are caused by the near-far effect due to non-power-controlled transmitters operating in adjacent channels. Transmitters typically have a spectral rolloff characteristic driven by component and design issues known in the art. As a result, a very strong signal received in one frequency channel may overlap into an adjacent channel and impact the usability of that adjacent channel. Typically, adjacent channels are separated by an amount such that the spectral rolloff in adjacent channels is less than the largest anticipated dynamic range. Accordingly, the spectral rolloff will not impact the adjacent channels. Dynamic range is the difference in decibels between the strongest (e.g., nearest) received signal and the weakest (e.g., farthest) received signal. According to one embodiment of the present invention, channel spacing is reduced to levels below that typically used for the data rates achievable by the present invention. Channel spacing is minimized by, for example, exploiting the low duty cycle of the transmitters used in the system, configuring cells to have overlapping coverage areas, and by implementing an abort capability in the base stations.

Figure 3:
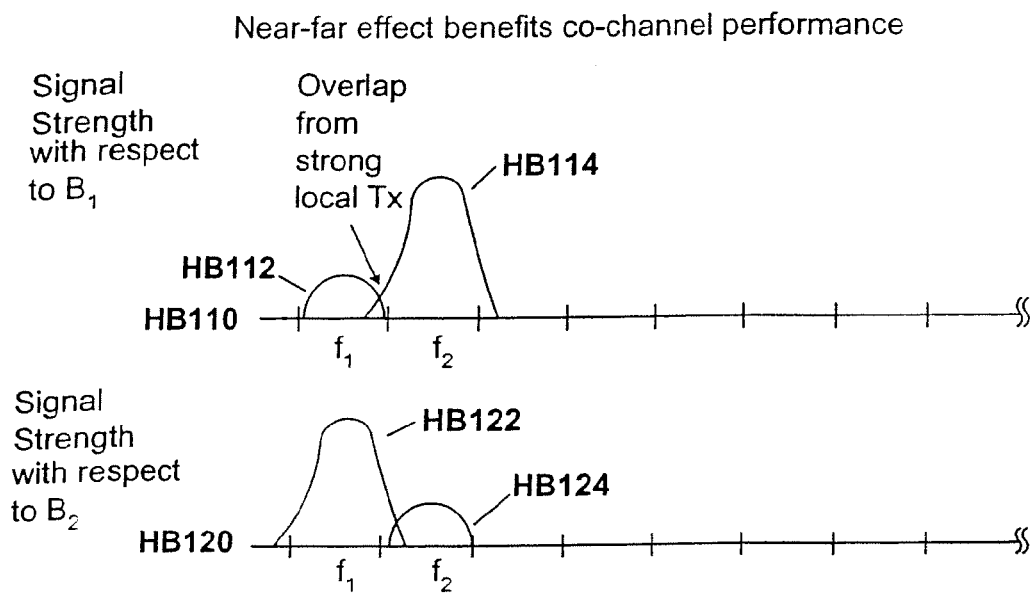
FIG. 3 illustrates near-far effects, which benefit co-channel performance.

FIG. 3 illustrates the near-far problems associated with multi-channel operation. As shown in FIG. 3, signals HB112 and HB122 are the same signal received by two different base stations B1 and B2, respectively. Based on the strength of the received signal HB122 at base station B2 as compared to the strength of the signal HB112 received at base station B1, it is likely that the transmitter is located closer in proximity to base station B2 than base station B1. Similarly, signals HB114 and HB124 are another signal received from at base stations B1 and B2, respectively.

The top graph HB110 of FIG. 3 shows that the signal HB112 at frequency $f_1$ is received at low signal strength at base station B1. Base station B1 is simultaneously receiving a second signal HB114 at the frequency $f_2$ immediately adjacent in frequency to the frequency $f_1$. Base station B1 may not be able to successfully receive the signal HB112 at frequency $f_1$ due to the overlap in frequency from a strong local transmitter transmitting at frequency $f_2$.

The bottom graph HB120 of FIG. 3 shows that the signal HB122 at frequency $f_1$ is received at high signal strength at base station B2. Base station B2 is simultaneously a second signal HB124 at the frequency $f_2$ immediately adjacent in frequency to the frequency $f_1$. Base station B2 may not be able to successfully receive the signal HB124 at frequency $f_2$ due to the overlap in frequency from a strong local transmitter transmitting at frequency $f_1$.

Since both base stations B1, B2 are monitoring both frequencies (i.e., $f_1$ and $f_2$) simultaneously, both messages HB122 (HB112), HB114 (HB124) are successfully received by the network. Furthermore, the likelihood of adjacent channels simultaneously receiving transmissions as illustrated in FIG. 3 is low due to the extremely low duty cycle of the transmitters. Furthermore, this likelihood is further reduced based on the fact that typically, only a small number of transmitters are geographically located such that their transmissions are received as excessively strong (assuming somewhat uniform distribution of transmitter placement).

Accordingly, network throughput is maximized by using minimum channel spacing, enabled by low duty cycle transmitters, redundant channels, overlapping coverage areas for base stations, and a data concentrator to collect the messages from the locationally disperse base station receivers.

Auto Frequency Distribution and Channel Loading

In another embodiment of the present invention, total system data bandwidth is maximized by using the multi-frequency capacity of the system. FIG. 4 illustrates a technique whereby a transmitter may transmit on any one of N frequencies. As shown in the flow diagram of FIG. 4, the transmitter first computes a pseudo-random number at step HK110 to determine which channel should be used. The transmitter then selects the associated frequency of operation at step HK120. The process then proceeds to step HK130 where the frequency is allowed to stabilize. Once the carrier frequency stabilizes, the process proceeds to step HK140 where the packet is transmitted on the selected frequency. If the pseudo-random number generation process is white, each available frequency has the same probability of selection. This will result in a histogram of use that has a flat distribution, as illustrated in graph HK160 of FIG. 4. Graph HK150 of FIG. 4 illustrates a channelized use of spectrum that would result in the histogram of graph HK160.

Frequency leveling allows for an increased number of transmitters per unit area. This is an important feature of the present invention because the cell coverage areas are large. As the radius of a coverage area for a base station increases, the area of use increases as a function of the equation:

$$\text{area of use} = \pi r^2$$

where r is the radius of the coverage area.

Multi-Frequency, Non-Channelized Collision Analysis

In one embodiment of the present invention the transmit device selects a frequency of operation between two limits without regard for set channelization. In this embodiment, collisions must be resolved. FIG. 5 illustrates the various conditions that may occur using this approach. As shown in FIG. 5, discrete frequency channels are not observed. HO10 of FIG. 5 illustrates a condition where a collision between two received signals will result in the loss of both signals. HO20 of FIG. 5 illustrates a condition where the two received signals are separated by frequency such that there is no collision between the signals, and both signals are successfully received. HO30 of FIG. 5 illustrates a condition where one of the received signals is sufficiently stronger than another received signal. In this case, the stronger signal will be successfully received, resulting in the loss of the weaker signal. This system design creates additional channel capacity by utilizing channel spacing that is smaller than the width of the signal bandwidth plus the width of the adjacent guardbands. By varying the frequency used for transmissions, a statistical message loss caused by collisions may be overcome by redundantly transmitting messages. A probability of successful reception is given by the equation:

$$Ps = 1 - [1 - e^{-(2\lambda NT/P)}]^M$$

where:
Ps=Probability of a successful reception at a base station;
P=signal bandwidth/available system bandwidth;
λ=1/time between transmissions;
N=number of remote endpoints within range of the base station;
T=time duration of a data packet; and
M=number of times a single message is redundantly transmitted.

The above discussion is applicable to a single base station receiver collecting data from a dispersed set of endpoint devices. If the base stations are in an overlapped configuration, system throughput can be significantly improved. A message that was disadvantageously received while in a collision state and therefore dropped by one receiver will be observed as a stronger signal by another base station receiver, each base station receiver using an abort algorithm as discussed above to collect both messages from a system perspective.

The introduction of a second or more base station exponentially improves system probability of reception for any given transmitter. The probability of successful packet reception from a system perspective increases according to:

$$Ps = 1 - [1 - e^{-(2\lambda NT/P)}]^{M*B}$$

where:
Ps=Probability of a successful reception of a given transmitter;
P=signal bandwidth/available system bandwidth;
λ=1/time between transmissions;
N=number of remote endpoints within range of the base station;

T=time duration of a data packet; and

M=number of times a single message is redundantly transmitted.

B=number of base stations which are monitoring the transmitter

The "B" term above exponentially impacts the ability of the system to receive the transmitter since it operates as a multiplication function to the message redundancy index (as shown in FIG. 14).

Available bandwidth may further optimized, for example, by sending transmissions at a pseudo-random rate, or sending transmission on pseudo random-carrier frequencies that are spaced narrower than the signal bandwidth in order to evenly distribute signal occupancy in the available spectrum.

Overlapping vs. Non-Overlapping Cellular Coverage Areas

Figure 6:
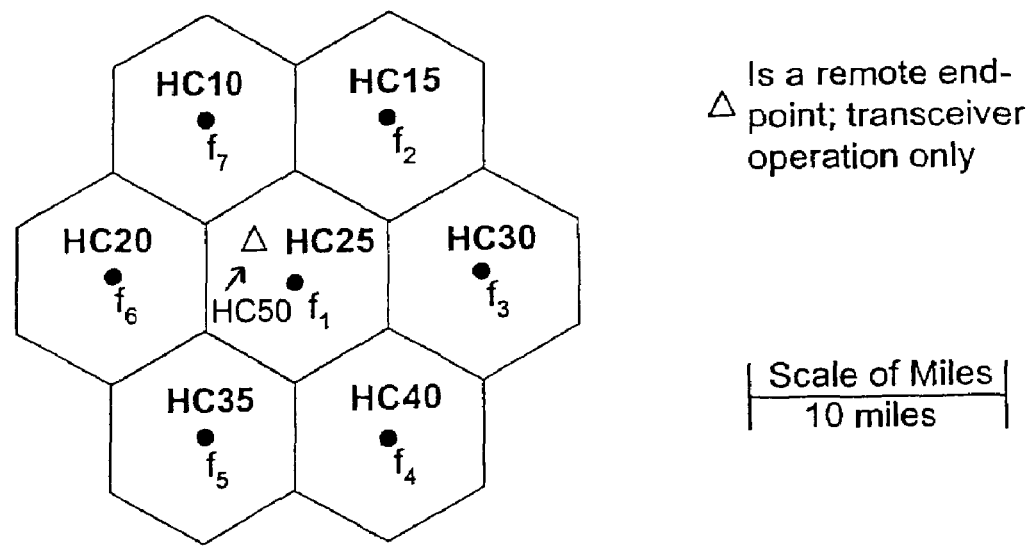
FIG. 6 illustrates conventional cellular system area coverage.

FIG. 6 illustrates a conventional approach to geographically dispersing a set of base station receivers to achieve optimal cellular coverage. Base stations HC10, HC15, HC20, HC25, HC30, HC35 and HC40 are located such that their areas of coverage do not overlap. Two-way communications systems typically provide for control communications where the transmit devices are power-controlled by the receivers so as to minimize any impact on adjacent cells that are not being used.

Techniques for configuring cellular coverage areas are know to those of ordinary skill in the art, and are described in Webb, W., "The Complete Wireless Communications Professional: A Guide for Engineers and Managers," ISBN 0-89006-338-9, Artech House Publishers, 1999, the entire contents of which is incorporated herein by reference.

Each particular transmitter HC50 is intended to be observable only to a single cell base station HC25 which is allocated a specific frequency $f_1$. Adjacent cells are allocated other frequencies in order to alleviate interference from transmitters operating in nearby cells. The pattern of frequency allocation typically requires that several cells separate any two cells allocated the same frequency. In some systems dozens of frequencies are utilized to achieve cellular coverage.

Conventional systems also make use of power control to help manage the frequency reuse issue. A transceiver is commanded by a two-way control communication. Transmit-only applications are configured with a power output setting. In either case, the system must limit the range of the transmitted signal by controlling the power of the transmission in order to minimize any impact to adjacent cells.

Additionally, mobile transmitters in a conventional cellular system must be managed and handed off from cell base station to cell base station as the mobile transmitter transitions over cell boundaries.

In one embodiment of the present invention, the system operates in a non overlapping cellular structure as shown in FIG. 6. However, many of the problems and complexities associated with conventional cellular systems (e.g., power control and handoff) are avoided by the system of the present invention. Since the duty cycle is low for the transmitters, all transmitters can use the same frequency. Transmissions entering adjacent cells can be ignored or accepted (see discussion above, regarding overlapping cells). Further, power control is not necessary since the base station receivers operate with an extended dynamic range. Also, transmitters within a cell can operate at multiple frequencies, allowing frequency use to extend system data bandwidth, as compared to conventional systems where multiple frequencies are required in order to lay out the cells geographically in such a way that the system will be operable.

In one embodiment of the present invention, adjacent cells are designed to ignore transmissions not intended for them by assigning each transmitter an integral identification tag that is bound at commissioning. This approach allows the system to be operated as if it were a non-overlapping system, even if some overlapping exists. Collision events that impact system throughput can be mitigated using message repetition whereby each message is transmit at least twice separated in time by a pseudo random interval.

Figure 7:
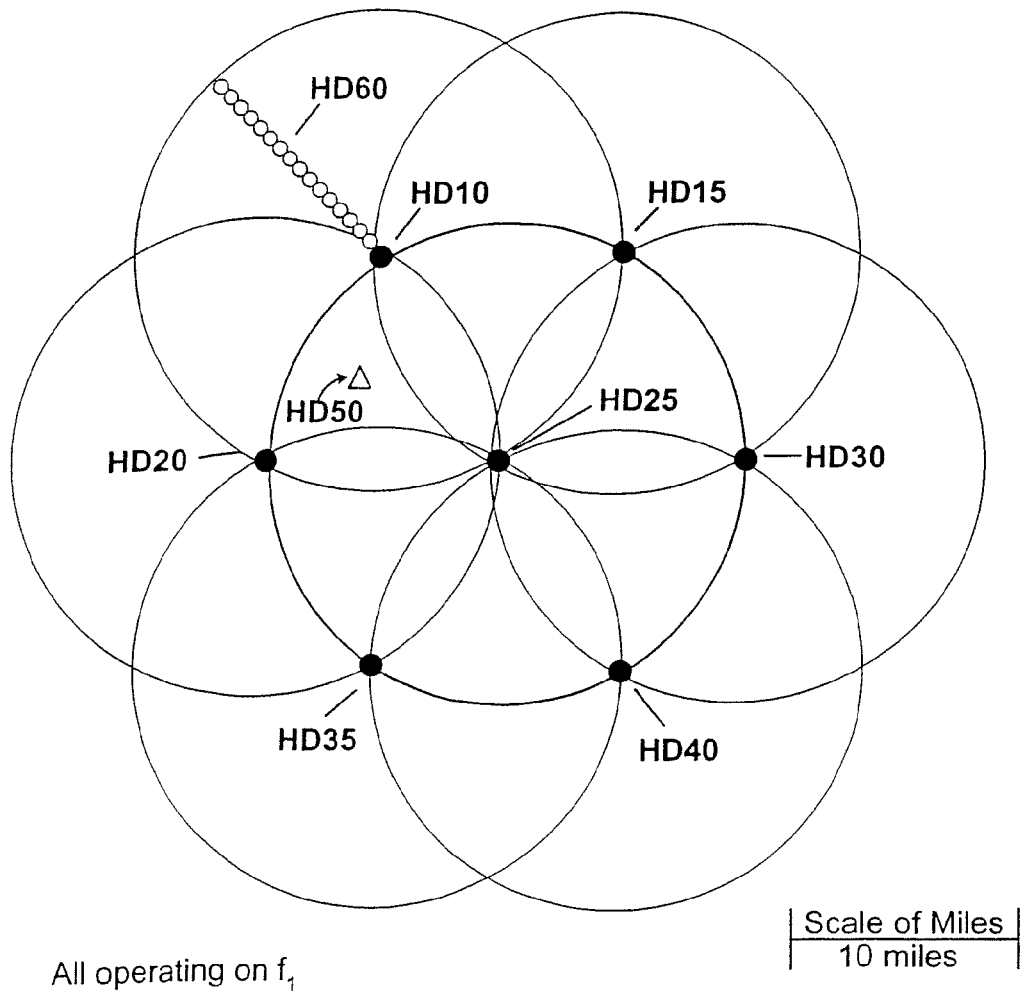
FIG. 7 illustrates a cellular layout according to one embodiment of the present invention.

FIG. 7 illustrates some of the benefits of having overlapping cells according to one embodiment of the present invention. As shown in FIG. 7, cell base stations HD10, HD15, HD20, HD25, HD30, HD35 and HD40 are each separated in distance at the range of operation of each base station. As such, each site has an area of coverage that overlaps all of its adjacent cell base station regions. All base stations may operate on the same frequency or, alternatively, they may simultaneously operate on a shared set of frequencies. Transmitter HD50 is observable by base stations HD10, HD20 and HD25. Any problems with reception that may be experience by any one of these base stations are compensated for by the redundant coverage.

In either the overlapped or non-overlapped configurations according to the present invention, mobile telemetry enjoys a much simpler hand-off or control mechanism. Since the frequency of transmission need not be controlled, and the power of transmission need not be controlled, the system can successfully collect data from the mobile without reverse (command) communication. This embodiment of the present invention provides for a mobile transmit-only endpoint that is inexpensive and simpler to construct and operate than conventional mobile systems. Accordingly, a transmit-receive capability of the mobile device becomes a luxury instead of a necessity.

The present invention extends the state-of-the-art in cellular packet data communications. Previous cellular packet data communication systems, such as those described in Rouquette et al. (U.S. Pat. No. 5,920,589), Naden, et al. (U.S. Pat. No. 5,999,561), and Sanderford et al. (U.S. Pat. No. 6,111,911), are also directed to cellular packet data communications. However, the present invention provides different capabilities and is applicable to a wider range of packet data communication applications.

First, the conventional cellular packet data communication system operates at a reduced output power relative to the transmitters of the present invention, primarily due to regulatory restrictions. Second, the cellular coverage of conventional cellular packet data systems is typically not overlapping, due to the overwhelmingly and prohibitively expensive total count of receivers necessary to cover a metropolitan service area. Figure element HD60 represents a cell according to a conventional cellular packet telemetry system. A cell according to the present invention (e.g., cell covered by base station HD10 in FIG. 7) is much larger. In fact, as many as 20 cells must be laid adjacent to each other in order to achieve a linear coverage equal to a radius of the cell of the present invention. In order to achieve the full coverage provided by a cell according to the present invention, the total area must be mapped with the smaller sized cells. In the example used above, this would require up to 400 of the smaller sized cells to achieve the coverage area of a single cell according to the present invention. Accordingly, it can be appreciated that the total number of cells required to cover a large metropolitan service area enters into the thousands for the conventional cellular packet telemetry systems. Furthermore, overlapping cells of such small coverage area creates a very expensive luxury that is not economically feasible for a large-scale installation. The sheer task of data concentration from the thousands if not tens of thousands of receivers makes overlapping of conventional packet telemetry systems untenable. Conversely, the present invention can cover even large metropolitan areas with only dozens of cell towers, representing a much easier data concentration task which can be accomplished in a variety of cost effective and available methods. Moreover, gaining the benefits of overlapping cells may be achieved at a much lower cost.

According to one embodiment, the present invention uses commercially available communication towers for a smaller number of cell base stations that cover larger areas. Conventional cellular packet telemetry systems typically locate their receivers at a lower elevation, such as, for example, on utility poles or other topologies, and often cover only a subset of a neighborhood or community. The added elevation provided by a communication tower as compared to a utility pole, the antenna gain affordable due to the significantly smaller numbers of cell base stations required, the increase in output power, and the improved receive sensitivity all add up to achieve a far superior range as compared to conventional cellular packet telemetry systems. By achieving this extended range, the present invention may be used in many applications that are not possible or practical using conventional cellular packet telemetry technology. The technical benefits of the present invention are achieved while remaining an order-of-magnitude less-costly to deploy and maintain. Furthermore, the desirable performance characteristics associated with redundant coverage is an affordable option with system of the present invention.

Error Correction, Sequence Number and History of Data

Figure 8:
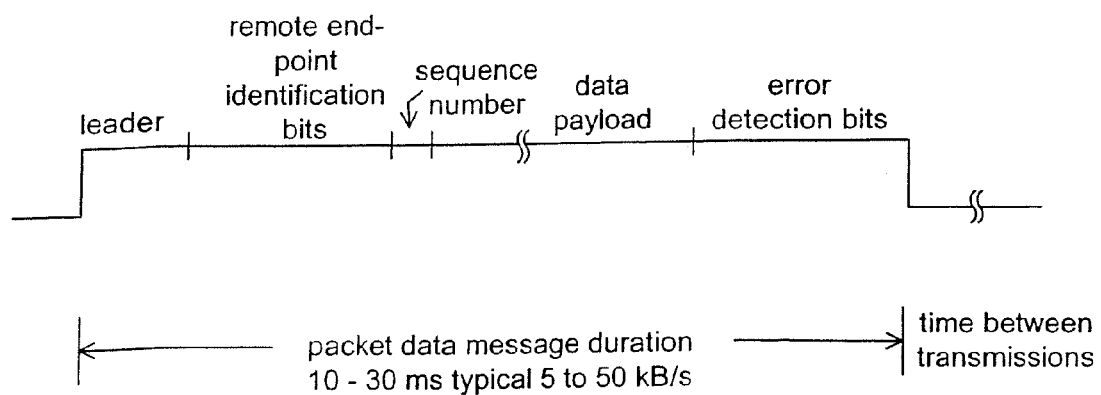
FIG. 8 illustrates a message format.

The system of the present invention implements methods that increase the probability of successful data throughput. Data reliability and throughput are improved through a variety of techniques. FIG. 8 illustrates a timeline that demonstrates the principle behind these techniques. As shown in FIG. 8, each message contains a preamble section at the start of the data packet. The preamble portion allows for the receiver to acquire the signal prior to start of data content. In some embodiments of the present invention, each transmitted message may include a data field that uniquely identifies the endpoint device.

FIG. 9 illustrates the use of data history to improve data integrity in the system. Conventional cellular packet telemetry systems are susceptible to data loss by losing a transmitted packet. As shown in FIG. 9, figure elements HY105, HY110 and HY115 correspond to three successive messages which are sent by a remote endpoint device in a conventional cellular packet telemetry system. Each packet (message) includes a packet count and a data payload section (telemetry sample). In the example shown in FIG. 9, packet HY110 is unsuccessfully received due to, for example, interference, collision, or some other reason, and the data payload is lost forever. Accordingly, the probability of success for a packet in a conventional system is equal to the probability of successfully receiving a packet at a receiver.

In one embodiment of the present invention, redundant data is sent within each packet to overcome the problem discussed above in regard to conventional systems. Each transmitted message has a sequence number field that allows for the receiving system to detect a missed or redundant message. Each data message includes additional payload to include unique or redundant data. By transmitting redundant data, a history of endpoint activity can be determined, since each message includes information related to what has recently transpired, but also, information about what had previously transpired and had already been reported. For example, one method employed in the present invention provides for each message to contain a present reading of a device (such as a voltage, current or other parametric value) appended by a data field showing any changes since the last reading or readings in succession.

FIG. 9 illustrates the principle of redundant data within a message to overcome collision loss according to one embodiment of the present invention. As shown in FIG. 9, elements HY120, HY125, HY130 and HY135 correspond to four successive messages sent by a particular remote endpoint device. In the example shown in FIG. 9, message HY125 is lost due to, for example, interference, collision, obstruction, or some other reason. Each packet contains a current telemetry sample (present data payload) plus difference terms for history. The history terms are transmitted with each message with the number of terms set according to the requirements for the particular system. In the example, it can be seen that the lost message HY125 can be reconstructed by any subsequent message that had a history term corresponding to the packet that was lost, as identified by a packet counter field. Using this technique of the present invention, the probability of packet loss is dramatically lowered. In one embodiment of the present invention, overall message length is reduced by compressing the history data using known compression techniques.

Figure 10:
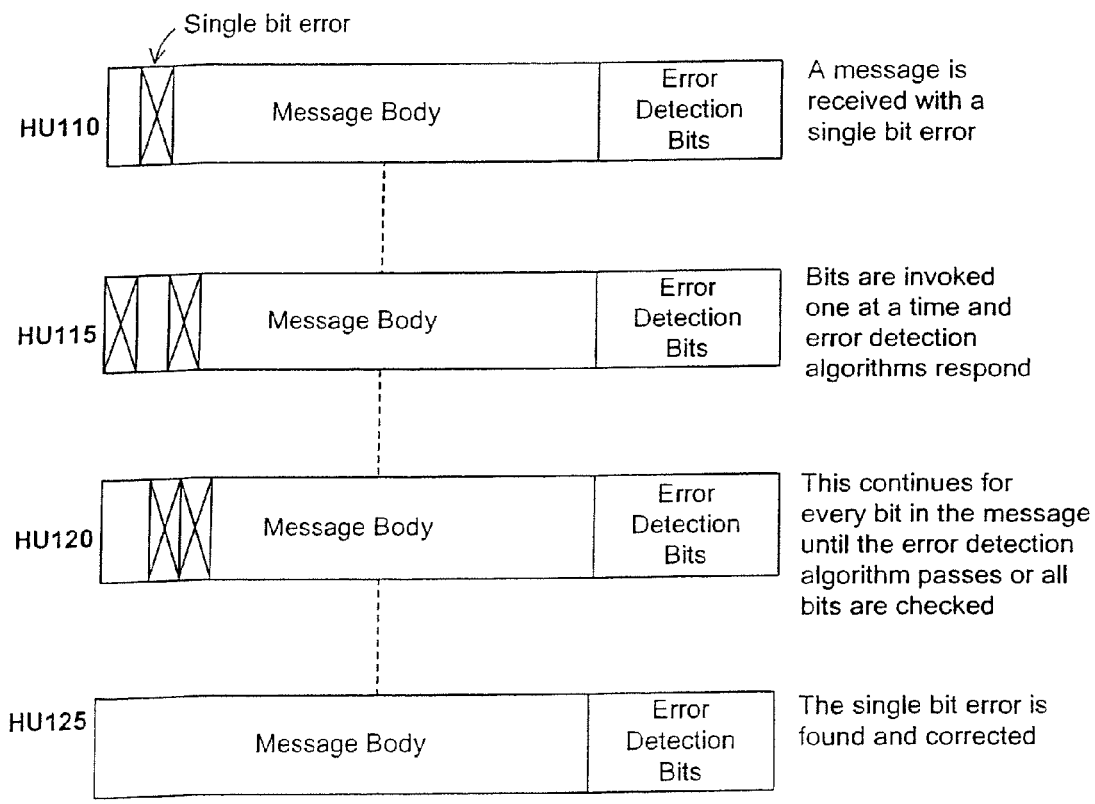
FIG. 10 illustrates single bit error correction.

In another embodiment of the present invention, each data message includes an error detection field such as, for example, a cyclical redundancy check (CRC) field that is used to detect total message bit errors. The system receiver may use this error detection field to provide error correction as well. FIG. 10 illustrates a method for error correcting a single erroneous bit received in the message according to the present invention. Message HU110 corresponds to a message with a single bit error received. The receiver can alternatively toggle a single bit, rechecking the CRC checksum at each iteration, as shown in HU115 and HU120. Eventually, the correct bit is found, and the CRC checksum will match, yielding a corrected message HU125, which then is added to the valid message database.

Using Sequence Numbers to Improve Data Security

In one embodiment of the present invention, embedded sequence numbers are used to enhance system security. This technique is helpful in dealing with, a situation where two endpoint devices have the same unique identifier. This situation could happen by accident or for illicit reasons. By including an auto-incrementing field within each data package, this situation can be detected, thereby further improving data integrity. FIG. 11 illustrates an example of detecting an illegal endpoint according to one embodiment of the present invention. As shown in FIG. 11, a series of messages HV10, HV15, HV20, HV25, HV30 is received. Each message includes an endpoint identification field as well as an auto-incrementing field. By monitoring the received transmissions, the system detect an illegal transmission as one having a valid (albeit redundant) endpoint identification field with an unexpected value in the auto-incrementing field, as shown in message HV25. The receiving system can therefore detect and prevent data from being entered into the database that would otherwise appear valid.

Data Concentrator Function and Operation

Figure 12:
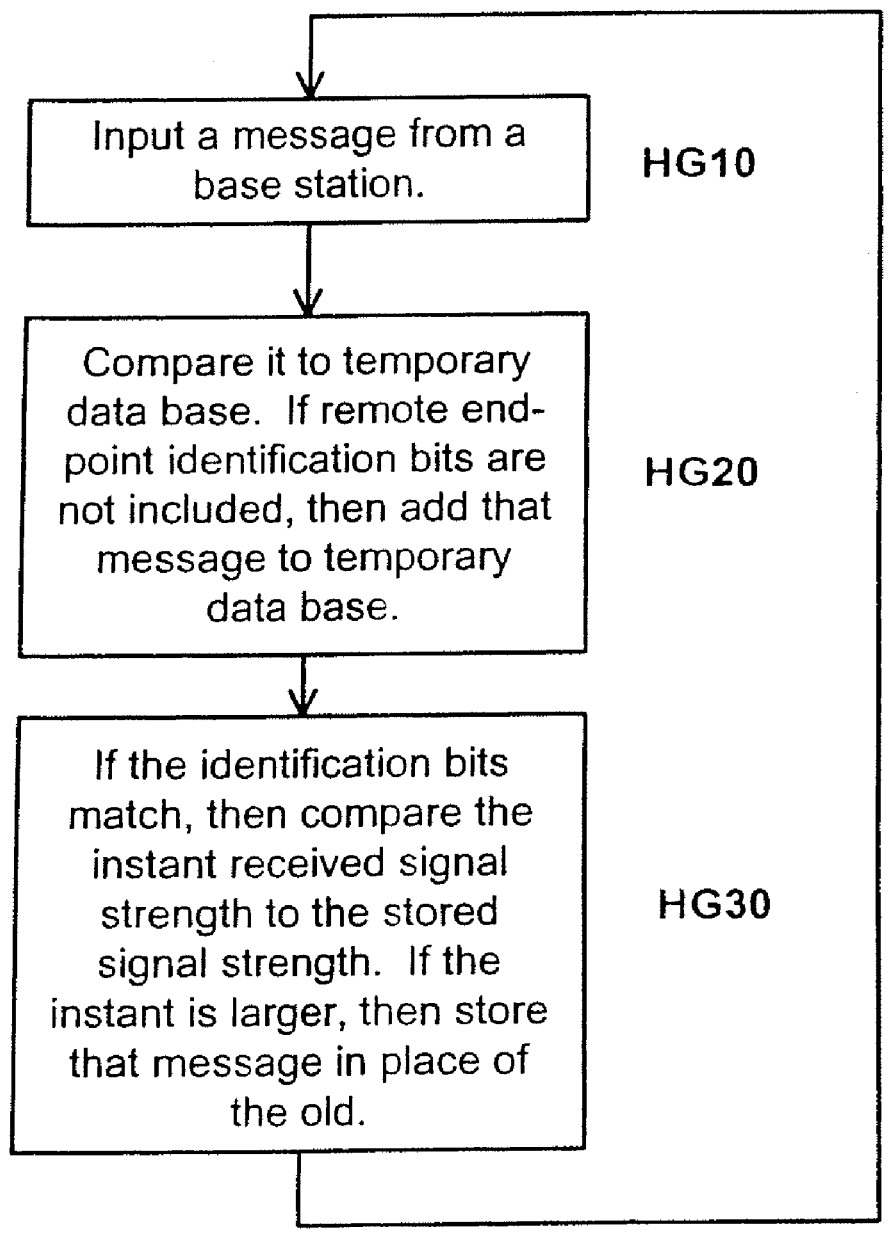
FIG. 12 illustrates data concentrator operation.

In one embodiment of the present invention, the base stations are geographically dispersed such that a large metropolitan area of hundreds of square miles may be covered with a relatively small number of base stations. In conventional cellular packet data systems, base stations are positioned roughly ½ mile apart. The system of the present invention enjoys a 10 mile nominal separation due to frequency of operation and elegance of design. The relatively small number of base stations makes an infrastructure feasible to support a data concentrator that performs the function of data reduction for data collected by the system. FIG. 12 is a flow diagram for a data concentrator process for removing redundant data collected by the system. The data concentrator is shown as element HA60 of FIG. 1. As show in FIG. 12, the process begins at step HG10 where the data concentrator receives a message from a connected base station and inserts the message into a database. The process then proceeds to step HG20 where the data concentrator compares the newly received message with all messages already stored in the database using an integral identification tag included with each message. The process then proceeds to step HG30 where any duplicated messages detected using the message identification tag are reduced to a single message for storage. The process repeats to ensure that each received message is only stored once.

Sectored vs. Omnidirectional Antennas

Figure 13:
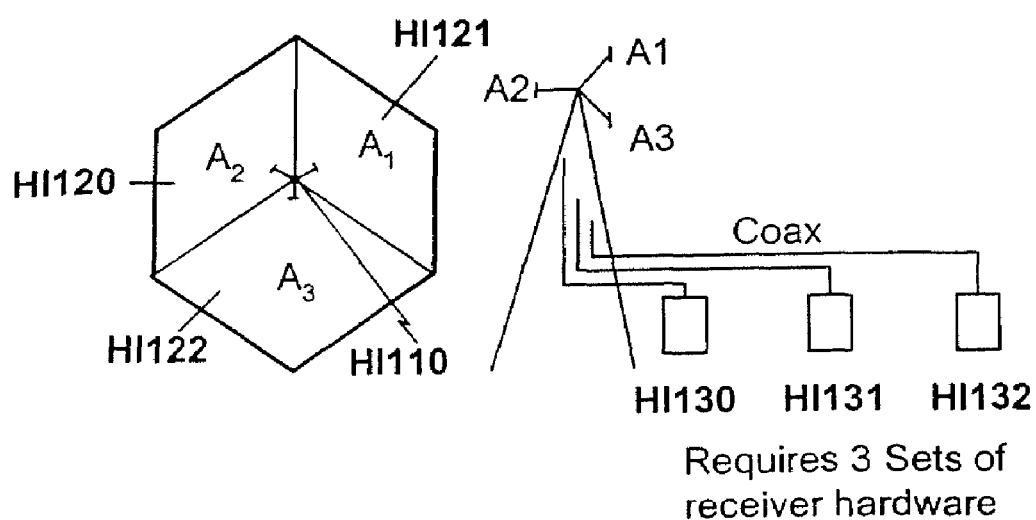
FIG. 13 illustrates conventional cellular radio system using sectored antennas to increase capacity.

Conventional cellular radio systems typically become overloaded quickly, primarily due to the predominant mode of continuous operation. FIG. 13 illustrates a conventional sectored cell base station. As shown in FIG. 13, each cell is sub-divided into three sectors (HI120, HI121, HI122) with associated equipment (HI130, HI131, HI132) to process each sector. Sectoring, therefore, represents an additional cost component that is not necessary in the present invention.

The present invention deploys a cellular structure for the express purpose of collecting packet telemetry of low duty cycle data. The present invention uses an omnidirectional antenna as depicted element HI210 in FIG. 14. Accordingly, only one antenna and one associated processing receiver HI230 are required to cover an area which typically has twice the radius of conventional cellular radio communication technology.

Base Station Transceiver Capability

So far, only one-way communications (i.e., from the endpoints to the base station) has been discussed. In another embodiment of the present invention, a transceiver is used at the base station allowing the base station to not only receive packets from the endpoints, but also to send reverse or outgoing data telemetry from the base station to the remote devices without impacting the ALOHA channel capacity of the network.

FIG. 15 illustrates a base station with a transceiver according to the present invention. The base station has a single antenna HJ110 capable of receiving or sending data. The station antenna HJ110 is connected to an antenna switch HJ115. The antenna switch HJ115 selects between a receiver section HJ120 and transmitter section HJ125 of the transceiver. The base station operates in half-duplex mode to reduce cost and system complexity. The receive/transmit decision is made by a processor HJ130, which communicates with the Data Concentrator HJ160 through a communications link, such as, for example, a land-line HJ140, a wireless RF or infrared link, or other communications link. The system ALOHA requirements dictate that out-bound transmissions to remote two-way devices are restricted to less than 1% duty cycle. This 1% value must then be added to the ALOHA system channel capacity which will have a minimal system impact as given by:

$$Ps = 1 - [1 - e^{-(\lambda NT + 1\%)}]^M$$

where:
Ps=probability of successful reception at a base station;
=1/time between transmissions;
N=number of remote endpoints within range of the base station;
T=time duration of a data packet; and
M=number of times a single message is redundantly transmitted.

Accordingly, as long as the base station transmitter behaves as a system endpoint device, having a low duty cycle and transmitting in a packet form, the overall system capacity is not impacted significantly. In one embodiment, the remote endpoint device targeted for reception uses a data identifier field to filter out unintended messages from alternative transmitters.

By binding the endpoint devices to a particular base station, the system on-air traffic may be lowered. A singular cell base station transmitting is preferable to all base stations blindly transmitting to all endpoint devices within a coverage area.

If the remote endpoint device also has transmit capability, the system can determine which base station to bind that endpoint device to based on received signal strength of the endpoint as observed by the system base station. The base station with the largest received signal strength matching the identification tag of the remote transceiver is assigned the task of transmitting to that endpoint device into the future.

Conventional cellular systems must actively hand-off mobile transceivers, with the base stations cooperating and allocating frequencies and time slots for the hand-off to occur. The system of the present invention does not require a traditional hand-off since the base station receivers are oblivious to the changing location of the transmitter. In one embodiment, signal strength received at the receiving stations is used by the data concentrator to select a specific reverse base station at the time of transmission. This serves to automatically track mobile transceivers through a data network without the need for hand-off by the cell base stations. In another embodiment, a history of throughput is used to select a base station for reverse channel use since each receiver that can receive from the remote transceiver sends the data to the data concentrator.

Mobile Communication Services in the Cellular Structure

Figure 16:
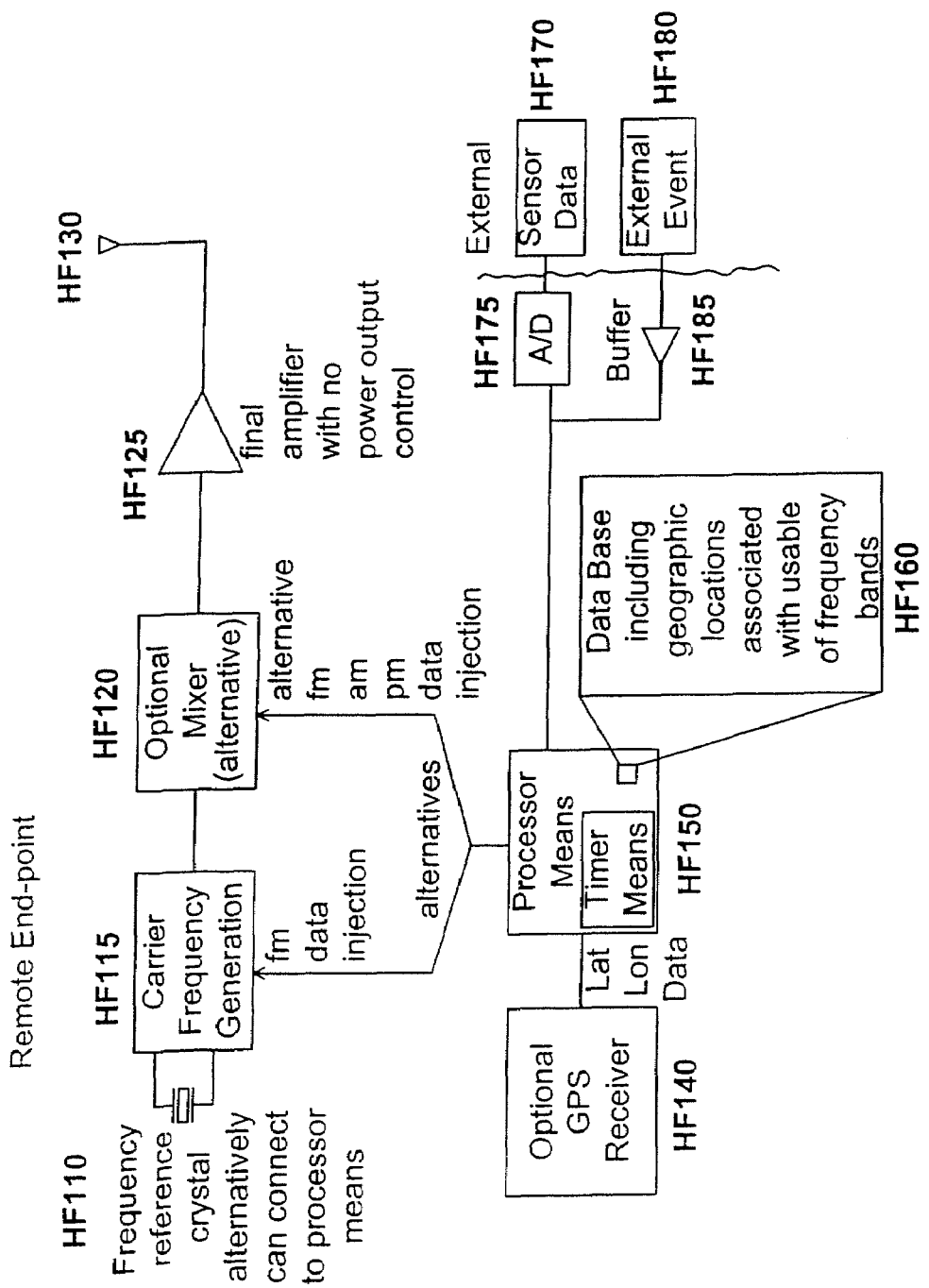
FIG. 16 illustrates a transmitter with alternate configurations.

In another embodiment of the present invention, the remote endpoint mobile device is equipped with the capability to geographically locate itself, for example, through a global positioning system (GPS) capability. Since the endpoints are aware of their location, system loading and reliability can be further improved. FIG. 16 illustrates an endpoint transmitter with a GPS module HF140 according to the present invention. Alternatively, any location device including, but not limited to an inertial navigation system, a stellar system or any other device for determining a geographic position may be used. The transmitter uses the location information (e.g., latitude, longitude, etc.) to determine which frequency to use. This determination is made based on a query of a database HF160 using the present location of the transmitter. Transmission is initiated by a sensor HF170, an external event HF180 or other wake-up event that is managed by the processor HF150.

The wake-up event may be from an internal timer directing the transmitter to transmit a message, or may be an external event, either digital or analog. In one embodiment of the present invention, the device samples the analog input and either transmits the analog value, the rate of change of the analog value, or another message based on a threshold comparison using the sampled value. The processor HF150 responds to the wake-up event by creating a packet for transmission. A frequency reference HF110 is coupled with either the carrier frequency generation block HF115 or other mixer HF120 to create a radio frequency signal for transmission. The processor modulates the RF carrier with the data, which is then amplified by an amplifier HF125 before being radiated by the antenna HF130.

The endpoint device according to the embodiment described above in the context of FIG. 16 is capable of handling an automatic frequency switchover without the need for higher level cellular direction. Accordingly, the device can operate as a mobile transmit-only device while observing a frequency allocation design for a particular geographic area.

FIG. 17 shows an exemplary layout of a geographical area HP50 in which a vertical line HP40 separates two different operating areas that are governed by a licensing body or business objectives. A mobile transmitter might be required to communicate on a first frequency band in one area, and a second frequency band in the other area. The mobile transmitters according to the present invention determine their location using, for example, a GPS receiver. Conventional mobile tracking systems use either manual control or system-directed control to select which frequency band is to be used in which locations. The transmitter endpoint device of the present invention stores an on-board database from which a frequency selection is made based on current location information. This determination is made automatically, therefore no manual control or system-directed switchover is needed.

FIG. 17 includes a flow diagram describing an algorithm for making a frequency determination based on location information. As shown in FIG. 17, the process begins at step HP10 where a transmitter device receives current location information from, for example, a GPS receiver. The process then proceeds to step HP20 where the current location information is used to query a database containing location specific frequency information to determine an appropriate frequency on which to transmit based on the transmitter device's current location. The process then proceeds to step HP30 where the transmitter device transmits a message on an appropriate location specific frequency determined in step HP20.

Applications for mobile transmitters equipped with the capability described in the context of this embodiment of the present invention include, but are not limited to, fleet management services where vehicle location may be an inherent payload parameter. Furthermore, transmitters entering undefined areas may automatically suspend operation. One exemplary benefit of this feature is that unlicensed use may be avoided until the transmitter re-enters a location for which it can determine a transmission frequency to use.

FIG. 18 illustrates another exemplary use of this embodiment of the present invention. As shown in FIG. 18, a metropolitan service area (MSA) HPQ30 may be allocated two frequencies for operation within that area. In the example shown in FIG. 18, the MSA HPQ30 has been allocated 220 MHz and 218 MHz, 220 MHz being used throughout the MSA HPQ30, except for within the areas defined by HPQ10 and HPQ20, where 218 MHz must be used. A mobile transmitter according to the present invention receives its current position from the GPS receiver HPQ40, and determines which frequency to transmit on (i.e., 218 MHz or 220 MHz) based on its current position. A mobile transmitter that is licensed to operate in all three areas will automatically alter its output carrier frequency as it travels throughout the MSA HPQ30.

Smart Repeater Disclosure

In some telemetry installations, there may be a group of transmit endpoints that are located in a challenging RF environment. Transmissions from these endpoints might not be receivable by any base station receiver. According to one embodiment of the present invention, a repeater is set up so that transmissions by these endpoints will be received by at least one base stations. However, this type of installation may significantly increase the ALOHA load of the system, and negatively impact system throughput. A non-discriminating repeater repeats every message it receives, even if the repeated messages were transmitted by strong transmitters and were received by a base station without the aid of the repeater.

Conventional approaches to solving this problem include encoding the identification numbers of 'weak' transmitters into the memory of the repeater. The repeater will then compare the transmitter ID number of every received message against the list of ID numbers stored internal to the repeater. The repeater will then transmit only those messages that it received from the approved list of 'weak' transmitters. This method has a disadvantage that all transmitters must be known when the repeater is installed.

Figure 19:
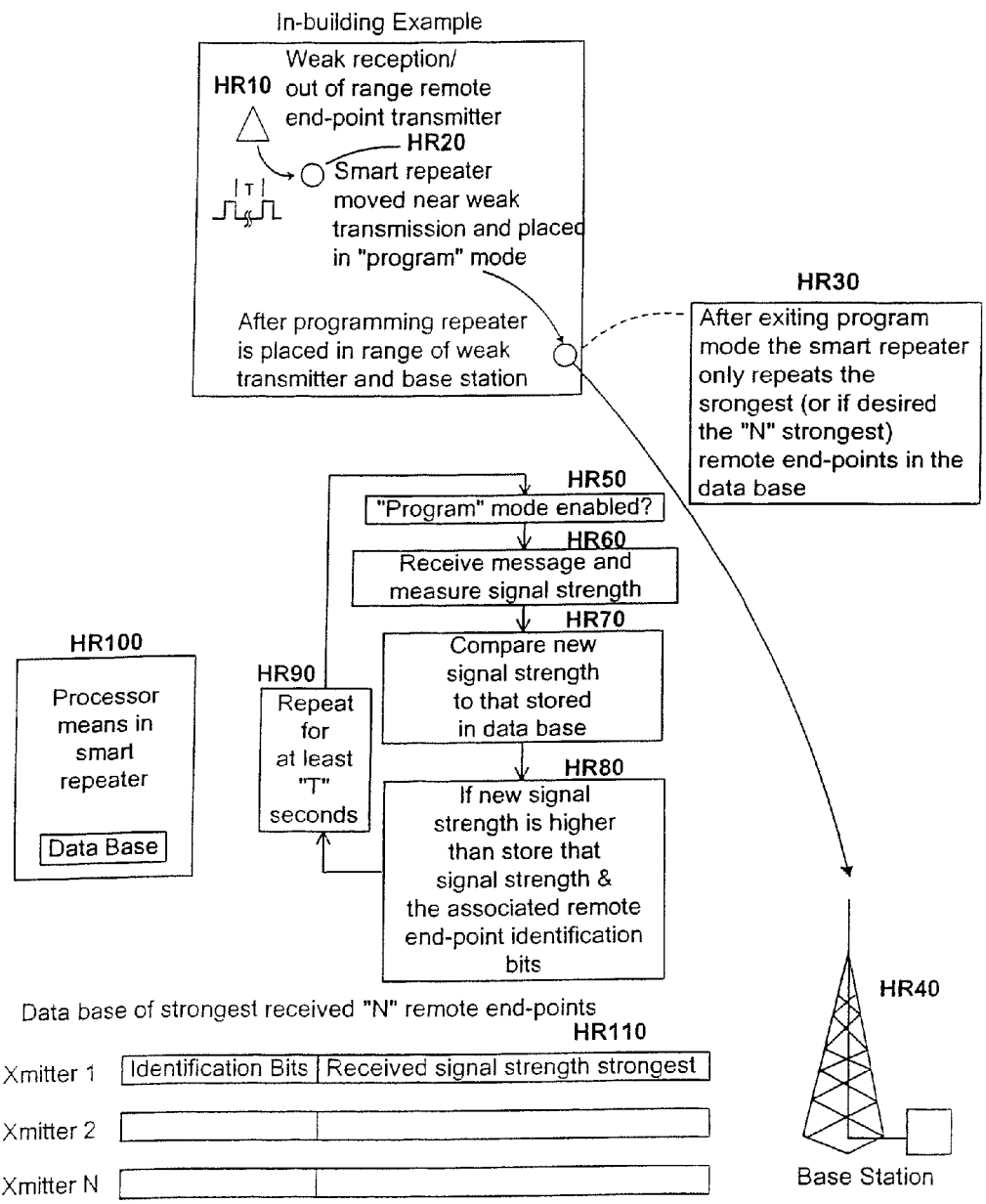
FIG. 19 illustrates smart repeater usage.

The repeater according to the present invention, however, does not require prior information of the ID number of each transmitter whose messages require repeating. The repeater according to the present invention has a special 'program' mode that aids in selecting which transmitters should have their messages repeated. FIG. 19 illustrates an approach for dealing with messages that are not received by any base station according to the present invention. In the example shown in FIG. 19, messages transmitted by a 'weak' endpoint transmitter HR10 are not being received by any base station. In response to this condition, a repeater HR20 is located in close proximity to the endpoint transmitter HR10 and placed into 'program' mode. In 'program' mode, repeater HR20 goes into a receive-only mode for a certain time period, and stores the ID numbers (one of which is the 'weak' endpoint transmitter HR10) of each transmitter from which a message was received into a database. In one embodiment of the present invention, 'weak' endpoint transmitter HR10 is forced to transmit during the time that repeater HR20 is in 'program' mode. As a result of the programming step, the repeater HR20 has stored the ID of the 'weak' endpoint transmitter HR10 into its database. The repeater will then be moved to a permanent installation location HR30, which is within range of both the 'weak' endpoint transmitter and a base station HR40.

FIG. 19 includes a flow diagram describing the process of programming the repeater HR20 according to one embodiment of the present invention. As shown in FIG. 19, the process begins at step HR50 where the repeater HR20 is placed into programming mode. The process then proceeds to step HR60 where the repeater HR20 receives messages and measures the signal strength of each received message. The process then proceeds to step HR70 where the signal strength of each received message from each transmitter ID is compared to an entry from a temporary data base with the highest stored signal strength from that transmitter ID. The process then proceeds to step HR80 where if the new signal strength for a given transmitter ID is stronger than the stored signal strength, the temporary database is updated with the new value. As shown in step HR90, the process continues for a predetermined interval of time "T." The transmitter ID corresponding to the highest signal strength value (which should correspond to the 'weak' endpoint transmitter) will then be stored in a permanent database HR110. The above described process is performed by a processor or other algorithmic device HR100 capable of performing the prescribed function.

In another embodiment, the smart repeater HR20 uses a time acceptance window exclusively, ignoring the signal strength of the received messages. This approach removes the need to closely locate the repeater in the program mode. In this embodiment, the time acceptance window is short, and the 'weak' endpoint device is made to transmit within the time acceptance window. In yet another embodiment, the smart repeater HR20 is configured to allow for a transmitter ID to be communicated to the smart repeater HR20, through, for example, a special message format recognizable by the smart repeater HR20.

The smart repeater of the present invention is applicable in a variety of systems, including, but not limited to, narrowband, wideband, direct sequence spread spectrum, frequency hop and any other digital communication technology where the transmitting endpoint is identifiable by some sort of identification tag. The identification tag allows the repeater to identify and distinguish messages based on their origin.

Boost Mode

In one embodiment of the present invention, sensitivity that is lost due to sub-optimal conditions is recovered at both the transmitter and the receiver. Transmit-only remote endpoint devices are sometimes used in applications that hinder the device's ability to be received by the intended receiver. In this embodiment of the present invention, the lost sensitivity is recovered without incurring the cost of a higher output power of the transmit-only device. This is accomplished on a system level, both at the transmitter and at the receiver.

In this embodiment of the present invention, the system is placed into a mode designated as "boost" mode. "Boost" mode dedicates at least one of the system channels as a "boost mode" channel. In this mode, the system operates as a multi-channel receiver architecture at the base station where each of the channels are independently configurable for use. The receiver dedicates at least one system channel for reception of the boost transmitters.

FIG. 20 illustrates typical frequency allocations for both normal and boost channels from the perspective of a multi-channel receiver system. FIG. 20 illustrates a normal, non-boost frequency allocation HH120, HH130. The signal occupying the channel identified as HH120 is shown as being strong in signal-to-noise ratio (SNR), and therefore, should be received properly. The normal signal occupying the channel identified as HH130, however, is low in SNR and therefore, is a candidate for switchover to boost operation.

The boost transmitters transmit in a specified boost channel, identified in FIG. 20 as HH140, at a significantly lower data rate than the other, normal system channels. The receiver detects boost transmitters in a smaller bandwidth (a sub-boost bandwidth) within the system boost channel. The noise floor for reception has a mean power proportional to the receiver detector bandwidth. The gain in sensitivity is 10*log(bandwidth reduction ratio). The receiver sub-boost channel bandwidth is about equal to the bandwidth of the boost signal which produces a reduced noise floor HH160 resulting in greater link budget. By lowering the baud rate (i.e., data rate), the system provides for better sensitivity as shown in the following formula:

$$SNR \text{ improvement} = 10 * \log(\text{normal baud rate} / \text{lower (boost) baud rate})$$
$$= 10 * \log((16.64 \text{ kb/s}) / (520 \text{ b/s}))$$
$$= 15 \text{ dB}$$

Some installations attenuate the transmitter radiation by 10-15 dB. This results in a loss of SNR at the receiver and limits the ability to use the preferred higher data rate techniques of the transmitter. The 15 dB SNR improvement provided by boost mode, as noted above, can overcome the estimated 10-15 dB loss due to this restriction. The present invention uses this receiver SNR gain to enable transmitter installations in previously unusable locations such as buried water meters.

Boost mode not only increases sensitivity at the receive end, but also can significantly increase the service coverage area while maintaining expected battery life and favorable collision statistics, even though the message duration is increased due to the decrease baud rate, providing that the number of transmissions be reduced by the following ratio:

Normal baud rate/lower (boost) baud rate

Figure 21:
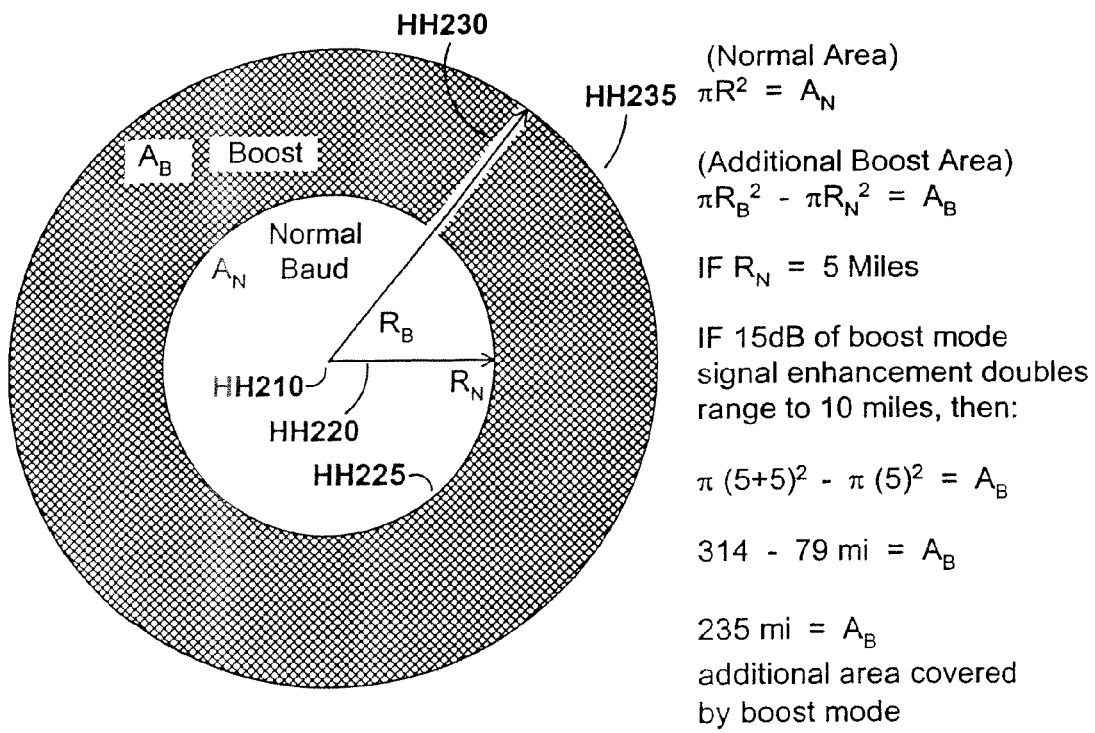
FIG. 21 illustrates additional area covered by boost mode.

The service area range extension due to the SNR increase provided for by boost mode, in one example, allows for a 235 square mile extension as illustrated in FIG. 21. In this example, the receiver is placed at a central location HH210, and the radius of the standard coverage area $R_N$ is equal to 5 miles HH220. Using these numbers, the standard area covered is:

$$\text{Normal baud covered area} = \pi*(5)^2 = 79 \text{ square miles.}$$

If 15 dB of boost mode SNR improvement extends the usable range to a 10 mile radius $R_B$ HH230, then the additional coverage provided by boost is:

$$\text{Additional Boost coverage} = \pi*(10)^2 - \pi*(5)^2 = 314 - 79 = 235 \text{ square miles.}$$

In FIG. 21, the extended boost mode coverage area is shown as HH235. Furthermore, since the baud rate has been significantly lowered, the corresponding bandwidth of the signal has been significantly lowered, thereby allowing for several boost sub-channels to fit within the dedicated system channel.

FIG. 22 illustrates a proportionality relationship for the reduction of packet transfers in a boost enabled system according to one embodiment of the present invention. As the boost messages are longer in duration, the overall number of packets to be received is reduced in proportion to the ratio of data rates between boost and normal operation.

An additional benefit of boost mode according to the present invention is illustrated in FIG. 23. As shown in FIG. 23, the allocated boost channel is located between two normal system channels. Strong transmitters channels adjacent to the boost channel will overlap the boost channel. This is caused by, for example, frequency drift, oscillator phase noise, PLL spurs, modulation roll-off, transmitter data filter roll-off, crystal aging, Doppler shift, or other causes inherent in the transmitter or receiver system components. The impact of the adjacent channel bleed-over can be mitigated by concentrating the boost sub-channels HNN30, HNN32, HNN34 toward the center of the dedicated boost band. By doing this, the bleed-over of the strong signals HNN21, HNN22 into the boost channel boundaries HNN12 and HNN14 does not impact the performance of the boost communications.

Figure 24:
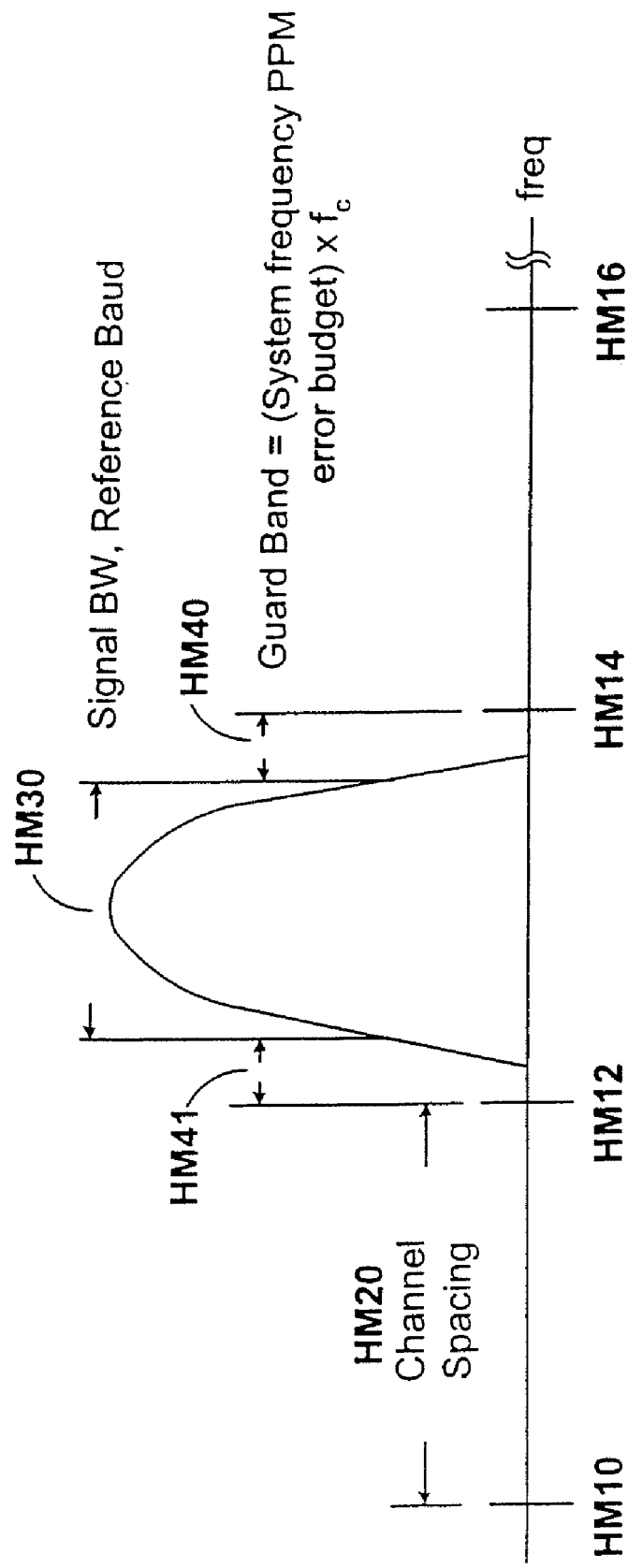
FIG. 24 illustrates signal bandwidth vs. guard band.
Figure 25:
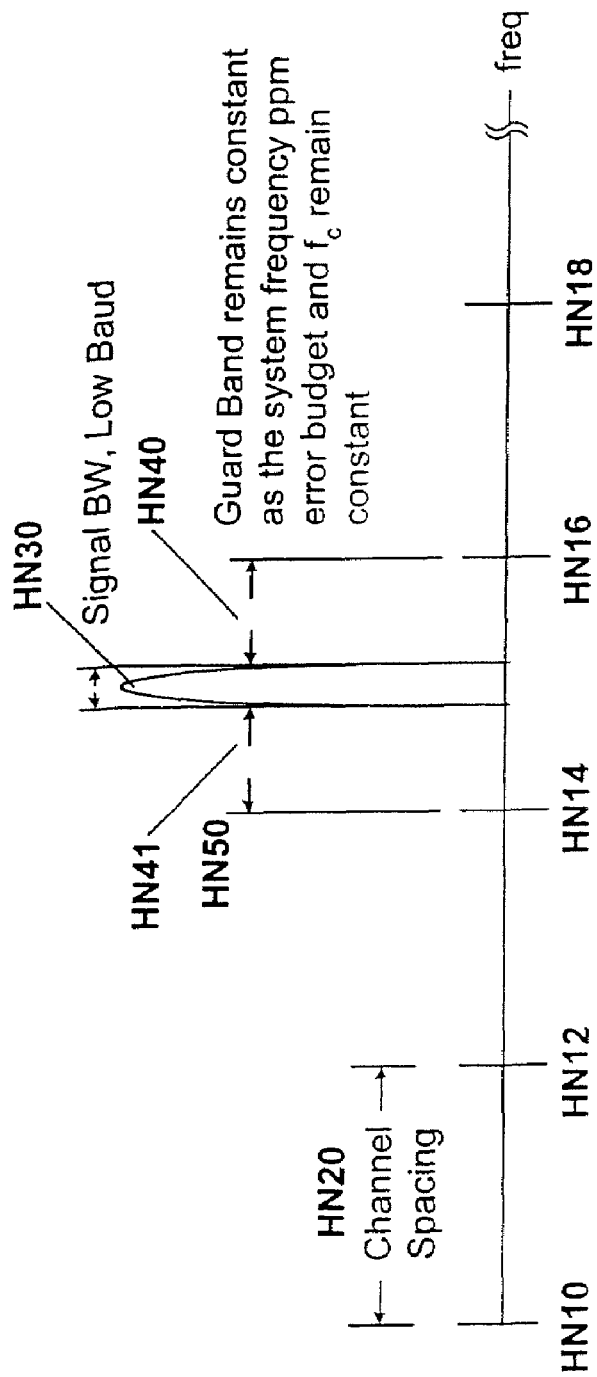
FIG. 25 illustrates signal bandwidth vs. guard band in "boost" mode.

Due to a fixed frequency error budget for the system according to the present invention, the reduced baud rates do not proportionally increase the number of usable channels, as illustrated in FIGS. 24 and 25. The frequency error budget is equal to the fractional system frequency error budget times the carrier center frequency. As the carrier center frequency gets higher, the required guard band bandwidth can increase beyond the received signal bandwidth. As shown in FIGS. 24 and 25, in normal, non-boost operation, signal HM30 requires additional guard band HM40 on either side of the desired center frequency of operation to allow for frequency reference error. Similarly, boost channels HN30 must also allow for guard band HN40. However, since guard band is not a function of signal bandwidth, the proportional band usage ratio is not a constant. Regardless of the mode (i.e., normal or boost), the guard band HN40, HM40 required is the same, provided the center frequencies of operation are identical.

Reduced baud rates do not proportionally increase the number of usable channels. This results in a 5× waste of available bandwidth. Furthermore, as the center frequency of operation goes higher, the guard band alone increases, thereby further reducing the ratio of signal to guard bandwidth.

Figure 26:
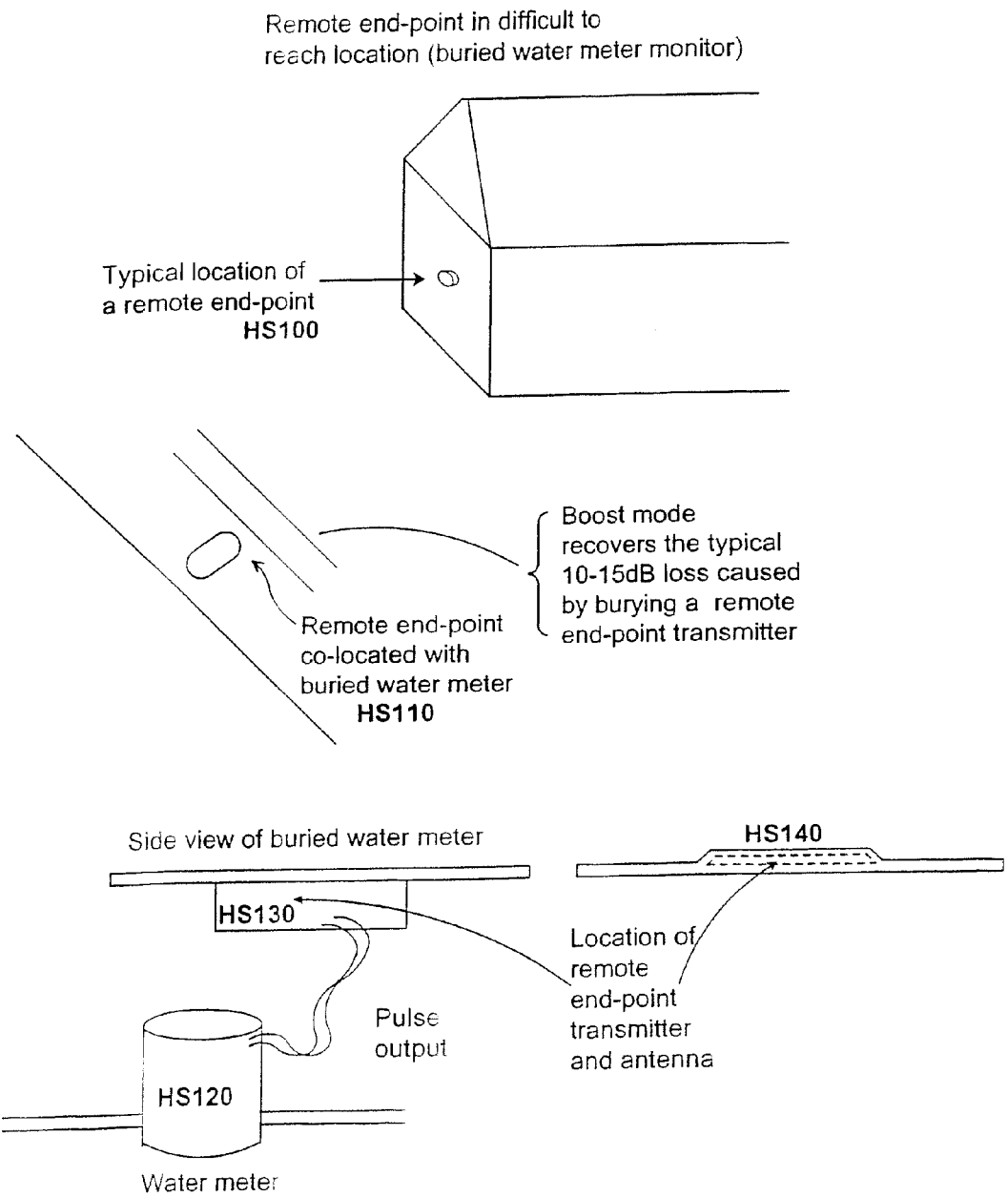
FIG. 26 illustrates transmitter locations that require boost mode.

The boost mode SNR gain provided by the present invention can be used to recover data from installed endpoints that was previously unfeasible. FIG. 26 illustrates a few exemplary installation problems that are mitigated by boost mode. The present invention uses boost mode for remote endpoint devices that are disadvantageously located, for example, on the side of a building HS100, or in various buried metering applications HS110. Meter HS120 represents an underground metering application such as, for example, water, fuel, or flow. The endpoint transmitter is co-located at the most advantageous spot possible. In the example shown in FIG. 26, the transmit device HS130 is mounted to a meter access port. In this example, an antenna HS140 is integrally built into the meter access barrier.

FIG. 27 illustrates a channel utilization map for one embodiment of the present invention. In this embodiment, the system is configured for area-wide packet data. As shown in FIG. 27, boost channels are allocated to Channel 3 in this example. Channel 10 is indicated as being reserved. In one exemplary embodiment Channel 10 is used by a distant base station to repeat locally received messages for reception by another-base station. This exemplary use is illustrated in FIG. 1 where a distant base station HA70 repeats messages that it has received on Channel 10 (i.e., $f_{10}$) to base station $B_3$ HA30.

Figure 50:
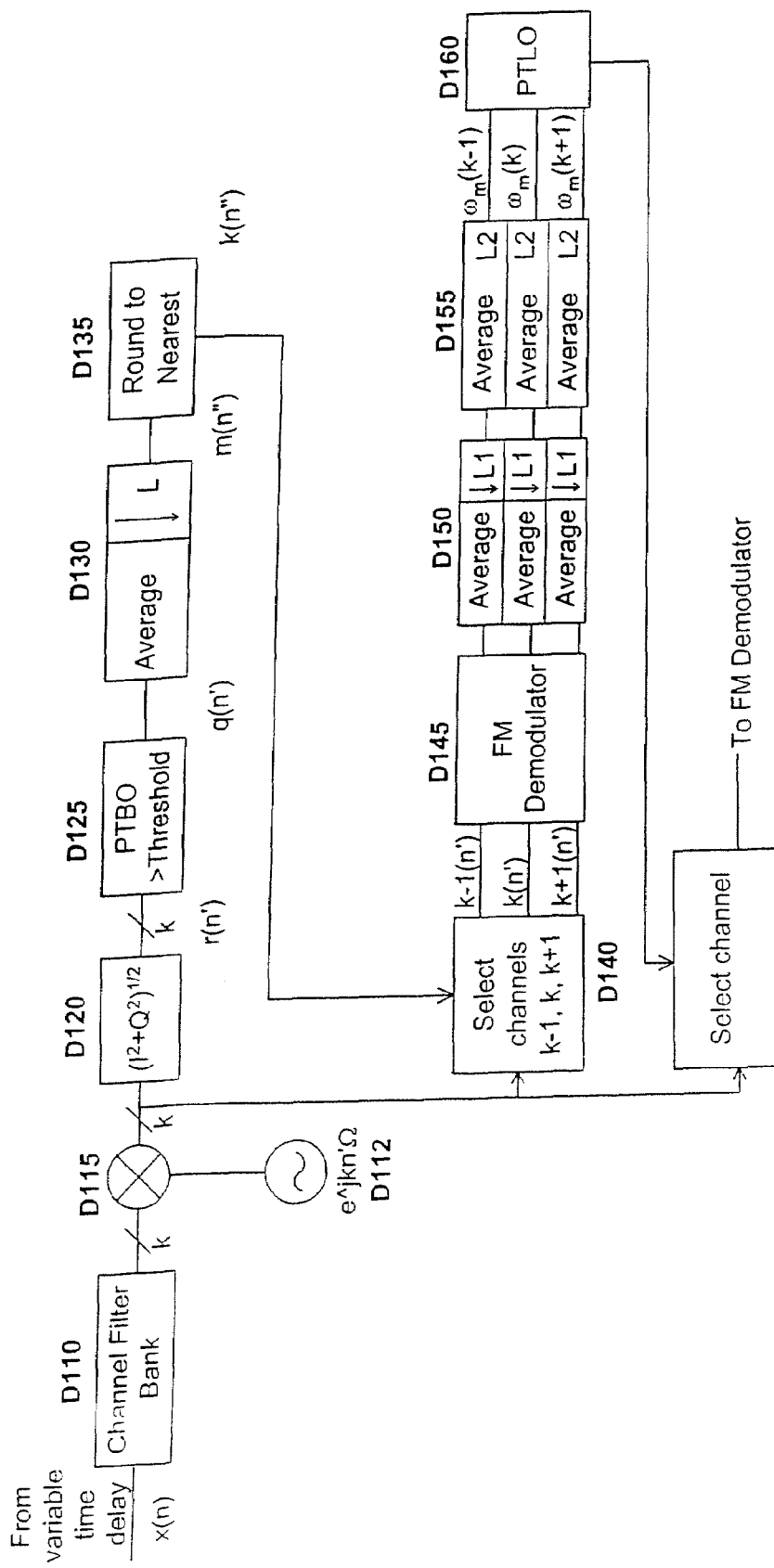
FIG. 50 illustrates a wide error frequency resolving trip algorithm.

Alternatively, the present invention allows a looser definition of the allowable boost channels that may be used, which will allow the center frequencies to drift significantly. This mitigates the issue of guard band waste as long as the receiving system has the ability to process a boost channel over a band including the entire band of operation allocated for boost plus the error guard band. Using this approach, the system functions more like a randomized transmit frequency system than a channelized transmit frequency system. This is due to allowing for frequency error of the transmitter which will cause the signal to show up anywhere in the system channel versus in a predicted sub-channel. In this mode of operation, the corresponding receiver uses windowed-FFT's to evaluate the entire system bandwidth as shown in FIG. 50, a description of which is included herein.

In one embodiment of the present invention, boost sub-channels are nominally separated by a predetermined frequency spacing. In another embodiment, a further improvement in the system achieved by ensuring an even distribution of the usage of the boost sub-channels by having the boost transmitter transmit on all of the sub-channels either sequentially or in a pseudo-random fashion. In yet another embodiment, the transmit frequency is dithered within the sub-channel spacing. In an alternative to dithering transmission frequencies for each transmission, each transmitter could be tuned during manufacturing to one of a distribution of different frequencies within the sub-channel.

Battery Life of Transmit-Only Endpoint Device

As described above, the present invention provides for low cost, battery operated endpoint devices that have multi-year operation. A single, readily available battery will provide sufficient energy due to the low duty cycle of the transmitter, assuming that the transmit endpoint device has the capability for entering a reduced power state for the majority of its service life.

Figure 28:
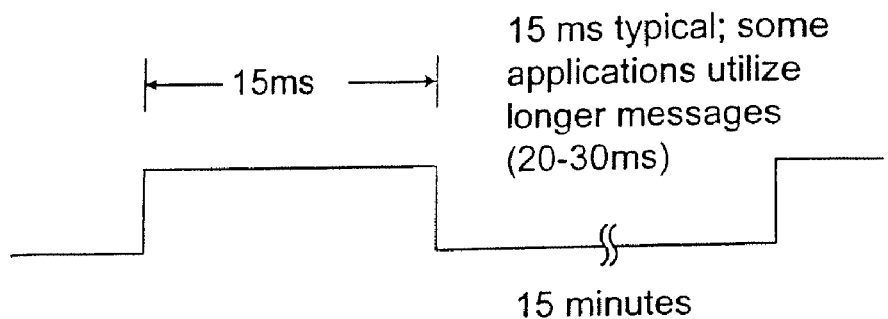
FIG. 28 illustrates transmission duty cycle used to calculate battery life.

FIG. 28 illustrates the multi-year operation using a single 1.4 amp-hour (AH) battery. If a 15 millisecond data burst with a 15 minute repetition rate is assumed, the resulting duty cycle is:

duty cycle=0.015/(15*60)=0.000016666

In one embodiment of the present invention, the transmitter radiates 2 Watts (W) of power and typically requires 550 milli-Amperes (mA) for operation. An average transmit current can be calculated based on the duty cycle and average current as:

Average transmit current=550 mA*0.000016666=9.2 μA/sec

Typically, the transmitter makes a transition from a sleep state to a ready-to-transmit state which may take a few milliseconds (e.g., 10 ms) at some lower current consumption, (e.g., 25 mA in one embodiment of the present invention). The transmit set-up current is additive and calculated as:

Transmit set-up current=(0.010*25 mA)/(15*60)=0.3 μA

In one embodiment of the present invention, the current consumption of the transmitter in a sleep state is 5 μA in a sleep state:

Sleep current & leakage=5.0 μA

Therefore, a the total average operation current for this example becomes:

Total transmitter current/second=9.2+0.3+5.0=14.5 μA

Using a conventional 1.4 AH lithium battery (derated 20% to compensate for self leakage), the transmitter service life in this embodiment of the present invention can be calculated as:

(1.4 AH*0.8)/14.5 μA=72,241 hrs=8.8 years

Accordingly, with update rates in the order of 15 minutes, devices according to the present invention which transmit in the 15 msec duration range can operate on a single battery for multiple years, even while transmitting 2 Watts.

Targetable Software Update

Embedded computer systems are becoming more common in the radio arts, and more than one embedded processor is often used in these systems. Periodically, the software for these systems must be modified to accommodate new system requirements. The diverse locations of many of these base stations dictate that the embedded software be updated remotely. Standard practice would update software for all embedded processors within a system. Partial software updates, or an update for only one of several processors within a system, introduces undue system complexity. The present invention provides an approach for performing a partial software update without introducing additional system complexity.

Figure 29:
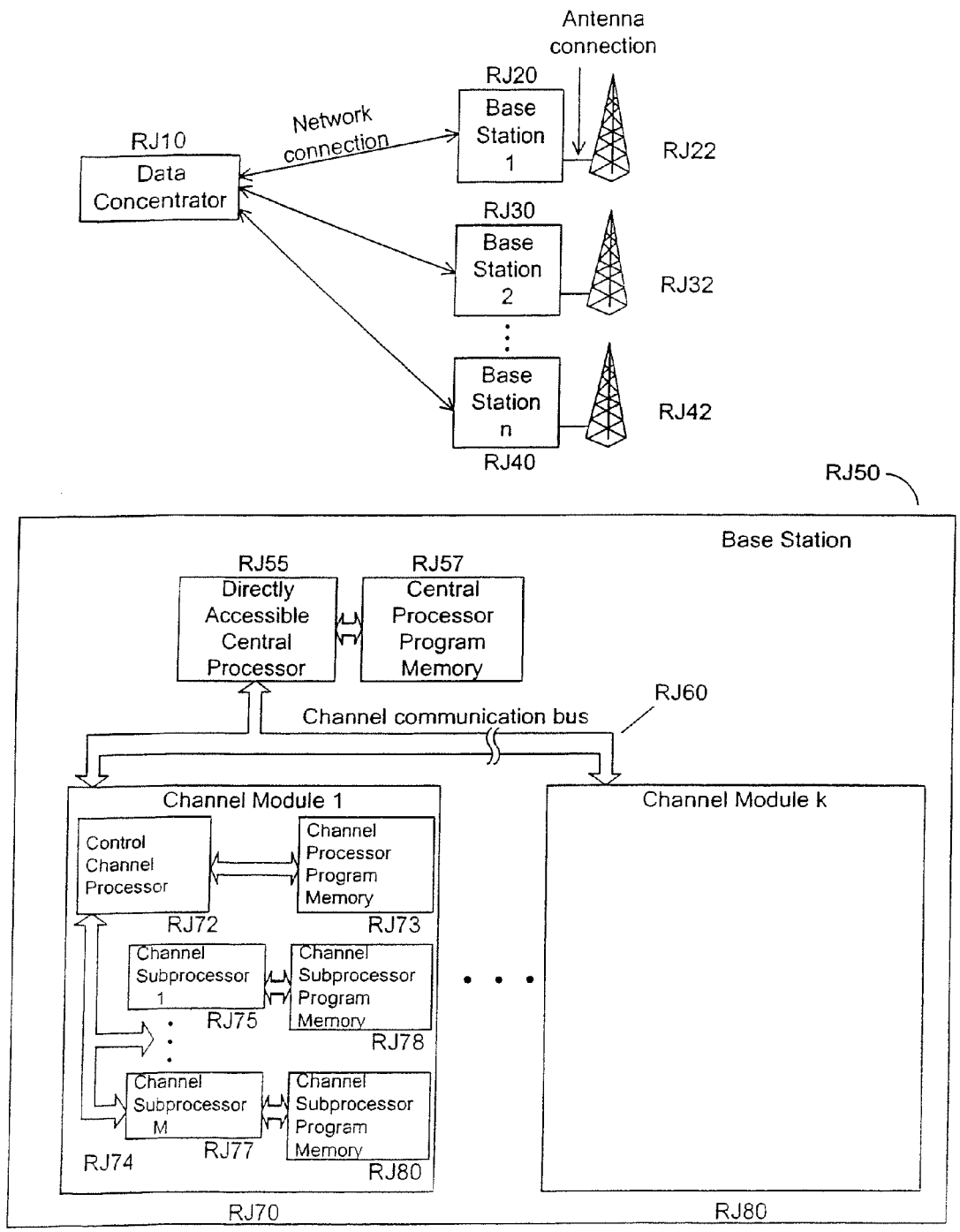
FIG. 29 is a block diagram of a basic base station system configuration.

In one embodiment of the present invention, specific portions of embedded software can be updated remotely. FIG. 29 illustrates a Data Concentrator RJ10 connected to "n" remotely located base stations RJ20, RJ30, RJ40. Each base station RJ20, RJ30, RJ40 is connected to an antenna RJ22, RJ32, RJ42, respectively. Block RJ50 is a block diagram of a base station. Each base station RJ20, RJ30, RJ40 is connected to the Data Concentrator RJ10 by a network connection. Base station RJ50 includes at least one central processor RJ55 that is directly accessible to the Data Concentrator. Processor RJ55 has a dedicated central processor program memory RJ57. Processor RJ55 interfaces with a central communication bus RJ60, whereby processor RJ55 communicates with other embedded processors in the system. In one embodiment of the present invention, the base station receiver uses a plurality of channel modules to simultaneously search multiple frequency channels. Channel Module 1 RJ70 contains a dedicated control channel processor RJ72 connected to a channel program memory device RJ73. Control channel processor RJ72 uses communication bus RJ74 to communicate with channel subprocessors RJ75 through RJ77, each having dedicated memory hardware RJ78 through RJ80. It is not necessary that processors RJ55, RJ72, and processors RJ75 through RJ77 are of the same type. Central processor RJ55 uses communication bus RJ60 to communicate with multiple channel modules RJ70, RJ80. In one embodiment of the present invention, each of the processors in the base station RJ50 has a unique identification number.

In one embodiment of the present invention, a message protocol allows for the remote update of a single memory sub-system in the base station architecture described above. Using this protocol, the Data Concentrator modifies individual memory locations of any of the memory devices located at any of the base stations in the system.

Figure 30:
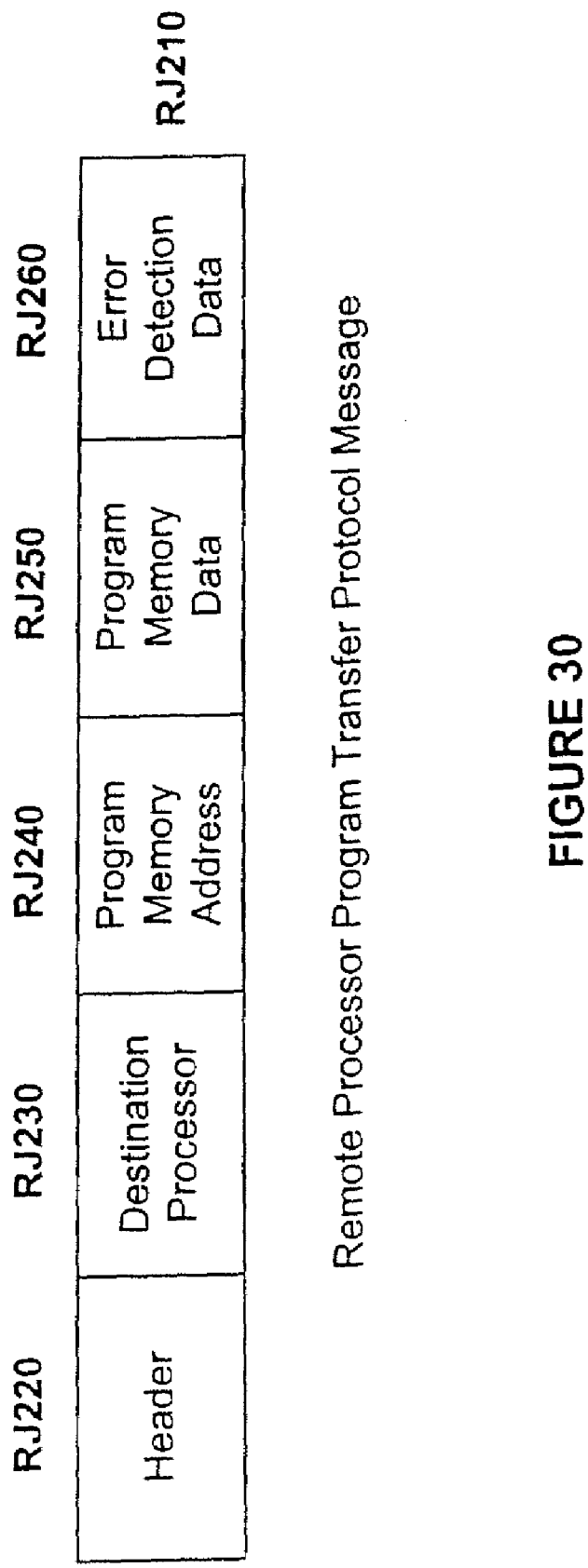
FIG. 30 illustrates remote processor program transfer protocol message.

FIG. 30 illustrates a message protocol for modifying a memory of a base station according to one embodiment of the present invention. As shown in FIG. 30, the message RJ210 includes a message header field RJ220, a destination processor identification field RJ230, a memory address location field RJ240 indicating which memory address to update, a program memory data field RJ250 containing the program memory data that will be stored at the location indicated by the memory address location field RJ240 and an error detection data field RJ260 containing information used in performing error detection.

LAN-to-WAN Bridge

Figure 31:
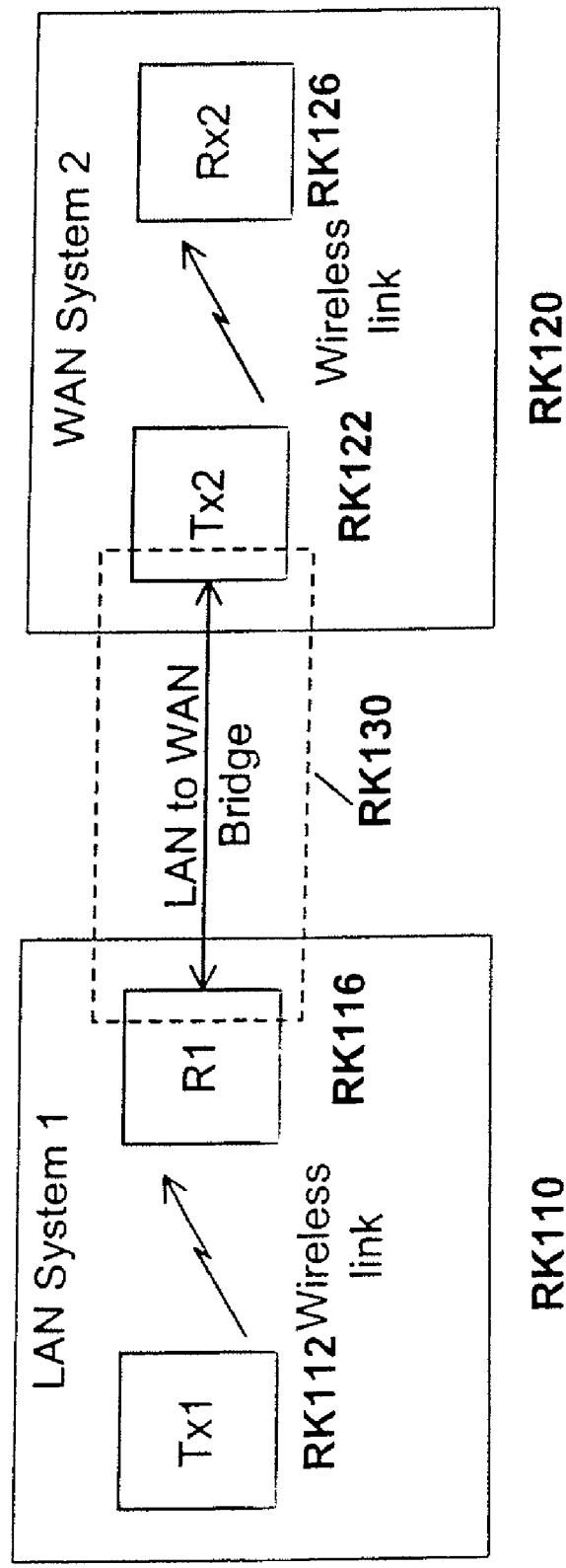
FIG. 31 illustrates LAN to WAN bridge.

FIG. 31 illustrates a LAN system being connected to a WAN system according to one embodiment of the present invention. The system includes a transmit-only (one-way) LAN subsystem RK110 that has a transmitter RK112 and receiver RK116. The system also includes a transmit-only (one-way) WAN subsystem RK120 that has a transmitter RK122 and receiver RK126. The LAN receiver RK116 is coupled to the WAN transmitter RK122 by a bi-directional LAN-to-WAN bridge RK130. The WAN transmitter RK122 is programmed to transmit a message immediately upon receiving the message via the LAN-to-WAN bridge RK130 from receiver RK116. Alternatively, transmitter RK122 can be programmed to transmit the received message after a set or pseudo-random delay. In this way, an ALOHA-based transmission on one network will generate an ALOHA-based transmission on a separate network.

Figure 32:
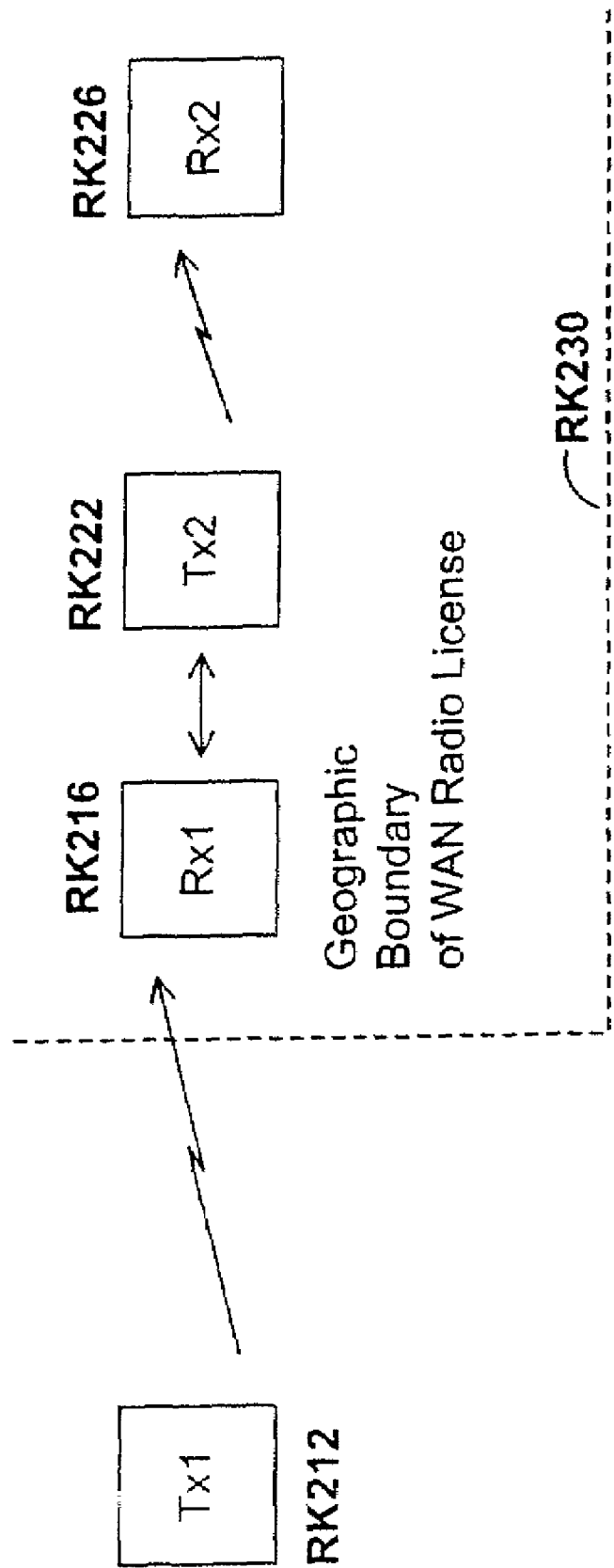
FIG. 32 illustrates geographic boundary of WAN radio license.

FIG. 32 illustrates an advantageous use of the LAN-to-WAN bridge of the present invention. As shown in FIG. 32, an endpoint transmitter RK212 is located outside of a licensed coverage area RK230 of a WAN. The LAN transmitter RK212 wirelessly transmits messages to the WAN receiver RK216, which in turn transmits the message via the LAN-to-WAN bridge RK130 to WAN transmitter RK222. WAN transmitter RK222 located within the licensed coverage area RK230, and will transmit the message on the licensed frequency band to WAN receiver RK226.

Figure 33:
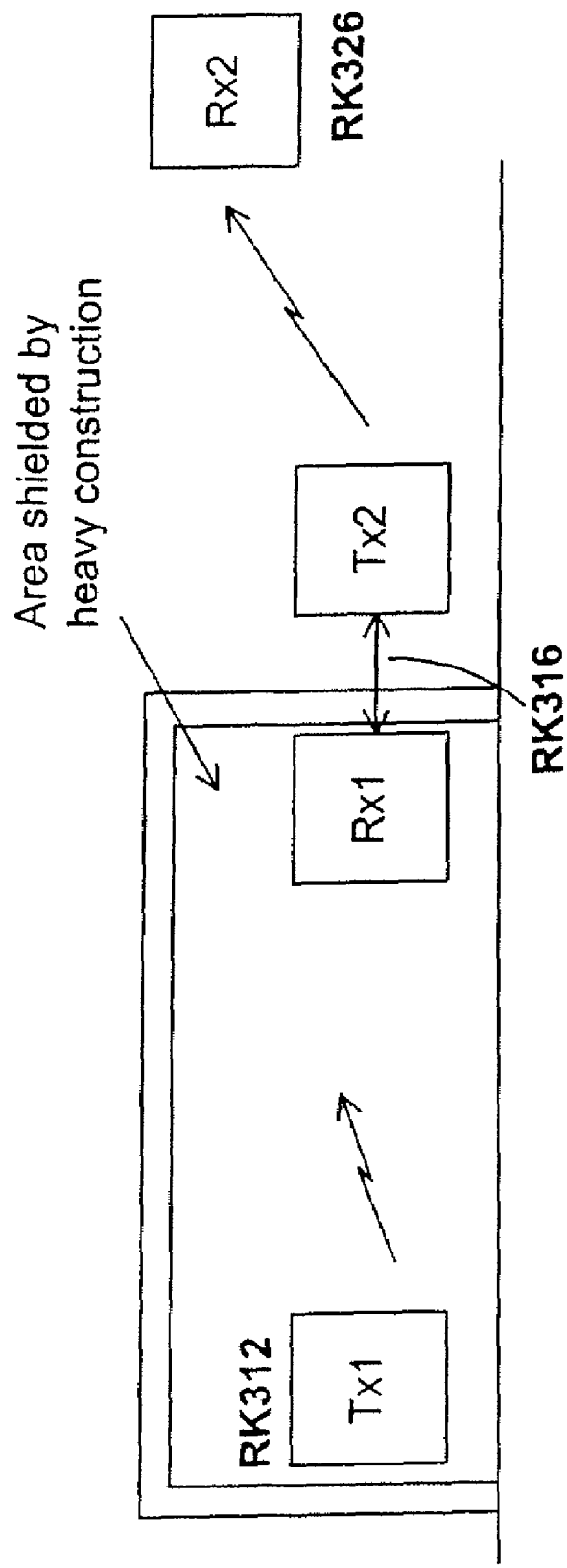
FIG. 33 illustrates LAN to WAN bridge example.

FIG. 33 illustrates another example, where an endpoint transmitter RK312 is located in a disadvantageous location with respect to the system WAN receiver RK326. In this case, a repeater may be used to bridge the area of obstruction to a more advantageous area of reception relative to the system WAN receiver RK326. Bridge RK316 transfers messages received inside the area of obstruction to a transmitter outside the area of obstruction, which then retransmits those messages to a receiver RK326.

Figure 34:
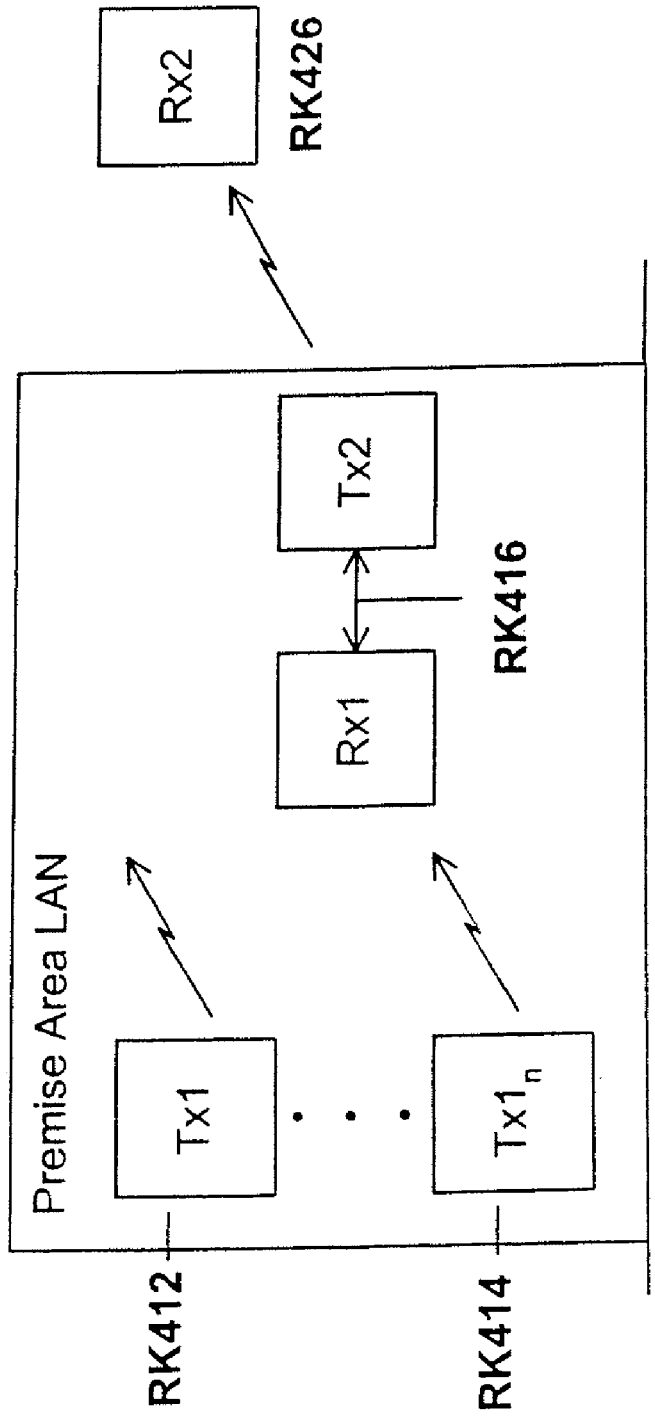
FIG. 34 illustrates special exception LAN messages transferred to WAN.

FIG. 34 illustrates a third exemplary use of the LAN-to-WAN bridge where the bridge serves as a LAN concentrator, receiving messages from a plurality of remote endpoint devices RK412, RK414. The bridge RK416 then relays all or a selected group of messages from the remote endpoint devices to the system receiver RK426.

Remote Serial Data Monitoring

In one embodiment of the present invention, a system remotely monitors serial devices as well as sensor components. Remote endpoint devices serve as a serial to RF translation devices, transforming the serial data to packet telemetry messages to be broadcast over the system and reconstituted at some other destination into a serial stream.

Figure 35:
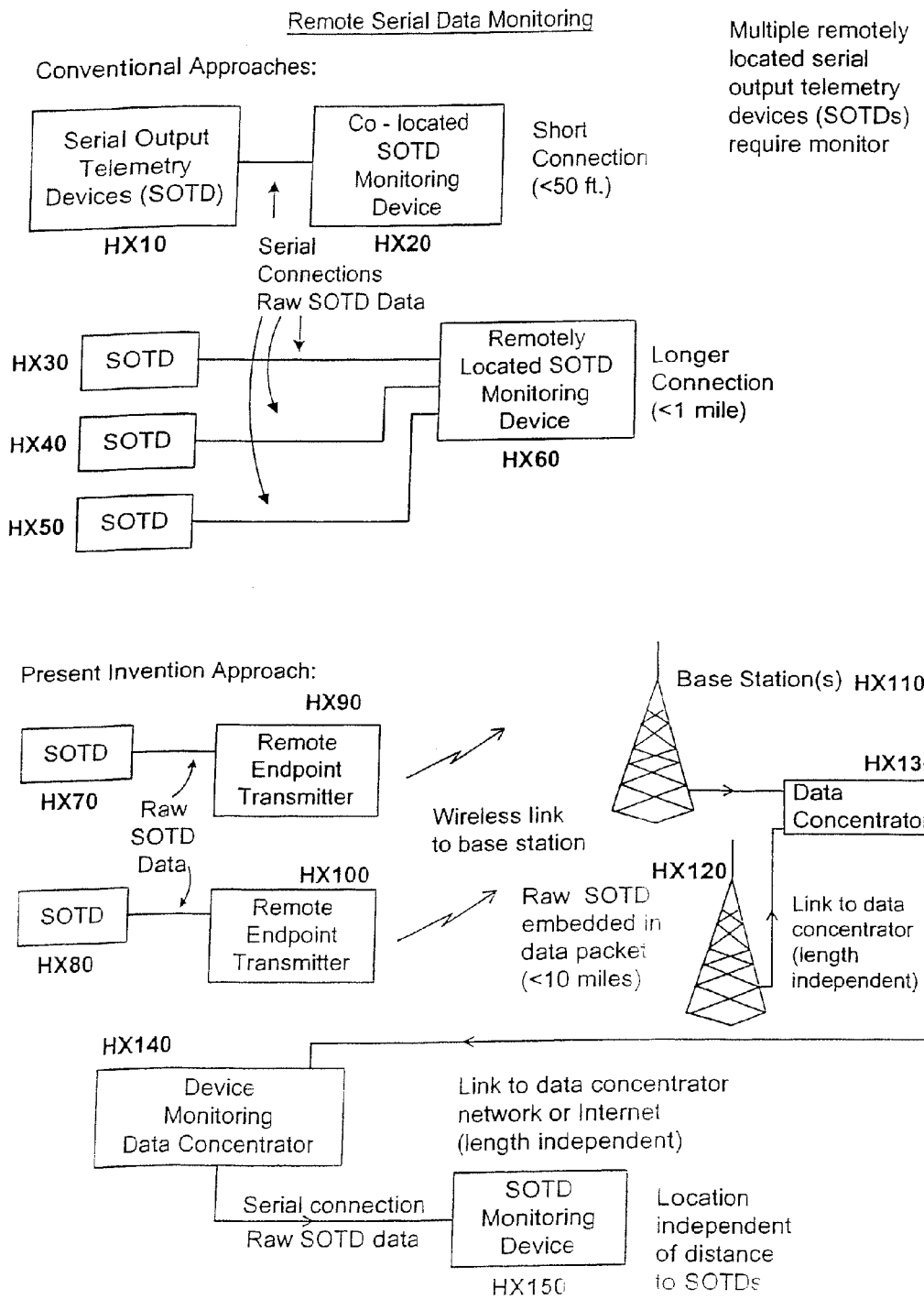
FIG. 35 illustrates remote serial data monitoring.

FIG. 35 illustrates a conventional approach for monitoring serial data as well as system for monitoring serial data according to one embodiment of the present invention. As shown in FIG. 35, the conventional communication system interfaces a serial device HX10 to a monitoring device HX20 through a hard-wire connection. For distributed systems where a plurality of remote endpoints are concentrated, this conventional approach requires that a separate hard-line wire be run to each endpoint HX30, HX40, HX50 from the monitoring device HX60. Sometimes, the endpoint devices HX30, HX40, HX50 are serially strung to limit the wire to one physical component.

In one embodiment of the present invention serial devices are each equipped with an endpoint transmitter, alleviating the need to hardwire all of the monitored devices together. Moreover, the monitoring device need not be co-located with the devices being monitored, and can therefore be placed at a convenient location. As shown in FIG. 35, serial devices HX70, HX80 are provided radio transmitters HX90, HX100 which serve as the remote endpoint devices in the wireless network. A base station or group of base stations HX110, HX120 receive messages from the remote transmitters. A data concentrator HX130 performs data reduction and presents the data to a device monitoring data concentrator HX140 that may be placed in any convenient location, even miles or continents away from the devices being monitored. In one embodiment of the present invention, the link between the data concentrator HX130 and the device monitoring data concentrator HX140 is the Internet. In an embodiment where the link to device monitoring data concentrator is the Internet, the device monitoring data concentrator HX140 may in fact be many devices, widely separated and uncoordinated. The serial signal from the serial telemetry devices HX70, HX80 is reconstituted at a serial output telemetry device monitoring device HX150 or at as many endpoints as is desired.

Transmitter Device

Figure 36:
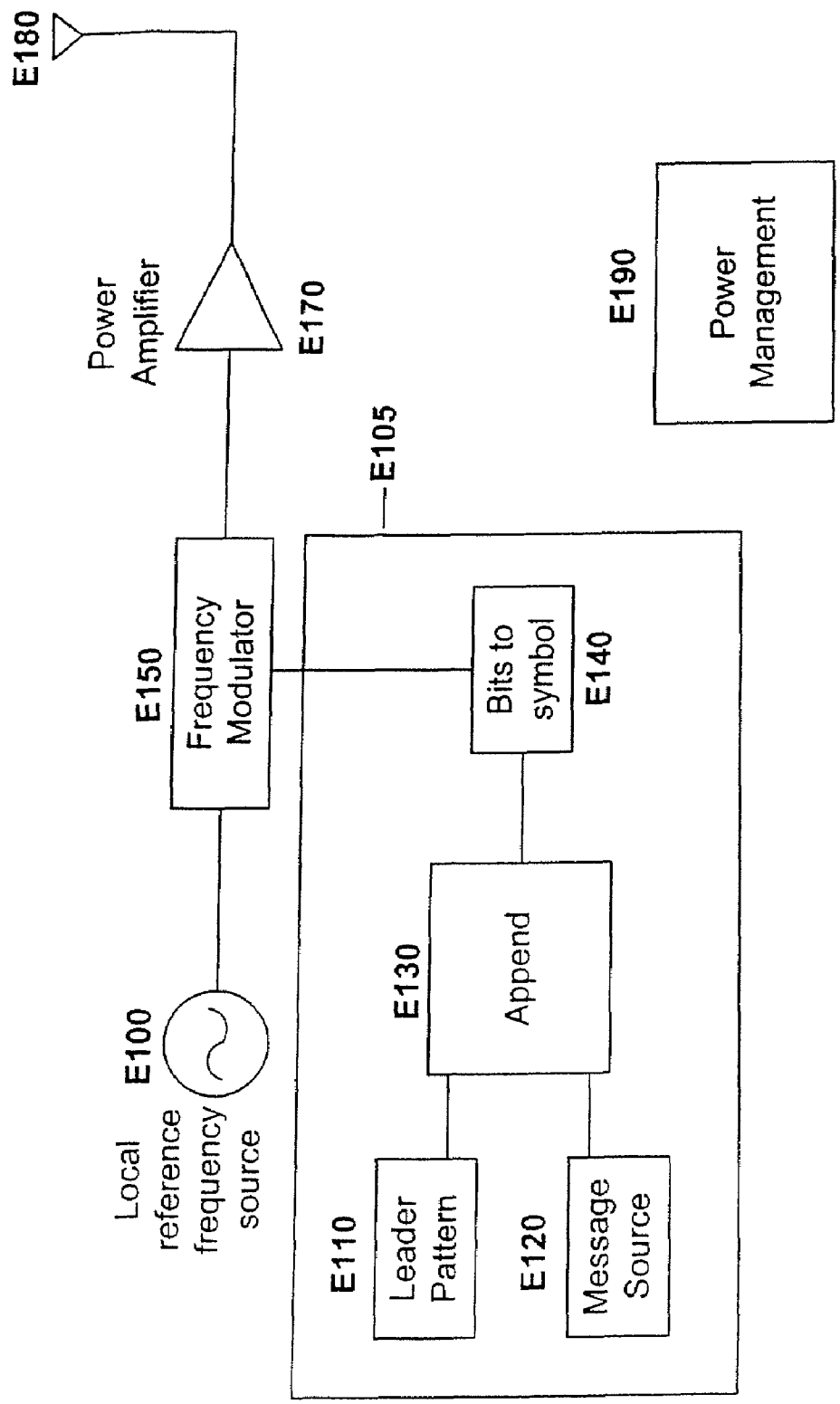
FIG. 36 illustrates a basic FSK transmitter block diagram.

FIG. 36 illustrates a typical FM RF architecture that accepts a modulating waveform, generates a modulated carrier, amplifies it, and presents it to an antenna. FM modulation and RF amplification techniques are well known in the digital communication art, and are therefore, not described in detail herein. Using FM allows for more power efficient (i.e., non-linear) power amplifiers than non-constant envelope modulation methods.

As shown in FIG. 36, the architecture includes a frequency source E100, a frequency modulator E150, a power amplifier E170, an antenna E180, and a modulating waveform generator E105. The frequency source E100 is a crystal-controlled frequency synthesizer, or any other frequency source. The modulating waveform generator E105 includes a leader pattern generation block E110, a message source E120, an appending block E130, and a modulating symbol waveform generator E140.

The leader pattern generation block E110 generates a leader, which is a repeating pattern of bits that are appended to each data packet transmitted, and are used by the receiver for signal detection and acquisition processing. The message source E120 provides the information bits. The appending block E130 appends each data message from the message source 120 with a leader from the leader pattern generation block E110 to create the complete sequence of bits to be transmitted. The output of the appending block E130 is provided to a modulating symbol waveform generator E140.

The frequency modulator E150 receives the modulating symbol waveform from block E140 and the carrier waveform generated by the frequency source E100 as input. The frequency modulator E150 modulates the carrier waveform with the modulating symbol waveform to produce a frequency modulated carrier wave that is amplified by the power amplifier E170 and coupled to the antenna E180.

In a more complex FM transmitter architecture, a power management unit E190 is also included. The power management unit E190 includes an ultra-low power timekeeping unit. The timekeeping unit provides power to the other elements of the transmitter at predetermined time(s), thereby conserving power when transmissions are not required. This power conservation technique requires that the frequency source E100 be able to start rapidly when power is applied. Rapid starting crystal oscillators are readily available devices.

In one embodiment of the present invention, the frequency source E100 and frequency modulator E150 include a crystal oscillator and a phase locked loop (PLL) that includes a high pass frequency modulation input. This is a common design that has a relatively low cost. Typically, in order to pass the modulating symbol waveforms with full fidelity, the PLL time constants are 5, 10, 20, 50, 100, or more times longer than a frequency shift keying (FSK) symbol duration. In a transmitter where power management was important, these PLL time constants would significantly degrade battery life due to the long start-up or frequency change settling time required by the PLL.

A modulation transfer function (MTF) is a broad bandpass transfer function that requires that the modulating waveform contain no DC response, and no low frequency spectral component. In conventional M-ary FSK, the information bit stream is encoded to remove the DC response and the low frequency spectral components. An impact of this encoding is a reduction in the effective bit rate.

In one embodiment of the present invention, the PLL time constants are set to be about equal to the FSK symbol rate. Shorter PLL time constants conserve energy and extend battery life. However, having short time constants for the PLL results in a bandpass MTF that rolls off steeply (−40 dB per decade) below the symbol rate. This degradation is corrected at the receiver with an equalizing filter B282 in FIG. 54 that follows the frequency demodulator. Since the noise spectrum at the output of the frequency demodulator in the receiver rolls off steeply with decreasing frequency, the equalizing filter B282 in FIG. 54 causes no significant degradation of receiver sensitivity.

In one embodiment of the present invention, the leader pattern generated by the leader pattern generation block E110 is kept relatively short. Having a short leader pattern will help to conserve transmitter power and extend battery life of the transmitter. A rapid signal detection and acquisition process used by the receiver enables the use of a short leader pattern.

The transmitter leader must be long enough for the receiver to successfully acquire the message. If the receiver has a priori knowledge of the transmitter frequency, the acquisition will only require the leader length to be as long as the worst case delay in the detection process. In one embodiment of the present invention, the FM receiver may operate in high SNR conditions and require a leader being only one or two symbols in length. The receiver of the present invention implements averagers and filters with group delay, which require the leader have a length of between 16 and 32 symbols to achieve optimal sensitivity. In yet another embodiment, where the transmitters are frequency agile and the receiver must scan multiple frequencies to search for the transmission, the leader must be lengthened to provide time for the receiver to acquire the signal. Depending on the number of frequencies being monitored, the leader can grow to up to 60 to 100 symbols in length.

Figure 37:
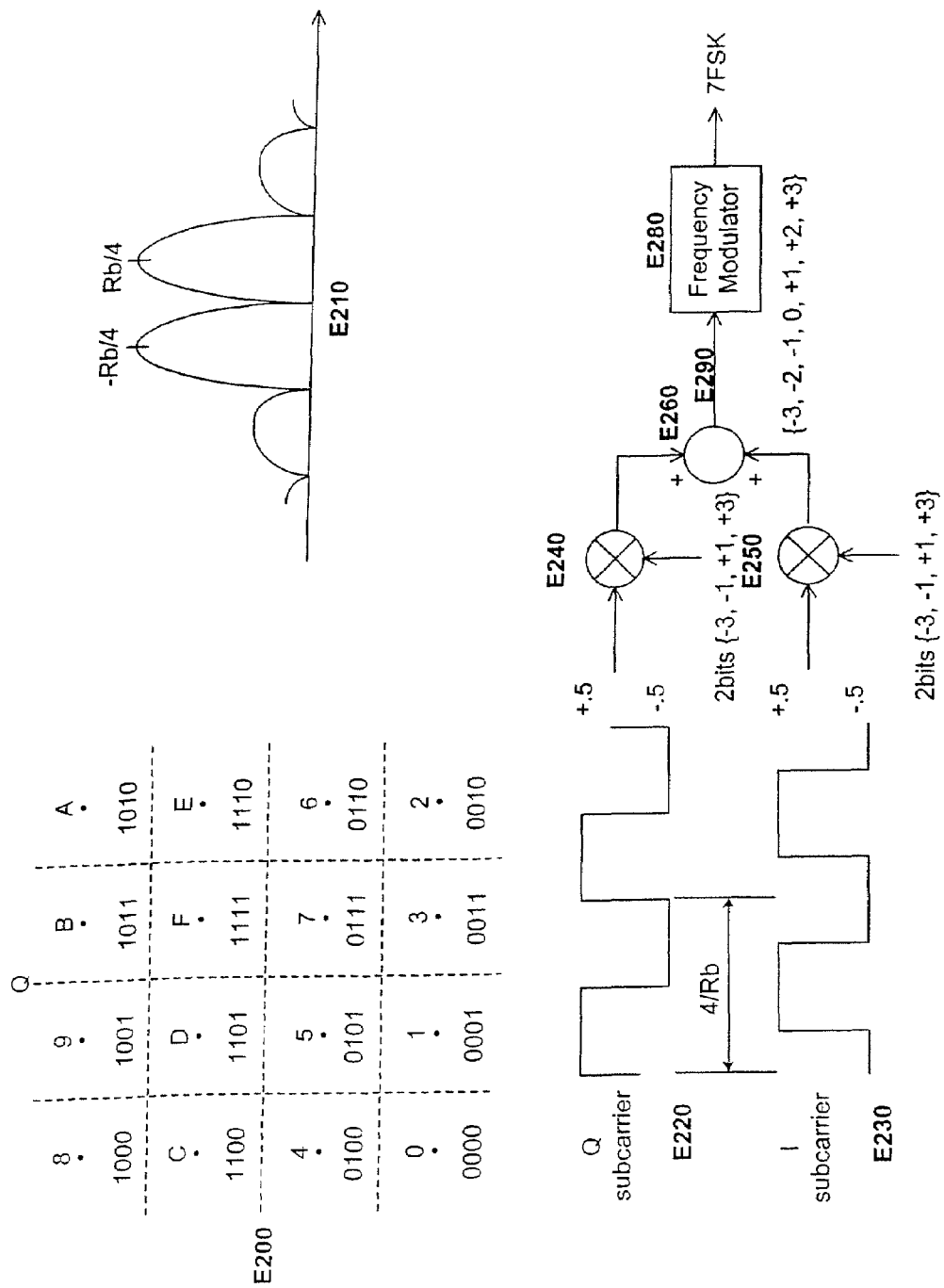
FIG. 37 illustrates 16QAM submodulator constellation and frequency-domain representation.

FIG. 37 illustrates a novel approach to encoding a message bit stream according to one embodiment of the present invention. This approach removes the DC response and low frequency spectral components while preserving the bit rate. The encoder shown in FIG. 37 corresponds to the modulating symbol waveform generator block E140 in FIG. 36. As shown in FIG. 37, the encoder is a 16QAM submodulator. Four bits are encoded into each symbol as shown in the QAM constellation E200. Accordingly, the resulting symbol rate is ¼ the bit rate. The QAM submodulator uses a conventional QAM modulator with Walsh carrier basis functions E220, E230, and has a carrier frequency equal to the symbol rate. QAM modulators are known to those of ordinary skill in the digital communications art and are described in Rappaport, T. S., "Wireless Communications: Principles and Practice," ISBN 0-13-375536-3, Prentice Hall, 1996, the entire contents of which is incorporated herein by reference.

According to the present invention, the output of the 16QAM submodulator (i.e., encoder) is a 7FSK modulating waveform E290. The 7FSK modulating waveform is made up of a sequence of 4 bit symbols. Each of the 4 bits of a symbol corresponds to 1 of 7 frequencies of the frequency modulator E280. The frequency modulator E280 will send the frequency corresponding to each bit of the symbol for a 1 bit period. 7FSK has the same bandwidth efficiency E210 and power efficiency as 4FSK if the peak deviation of both 7FSK and 4FSK is the same. The 7FSK symbol waveforms can be implemented as entries of a look-up table addressable by the 4 bits defining a particular symbol. Accordingly, the 16QAM encoder may be implemented with very low cost logic (e.g., a general purpose microcomputer).

In one embodiment of the present invention, the corresponding receiver uses an incoherent frequency demodulator. The use of an incoherent frequency demodulator causes a 3 dB sensitivity loss to be incurred as compared to using a coherent demodulator. In one embodiment of the present invention, the peak deviation of the 7FSK is increased by a factor of 1.5 times the peak deviation of a coherent 4FSK. This increase in peak deviation increases the sensitivity of the corresponding receiver by 3.5 dB. Expanding the peak deviation will also increase the RF signal bandwidth by a factor of 32/25, which is an acceptable tradeoff for the transmitter of the present invention. Accordingly, the incoherent receiver of the present invention can achieve a bit error rate (BER) approximating a BER of a coherent system.

PWM Synthesizer

Figure 38:
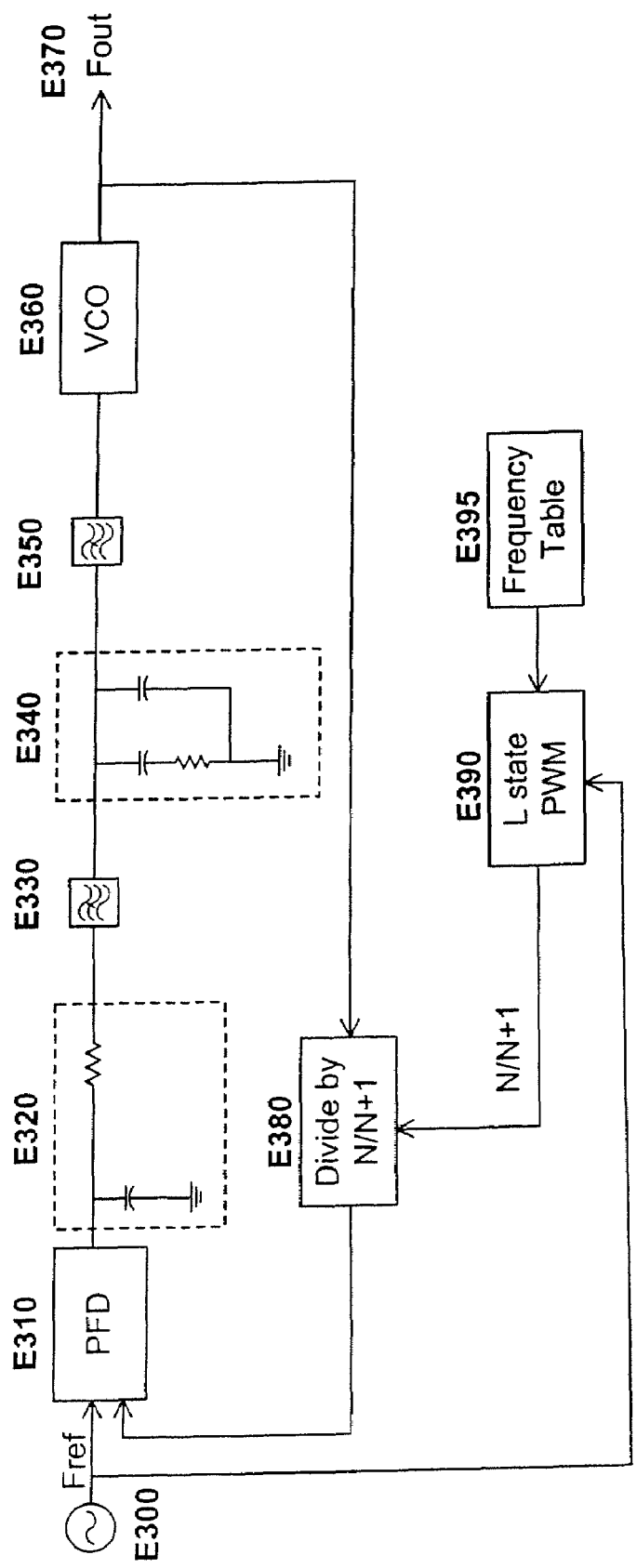
FIG. 38 illustrates a fractional-N phase locked frequency synthesizer with PWM divider modulus control.

FIG. 38 illustrates a fractional-N phase locked loop (PLL) frequency synthesizer. As shown in FIG. 38, the frequency synthesizer includes an input reference frequency $F_{ref}$ E300, a phase frequency detector E310 (PFD), two loop filters E320, E340, a voltage controlled oscillator (VCO) E360, a dual-modulus divider E380 and digital logic E390 to control the dual-modulus divider E380. The synthesizer produces an output frequency $F_{out}$ E370. Conventional frequency synthesizers implement the digital logic E390 with counter logic devices. Fractional-N phase locked loop frequency synthesizers are know to those of ordinary skill in the digital communications art, and are described in Rohde, U. et al., "Communications Receivers: Principles and Design," Second Edition, ISBN 0-07-053608-2, McGraw-Hill, 1997, the entire contents of which is incorporated herein by reference.

In one embodiment of the present invention, the digital logic E390 is implemented as a pulse width modulator (PWM) to control the dual-modulus divider E380. The output frequency of this synthesizer is $F_{out}=F_{ref}(N+FREQ/L)$ where N is the divider modulus, FREQ is a binary number setting the output frequency and L is the number of states in the PWM. Pulse width modulators are well known in the art, therefore, detail is not provided herein. Pulse width modulators are readily available, and inexpensive components.

In one embodiment of the transmitter, N=64, L=68, and FREQ ranges from 0 to 68 decimal and is retrieved from a table of stored operating frequencies E395. In this embodiment, the PWM is a component of a general purpose microcomputer. To obtain adequate spurious response levels from the synthesizer, notch filters E330, E350 are added to the PLL loop filters E320, E340. Filters E320, E330, E340 and E350 may be arranged in any order to accomplish the same result. In this embodiment, the notch frequency of filter E330 is twice the PWM frequency, and the notch frequency of filter E350 is equal to PWM frequency. In order to minimize cost, notch filters E330 and E350 are implemented as RC twin-T filters. To maintain PLL stability, notch filter E350 is an active filter having a higher Q than the passive RC twin-T filter E330. The PLL filtering techniques and notch filter design techniques described above are well known in the art; therefore, detail is not provided herein.

Theta-r Trip and Signal Acquisition Algorithm

Figure 39:
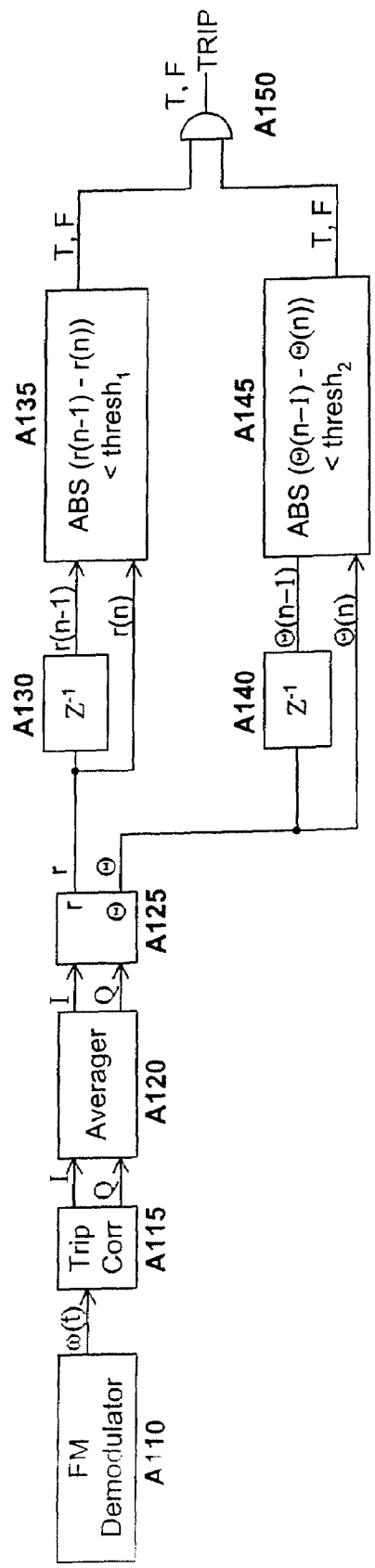
FIG. 39 illustrates basic r theta trip algorithm.

FIG. 39 illustrates one embodiment of a signal acquisition algorithm of a receiver for acquiring a signal transmitted using the M-ary FSK modulation with QAM submodulation described above. As shown in FIG. 39, a FM demodulator block A110 translates a received time domain signal into a modulation domain signal. A QAM Trip Correlator A115 receives the modulation domain signal and generates I and Q data signals that are input to an averager A120 to produce averaged I and Q data signals. The averaged I and Q data signals are input to a Cartesian-to-Polar converter A125 to generate r (magnitude) and Θ (angle) values. The magnitude term is proportional to the frequency deviation, the angle term is the relative symbol phase of the transmitter with respect to the receiver.

At each symbol time n (i.e., n=0, 1, 2, ...), the magnitude value r(n) is passed to a delay element A130, to produce a 'previous' magnitude value r(n−1) for the next symbol. A proximity detector (i.e., a comparator) A135 compares the absolute value of the difference between signals r(n) and r(n−1) to a predetermined threshold value. If the absolute value of the difference between r(n) and r(n−1) is less than the predetermined threshold value, the comparator generates a TRUE (i.e., '1') value at the output of A135. If the absolute value of the difference between r(n) and r(n−1) is greater than the predetermined threshold value, the comparator generates a FALSE i.e., '0') value at the output of A135.

At each symbol time n (i.e., n=0, 1, 2, ...), the Θ value Θ(n) is passed to a delay element A140, to produce a 'previous' Θ value Θ(n−1) for the next symbol. A proximity detector (i.e., a comparator) A145 compares the absolute value of the difference between signals Θ(n) and Θ(n−1) to a predetermined threshold value. If the absolute value of the difference between Θ(n) and Θ(n−1) is less than the predetermined threshold value, the comparator generates a TRUE (i.e., '1') value for the output of A145. If the absolute value of the difference between Θ(n) and Θ(n−1) is greater than the predetermined threshold value, the comparator generates a FALSE (i.e., '0') value for the output of A145.

The outputs of the two proximity detectors A135, A145 are provided to an AND block A150. The trip algorithm is satisfied if both inputs to the AND block A150 are TRUE. If a value of the output of either proximity detector A135, A145 is FALSE, the trip condition is not met, and the receiver will continue its trip algorithm processing, searching for a valid received signal.

The trip algorithm according to this embodiment of the present invention makes use of a transmitter leader. In this approach, a known, fixed symbol pattern is transmitted for at least the acquisition time of the receiver. Since the symbol rate of the receiver matches the symbol rate of the desired transmitter, and the transmitter repeats the same symbol pattern as the leader of each transmission, the receiver can expect to observe the same relative angle and magnitude over subsequent symbols of the leader, and thereby acquire the signal.

Figure 40:
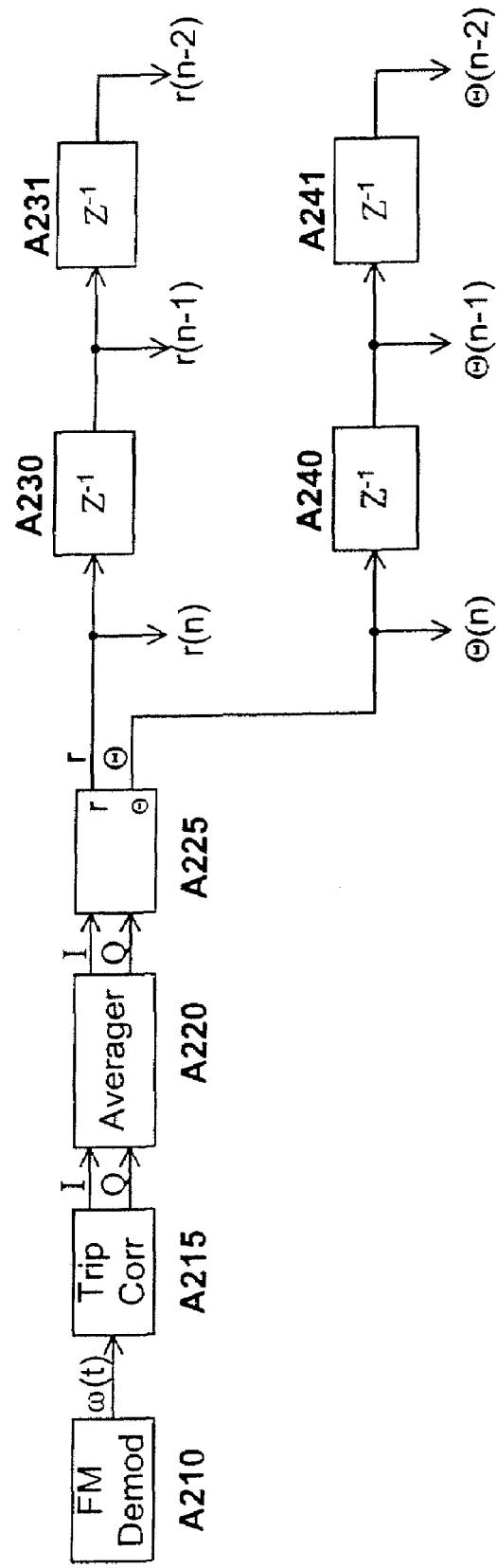
FIG. 40 illustrates additional delay elements for r theta trip algorithm.

FIGS. 40 through 46 illustrate another embodiments of a trip algorithm according to the present invention. In FIG. 40, blocks A210, A215, A220, and A225 duplicate the functions performed by blocks A110, A115, A120, and A125 shown in FIG. 39, respectively.

As shown in FIG. 40, additional delay elements are added such that at each symbol time n (i.e., n=0, 1, 2, ...), the r value r(n) is passed to a first delay element A230, to produce a 'previous' r value r(n−1) for the next symbol, the r(n−1) is then passed to a second delay element A231 to produce a 'twice delayed' r value r(n−2). Similarly, the Θ value theta(n) is passed to a first delay element A240, to produce a 'previous' Θ value Θ(n−1) for the next symbol, the Θ(n−1) is then passed to a second delay element A231 to produce a 'twice delayed' Θ value Θ(n−2).

Figure 43:
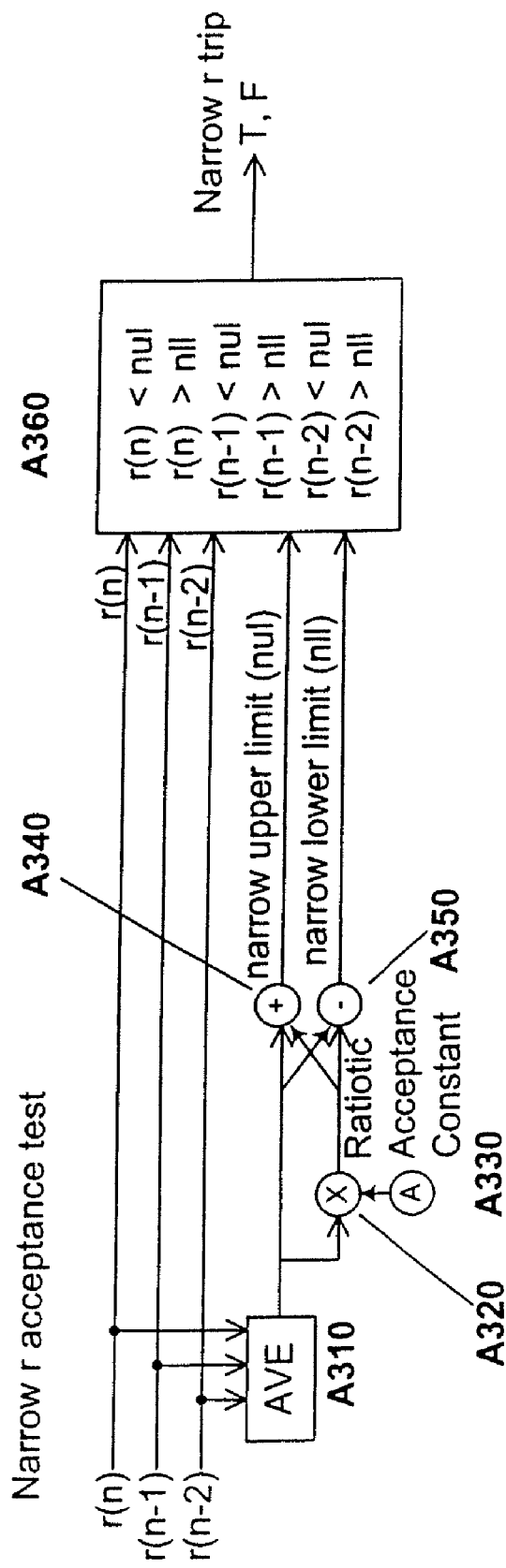
FIG. 43 illustrates narrow r acceptance test.

FIG. 43 illustrates the generation of a 'narrow magnitude trip' signal according to one embodiment of the present invention. As shown in FIG. 43, the three input signals r(n), r(n−1), and r(n−2) correspond to the signals created by the delay elements in FIG. 40, discussed above. These three signals are input into averaging block A310 to produce an average magnitude value. A ratiotic acceptance constant A330 is multiplied by a multiplier A320 with the average magnitude value from the averaging block A310 to produce a limit differential. The limit differential is summed with the average magnitude value in a summer A340 to produce a Narrow Upper Limit (NUL) signal. A difference between the limit differential and the average magnitude value is determined by a difference block A350 to produce a Narrow Lower Limit (NLL) signal. A comparator block A360 compares the input signals r(n), r(n−1), and r(n−2) with the NUL and NLL signals. If the values of the three input signals r(n), r(n−1), and r(n−2) are all between the NUL and NLL values, then the value of the 'narrow magnitude trip' signal is TRUE (i.e., '1'). If any of the signals r(n), r(n−1), and r(n−2) is not between NUL and NLL, then the value of the 'narrow magnitude trip' signal is FALSE (i.e., '0').

Figure 44:
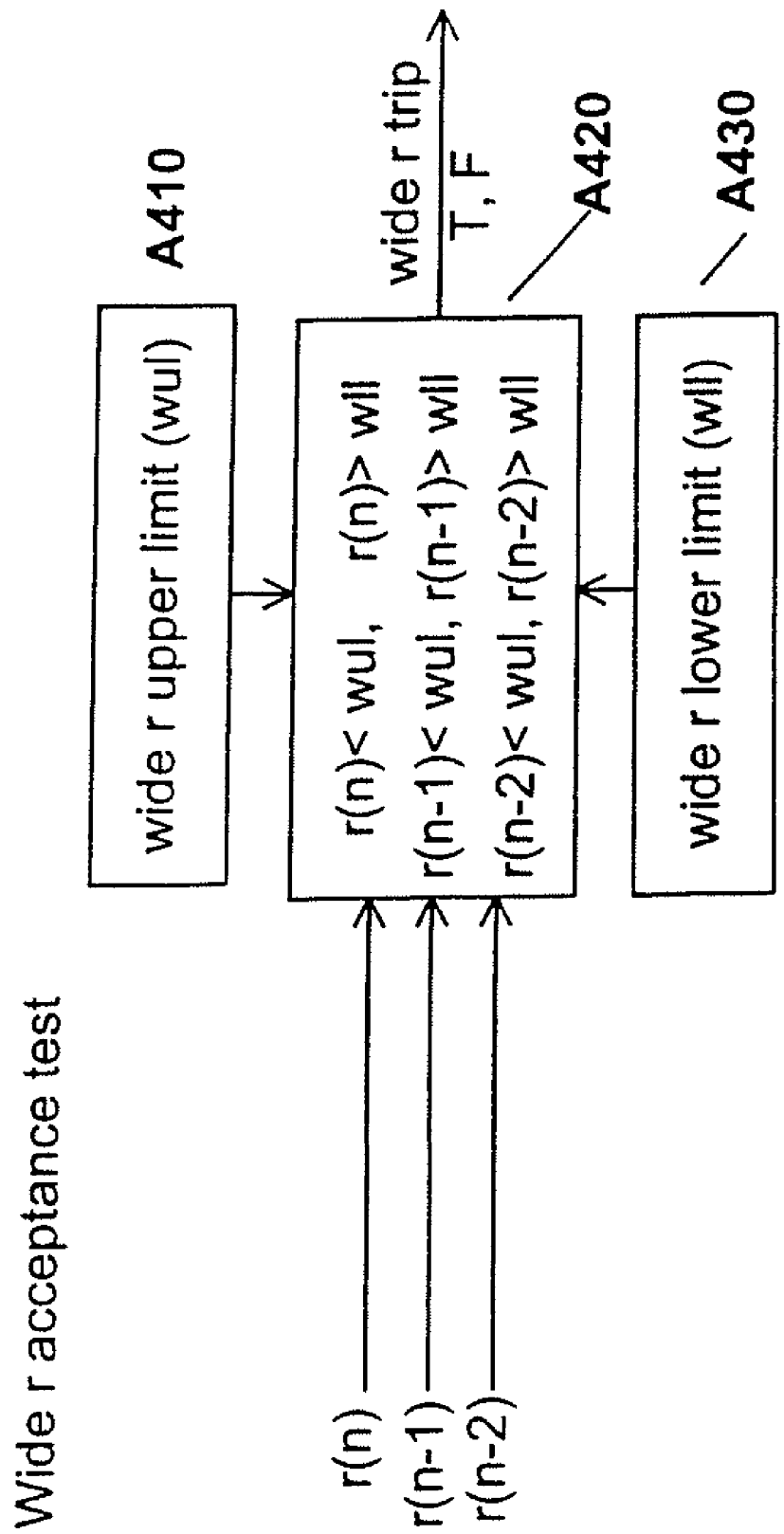
FIG. 44 illustrates wide r acceptance test.

FIG. 44 illustrates the generation of a 'wide magnitude trip' signal according to one embodiment of the present invention. As shown in FIG. 44, the three input signals r(n), r(n−1), and r(n−2) correspond to the signals created by the delay elements in FIG. 40, discussed above. A Wide Upper Limit (WUL) value is stored in block A410, and a Wide Lower Limit (WLL) value is stored in block A430. A comparator block A420 compares the three input signals r(n), r(n−1), and r(n−2) with the WUL and the WLL values. If the values of the three signals r(n), r(n−1), and r(n−2) are all between the WUL and WLL values, the value of the 'wide magnitude trip' signal is TRUE (i.e., '1'). If any of the signals r(n), r(n−1), and r(n−2) are not between WUL and WLL, the value of the 'wide magnitude trip' signal will be FALSE (i.e., '0').

Figure 45:
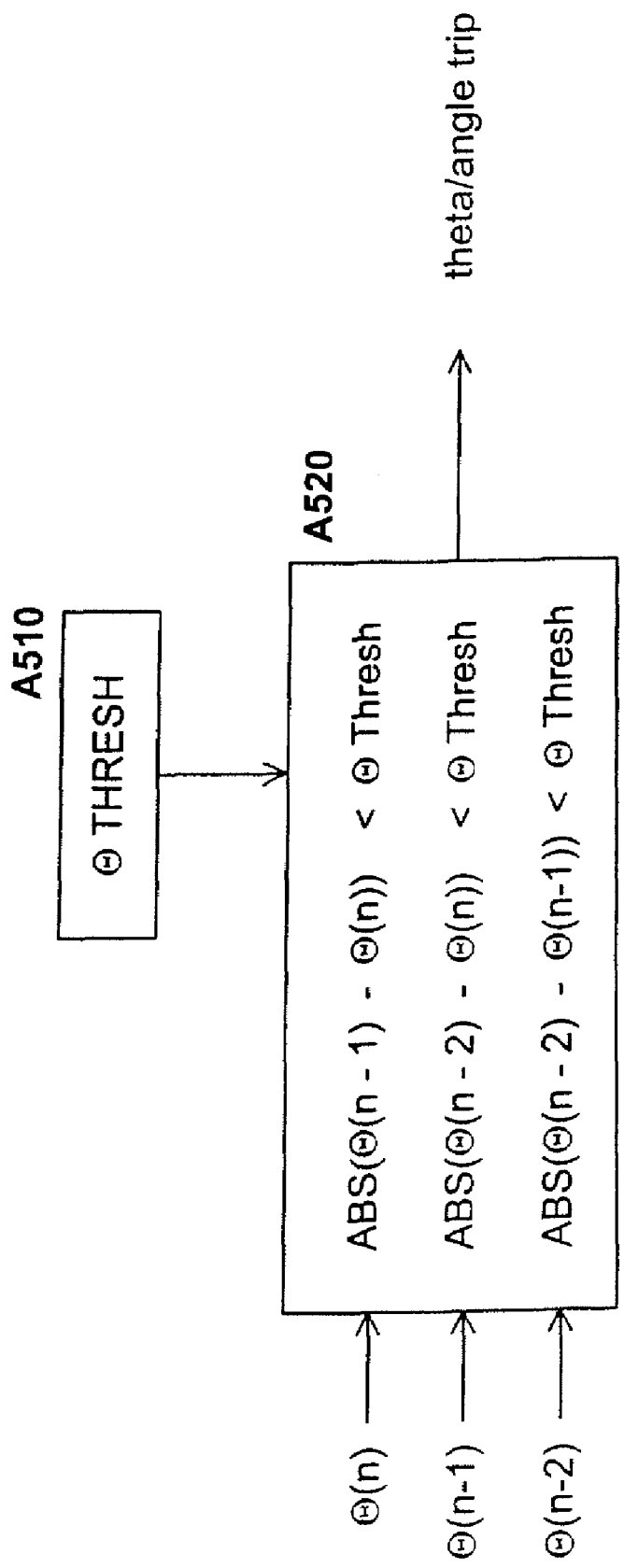
FIG. 45 illustrates theta/angle acceptance test.

FIG. 45 illustrates the generation of a 'theta/angle trip' signal according to one embodiment of the present invention. As shown in FIG. 45, the three input signals Θ(n), Θ(n−1), and Θ(n−2) correspond to the signals created by the delay elements in FIG. 40, discussed above. A Θ threshold value is stored in block A510. Block A520 determines an absolute value of the difference between (1) Θ(n−1) and Θ(n); (2) Θ(n−2), and Θ(n); and (3) Θ(n−2), and Θ(n−1). Block A520 compares each of these differences with the Θ threshold. If the absolute values of the differences calculated by Block A520 are all less than the Θ threshold value, the value of the 'theta/angle trip' signal is TRUE (i.e., '1'). If any of the absolute values of the differences calculated by Block A520 are not less than the Θ threshold value, the value of the 'theta/angle trip' signal will be FALSE (i.e., '0').

Figure 46:
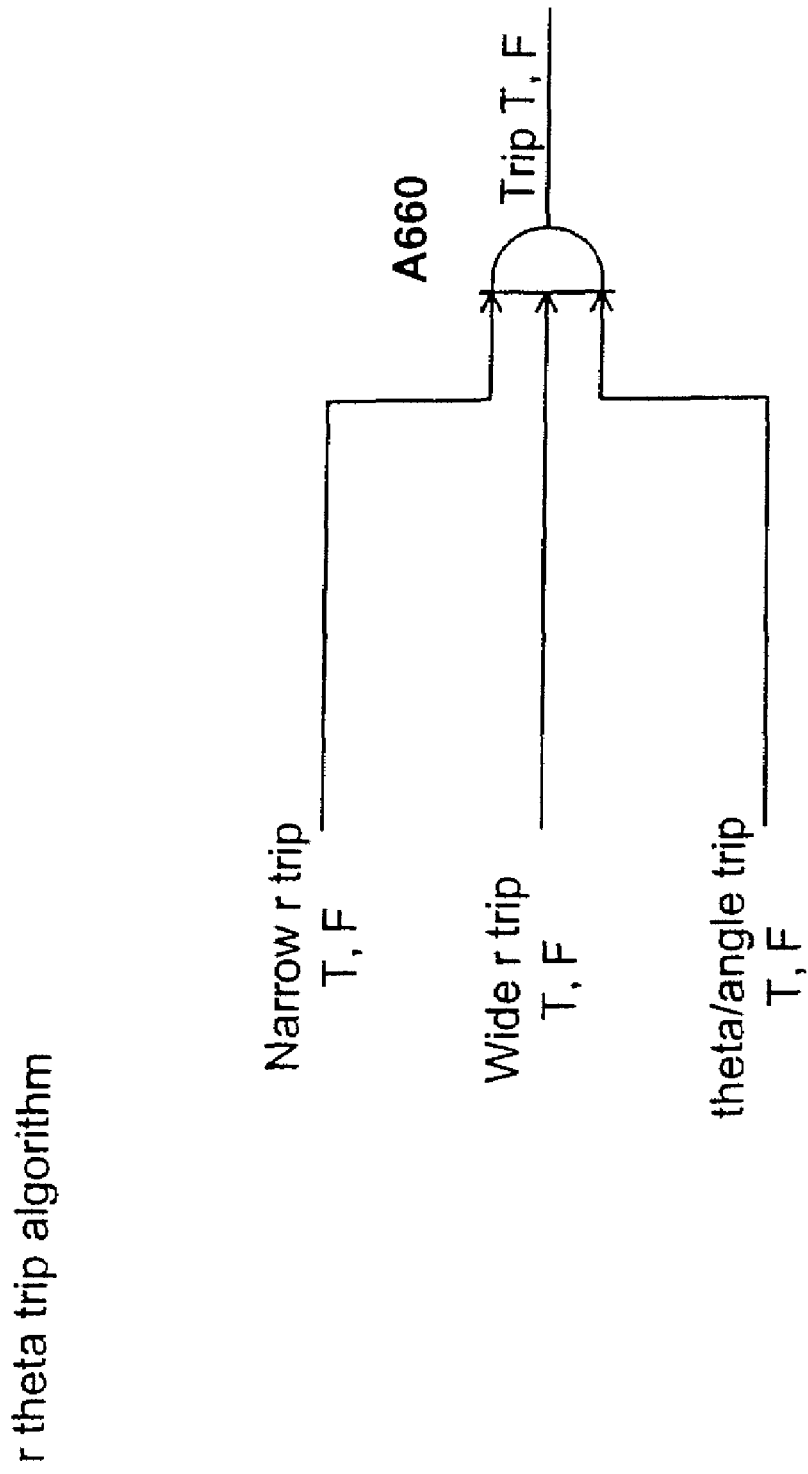
FIG. 46 illustrates r theta trip determination.

FIG. 46 illustrates the generation of a combined signal acquisition (trip) signal according to one embodiment of the present invention. As shown in FIG. 46, the 'narrow magnitude trip' input signal corresponds to a narrow magnitude trip signal described above in the context of FIG. 43, the 'wide magnitude trip' input signal corresponds to a wide magnitude trip signal described above in the context of FIG. 44, and the 'theta/angle trip' input signal correspond to a theta/angle trip signal described above in the context of FIG. 45. As shown in FIG. 46, the three input signals are input to an AND block A660. If the values of all three inputs signals, are TRUE (i.e., '1'), the AND block A660 will produce a TRUE (i.e., '1') value for the combined trip signal indicating a successful signal acquisition. If the values of any of the three inputs is FALSE (i.e., '0'), the AND block A560 will produce a FALSE (i.e., '0') value for the combined trip signal indicating that a signal has not been successfully acquired and a search for a valid received signal will continue.

Each transmitted message includes a fixed symbol as part of the leader portion of the message. Since the fixed symbol causes no inter-symbol distortion, the receiver may use a trip correlator with a rectangular (unity) windowing function to maximize the correlation sum. The resulting trip correlation function therefore achieves maximum sensitivity at the algorithmic point in time when it is most desirable (i.e., signal acquisition).

Figure 41:
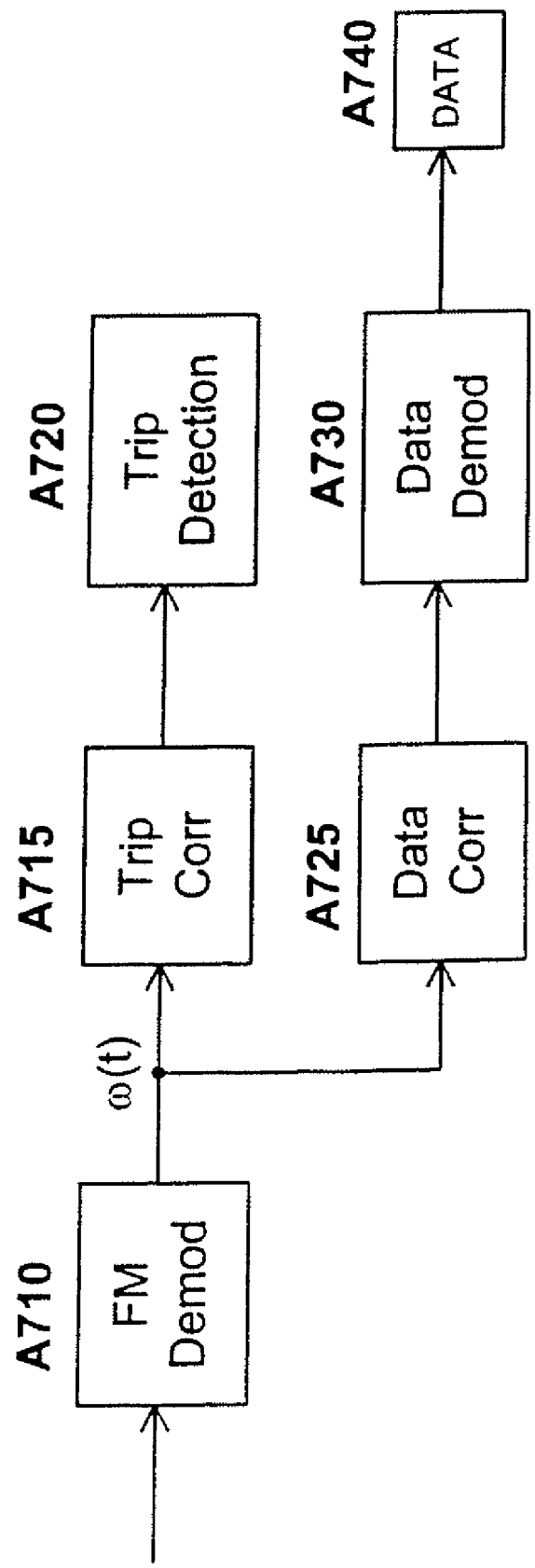
FIG. 41 illustrates a "dual mode" QAM correlator.

Following trip, a second correlation function is used for data demodulation. The data demodulation correlators use an alternate windowing function to minimally impact sensitivity while providing some protection to inter-symbol modulation distortion. In one embodiment of the present invention, this "dual-mode" QAM correlation is used to maximize acquisition sensitivity while still providing inter-symbol interference protection FIG. 41 illustrates a dual-mode correlator according to one embodiment of the present invention. As shown in FIG. 41, the trip correlator A715 receives the modulation domain signal of the FM detector A710 and produces an output used by the trip detection A720 algorithm of the system. A separate data correlator A725 also receives the modulation domain signal of the FM detector A710 and produces an output used by the data demodulator A730. The QAM trip correlator A715 continues to receive the modulation domain signal until a trip is detected in block A720. Once a trip event is detected, the data correlator A725 receives the modulation domain signal and delivers the modulation domain signal to the data demodulator block A730. Neither the QAM trip correlator nor the data demodulation QAM correlator have a DC (i.e., no error frequency component) response. This has the very desirable benefit of completely removing the mean from the modulation domain signal (which relates to system frequency offset error) which alleviates the need for a mean removal function in subsequent processing.

Correlator DC Removal for Frequency Error Tolerance

Figure 42:
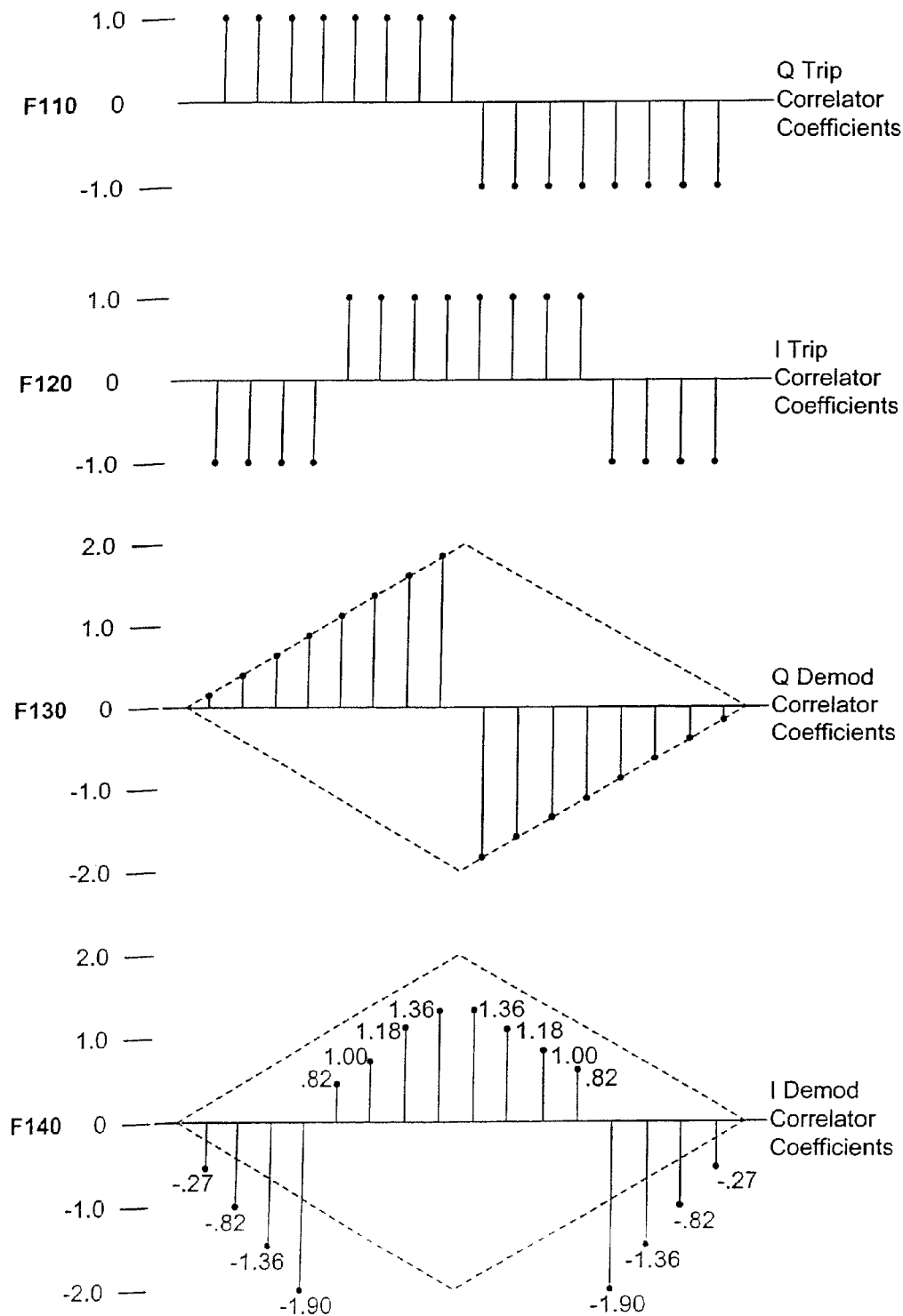
FIG. 42 illustrates coefficients for a "dual mode" QAM correlator.

FIG. 42 illustrates the coefficients used in the trip QAM correlator and the data decision QAM correlator for completely removing all DC response while demodulating the QAM symbol constellation.

In one embodiment of the present invention a computationally efficient method is used in an incoherent FM receiver that tolerates frequency error between a transmitter and a receiver. The method includes two elements. The first element is a frequency detector that is linear over the range of twice the peak signal deviation plus twice the peak frequency error. This frequency detector is described elsewhere in this disclosure. The second element follows the frequency detector. It is a QAM sub-demodulator that does not respond to DC. The QAM sub-demodulator first stage consists of in-phase (I) and quadrature-phase (Q) correlators.

Conventional QAM optimum correlators are used in the signal detection and signal acquisition method of the receiver. The coefficients of these correlators are illustrated in FIG. 42 as I F120 and Q F110. These correlators have no response to DC because the coefficients sum to zero. Modified QAM correlators are used in the signal demodulation method of the receiver. The coefficients of these correlators are illustrated in FIG. 42 as I F140 and Q F130. These correlators also have no response to DC because the coefficients sum to zero. The corresponding transmitter filters the modulating symbol waveforms to constrain the transmitted signal spectrum to satisfy channel bandwidth requirements. This introduces intersymbol interference with standard QAM optimum correlators. The triangle taper eliminates the intersymbol interference at a minor sensitivity expense.

In one embodiment of the present invention, the corresponding transmitter sends a constant symbol leader. Therefore, there is no intersymbol interference on the leader. In this embodiment, conventional QAM optimum correlators are used in the signal detection and signal acquisition method of the receiver.

Of course, it is possible to use a single correlator to simplify construction with the associated loss of sensitivity in trip. Many of the diagrams of this disclosure show a QAM correlator that can be either a single correlator or the dual-mode correlator of the present invention.

The QAM trip correlator A215 shown in FIG. 40 represents one exemplary embodiment of the trip algorithm according to the present invention. The averager block A220 averages the trip correlator outputs over 16 successive symbols producing smoothed data which is input to the Cartesian-to-polar converter A225. Extending the averager beyond 16 will improve sensitivity, but for the purposes of the present invention, a length of 16 was sufficient to achieve the necessary system bit error rate (BER).

In one embodiment of the present invention the comparison time interval is extended to 3 successive symbols from the simple model discussed above. Additional delay elements can be added to enhance false trip rejection at a cost of time to trip, but the system of the present invention uses two delay elements to balance trip sensitivity with data demodulation sensitivity. Although the system of FIG. 40 implements a two-tap delay line, any number of additional delay elements can be added. Delay blocks A230 and A231 form a two-tap delay line that yields two older magnitudes. The output of A225, r(n), is the input to delay element A230. The output of A230, r(n−1), is the input of delay element A231. The output of A231 is r(n−2). Also, blocks A240 and A241 form a two-tap delay line that yields two older angles, Θ(n−1) and Θ(n−2). The output magnitude and angle terms are fed as inputs into FIGS. 43, 44, 45 and 46, which are continuations of the trip algorithm.

Figure 47:
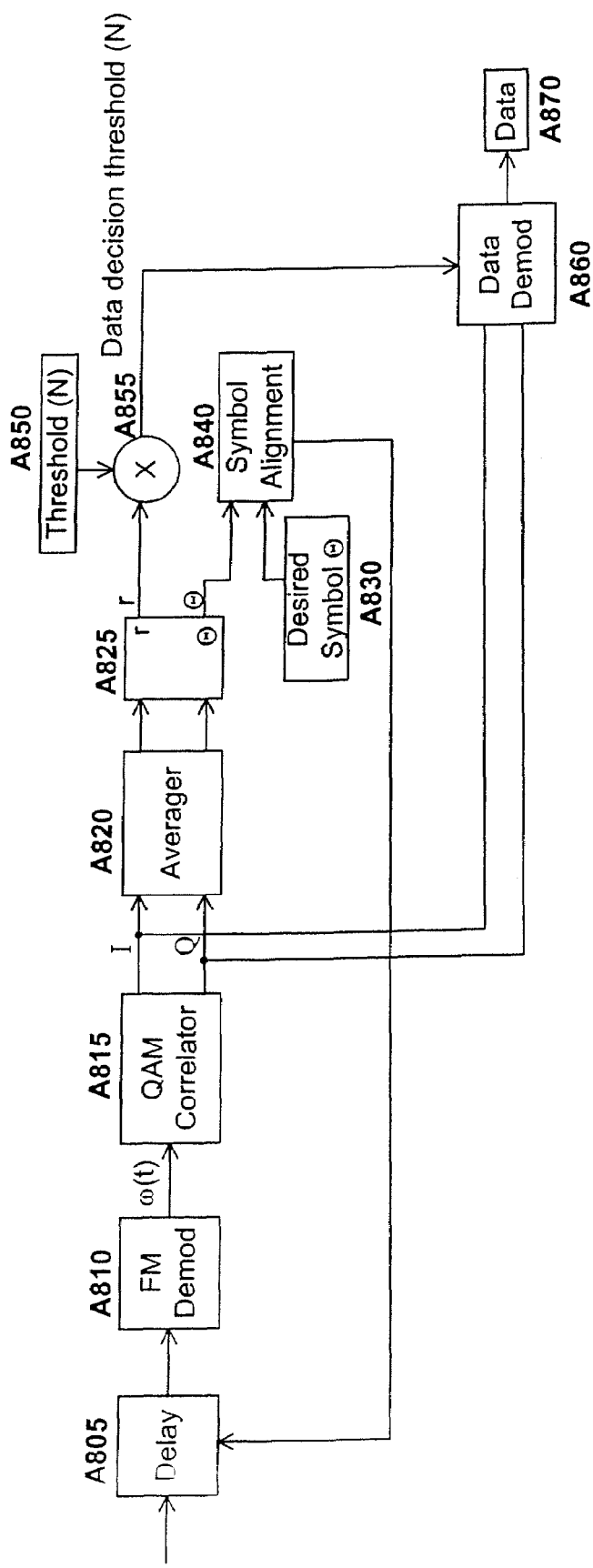
FIG. 47 is a block diagram of a system for signal acquisition and demodulation.

Once the receive trip condition has been satisfied, the receiver performs an alignment step to synchronize the receiver to transmit symbol frame. FIG. 47 illustrates the synchronization step of the signal acquisition algorithm according to one embodiment of the present invention. As shown in FIG. 47, a delay element A805 controls the [time/phase] delay of a received time domain signal. Location of this delay in the signal thread is unimportant but must be far enough upstream of decimation to allow for fine resolution time steps sufficient to achieve symbol alignment. In one embodiment of the present invention this delay is located at the digitizer sample rate and achieves a maximum symbol alignment error of 1.77 degrees. The delay A805 is shown in this diagram prior to FM demodulation A810 to simplify the diagram.

The FM demodulator block A810 translates the time domain signal into a modulation domain signal. A QAM Correlator A815 receives the modulation domain signal and generates I and Q data signals that are input to an averager A820 to produce averaged I and Q data signals. Note that the QAM Correlator A815 in this embodiment of the present invention employs the principles of the dual-mode correlator previously discussed. During the acquisition portion of the algorithm (including the synchronization steps that follow), the trip correlators are used. The averaged I and Q data signals are input into a Cartesian-to-Polar converter A825 to generate r (magnitude) and Θ (angle) values.

The transmitted signal contains a leader portion with a known repeating pattern of symbols. The leader symbol of the transmitter being received by the receiver will produce a constant Θ value from block A825. This value is the error (or difference) of the desired signal with respect to the random initial phase of the receiver correlator. Since the receiver knows the desired angle associated with the leader symbol, a correction can be made by adjusting a phase delay element A805. The adjustment is made by comparing the received Θ term during the leader against a stored desired symbol Θ A830. Symbol alignment A840 compares the stored value (Θ) A830 with the detected angle value (Θ) A825. The difference between the detected angle value A825 and the desired angle value A830 can be translated to a radian shift term for use in the delay element A805 to synchronize the incoming signal into the FM demodulator A810. The synchronization occurs only once upon valid signal detection delineating acquisition and data demodulation.

The initial data decision threshold values are also calculated during the leader and prior to data demodulation. The calculated magnitude (r) A825 is used to set the data decision threshold values. Once trip has been determined, the calculated r A825 is multiplied at a multiplier A855 by a threshold array A850 to create an array of data decision thresholds that is used by the data demodulator A860. The array of decision thresholds A850 is predetermined based on the QAM spatial separation created by the frequency tone separation of the FSK signal. In one embodiment of the present invention a 7 level FSK signal is coupled to a 16QAM correlator to create a uniform constellation of 16 symbols, each symbol encoding 4 bits of data.

FIG. 48 illustrates the derivation of the threshold array constants used in one embodiment of the present invention. The symbol allocated for use as the leader symbol has the largest magnitude possible in the constellation. In one embodiment of the present invention the "A" symbol is used. The constellation space is uniformly distributed such that each point is 2 units of magnitude separated from its nearest neighbor A1010. A ratiotic set of threshold values is created using the received "A" symbol magnitude represented by the vector from the origin of the IQ plane to symbol "A." A single data decision threshold array can be applied to either the I projection of the symbol vector or the Q projection due to uniform placement of the constellation space. It can be seen in the constellation of A1010 that the ideal slicer value for separation of symbol A to symbol F or B as projected on the I axis would be 2 (equidistant from the I axis intercept). One embodiment of the present invention dynamically calculates the "2" scaled to the actual received A symbol magnitude.

An ideal symbol A would have a magnitude of 3*SQRT(2) with an ideal slicer value of 2. A constant scaling factor of SQRT(2)/3 is held in storage and applied to the measured magnitude of the leader symbol A, the product of which produces the slicer value for differentiating the rightmost symbols of the constellation (A, E, 6 and 2) from the right-center constellation points (B, F, 7 and 3). Also, due to uniform constellation space, the left-half plane slicer values are created by negating the right-half plane values which were calculated (i.e., the constellation is symmetrical about both the I and Q axis). Also, the center slicer values remain at zero due to the DC mean removal in the correlators.

The imaginary slicer values are identical to the real values, also due to the uniform constellation as shown in A1020 and A1030 of FIG. 48. Changes in transmitter frequency deviation are translated to symbol magnitude deviations that are compensated for by this algorithm. Accordingly, fundamentally low cost transmitters with imprecise frequency deviation control may be used.

The process described above can be extended to larger QAM constellations to create different threshold arrays.

Returning to FIG. 47, the threshold array is implemented as a either a lookup table or constant values to ratiotically create a data slicer array. The product term A855 uses the received magnitude of the trip symbol to set the slicer array values. Uncertain deviation inherent in the transmitted signal is therefore compensated for by the ratiotic treatment of the decision slicer values. This enables fundamentally low cost methods for control of the frequency deviation on transmitters.

Once the data slicer array terms are calculated from the product A855, and the symbol alignment term has achieved synchronization in A805, the receiver transitions from acquire mode to data demodulate mode. An appropriate time delay prior to data interpretation is necessary to accommodate filter settling. This time delay is dependent on filter implementation and known in the art and, therefore, not shown in the figures.

The dual-mode QAM correlators shift to the appropriate coefficients and the data demodulator A860 uses the array of data decision thresholds from A855 to translate I and Q data outputs from A815 to generate the symbol value A870.

Figure 49:
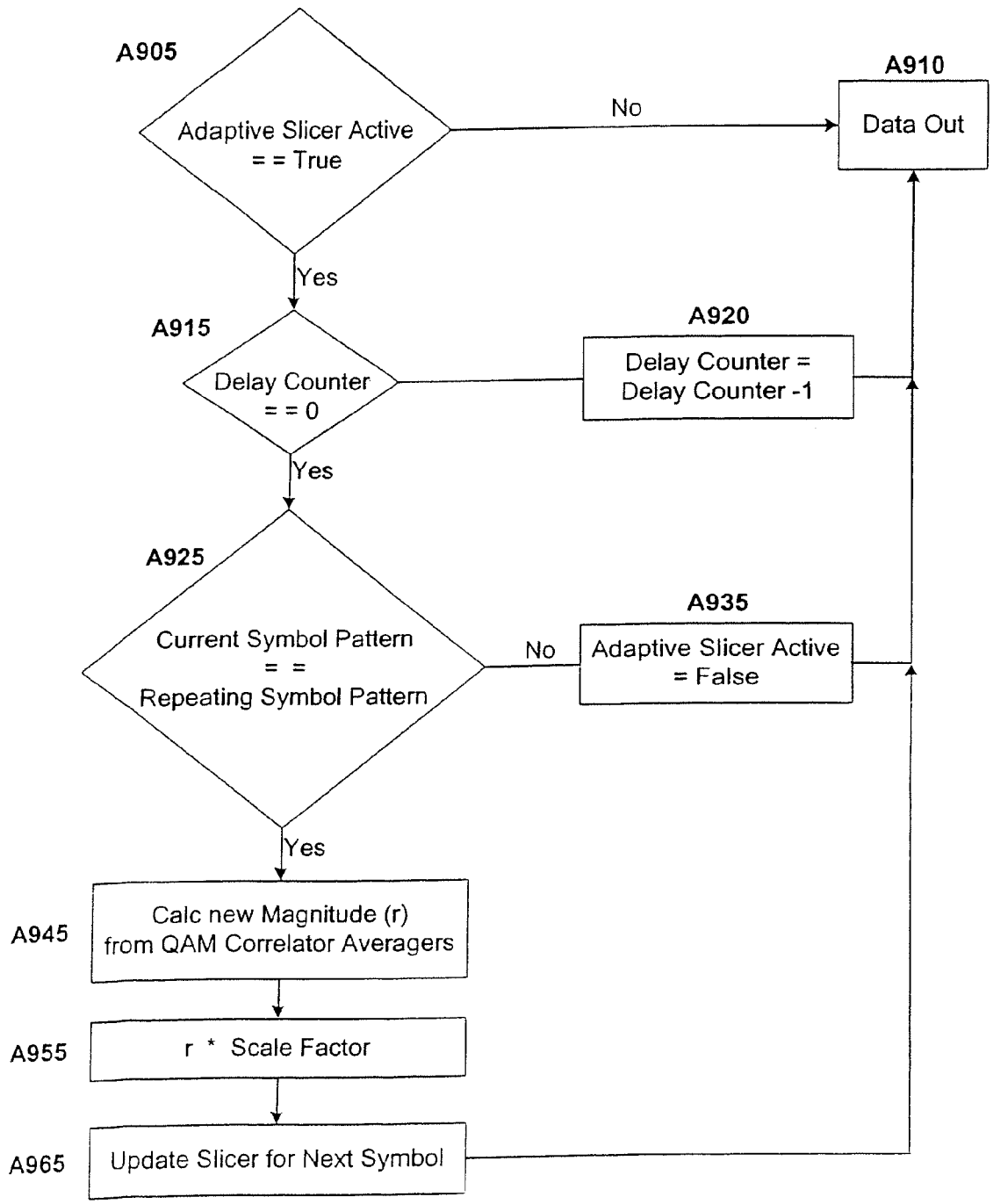
FIG. 49 illustrates adaptive slicer algorithm.

In one embodiment of the present invention, a decision feedback, adaptive algorithm is used for maintaining optimal data decision threshold (data slicer) values as shown in FIG. 49. The data decode process according to one embodiment of the present invention is improved by continually updating the data slicers nominated at signal detection (trip) throughout the message decode.

As shown in FIG. 49, the process begins at step A905 where it is determined if the adaptive slicer is enabled following the trip algorithm. If the adaptive slicer is not active (i.e., "No" at step A905), the decoded symbol is output at step A910 without upgrading the data decision threshold array (slicer values). If the adaptive slicer is active (i.e., "Yes" at step A905), the delay counter is tested at step A915. The delay counter has the function of holding off the adaptive function until such a time as the signal reaches steady state following trip and the associated synchronization. The delay shift of synchronization inserts a perturbation into the system that takes a time interval to settle out. The delay counter A920 holds off the adaptive slicer to perform this function.

Once the delay element has timed out (i.e., "Yes" at step A915), the adaptive slicer algorithm is enabled at step A925 where the symbol is calculated using the most recently calculated slicer value from initial trip or last symbol calculation. If the calculated symbol matches the "leader" symbol (i.e., "Yes" at step A925), the algorithm flow proceeds to step A945, which recalculates the appropriate slicer values based on the latest available magnitude values scaled by the threshold array at step A955 as disclosed previously in block A850 of FIG. 47. The process then proceeds to step A965 where the slicer values are stored and subsequently used during the next symbol data decode task. If the calculated symbol does not match the "leader" symbol (i.e., "No" at step A935), the receiver assumes the message portion of the received signal has begun and the adaptive algorithm terminates at step A935. The last calculated slicer values are used for the remaining symbols throughout the message.

In one embodiment of the present invention, the adaptive data slicer is implemented to compensate for low cost methods of deviation stability in the transmitter. If the transmitter deviation stability drifts over the duration of the leader, this algorithm effectively tracks out the slow drift component to improve BER for the message reception. In one embodiment of the present invention, the transmitters exhibit a deviation drift that stabilizes in the leader portion of the message. As such, the adaptive equalization algorithm discussed above are sufficient to set slicer values by the start of the data portion of the message.

Alternatively, if the deviation is continuously changing, the adaptive algorithm can be modified to continually adapt throughout the message reception. In this mode, the function performed at step A925 is replaced by a normalization function to scale the magnitude of the received symbol to that of the "leader" symbol prior to completing the function previously discussed. All symbols are processed at step A945 throughout the decoded message. All constellation points are used to create new decision thresholds for subsequent symbols.

The signal acquisition and adaptive slicer determination process discussed above can be used in all of the receiver architectures of the present invention. The detection algorithm can be enhanced to resolve even wider frequency uncertainty than the FM demodulator can accommodate by using a plurality of channel filters and voting mechanism for selecting an optimal data path as described below.

Multi-Channel Trip Technique

FIG. 50 illustrates a multi-channel trip algorithm according to one embodiment of the present invention. As shown in FIG. 50, algorithm begins with a channel filter bank D110. The channel filter bank D110 accepts sequential inputs in the time domain and produces a plurality of channelized output data corresponding to frequency. In one embodiment a windowed-FFT is utilized to accomplish this, but any band-limiting filter bank meeting the design criteria will suffice. The output of the channel filter bank D110 is provided to element D115 which performs a complex frequency downconversion to each channel output of the filter bank D110 from its respective center frequency to DC. The magnitude of each channel is then determined at element D120 (in another embodiment, magnitude squared may be used for ease of implementation in a DSP). Element D125 selects the index (channel number) of the channel having the largest magnitude as output from element D120. Element D130 averages two or more of the selected channel indices received from element D125 and averages then decimates providing for an output rate that is L times slower than the input rate. The averaged, selected channel indices are then rounded to the nearest channel index by element D135. This rounded channel index is used as an identifier to the channel containing the desired signal.

In one embodiment of the present invention, the probability of selecting the best channel for signal acquisition is increased by using the rounded channel index, as well as its two neighboring indices, to identify the channels selected for FM demodulation as seen in element D140. Element D145 is a FM demodulator used to transform the incoming frequency-domain channel data into the modulation domain. The leader portion of the transmitted signal contains a repetition of a symbol pattern. In the modulation domain, the mean of the frequency deviation of this repeated symbol pattern is equal to zero when centered perfectly in a channel. When the mean of the frequency deviation is not equal to zero in the modulation domain, then the frequency difference between the channel center frequency and the down-converted symbol center frequency is proportional to the mean of the frequency deviation. Elements D150 and D155 are used to average and decimate the modulation domain data by two or more. The output of element D155 is the mean of the frequency deviation corresponding to the selected input channels. The channel having a mean of the frequency deviation nearest to zero represents the channel which is centered in frequency closest to the down-converted symbol center frequency, thus, being the best channel for further signal acquisition as seen in elements D160 and D165.

It may be possible to increase the probability of selecting the best channel for signal acquisition, if the rounded channel index is chosen along with more than two neighboring channel indices to identify the channels selected for FM demodulation and subsequent processing as previously described. There is a point of diminishing return when the input bandwidth is less than the cumulative bandwidth of the channels selected minus the amount of frequency overlap of these channels.

Figure 51:
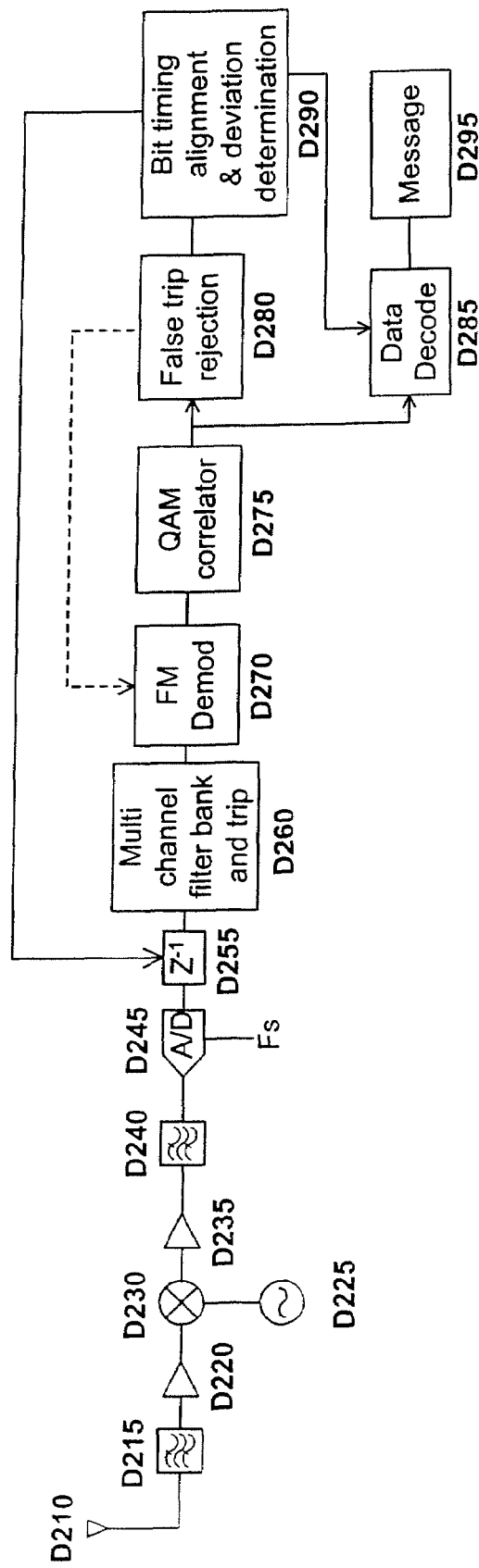
FIG. 51 is a block diagram illustrating a wide error frequency resolving receiver.

FIG. 51 shows a receiver incorporating the multi-channel trip according to one embodiment of the present invention. The function of this receiver is identical to that illustrated in FIG. 52 with the exceptions this receiver does not include elements B150 and B152, and this receiver replaces elements B160 and B165 with element D260.

The above-described frequency uncertainty method works in system applications where the sample frequency $F_s$ of the A/D D245, coupled with the anti-alias filter D240 bandwidth, can be used to pass an anticipated signal that has frequency uncertainty well outside the FM detector linear region. In many instances, it is desirable to use the receiver architecture to scan a much wider bandwidth than is economically feasible by increasing the sample rate and anti-alias bandwidth.

As the pass bandwidth of the system increases, the design requirements of the digitizer D245 also increase to preserve two-tone inter-modulation performance as is known in the art. One embodiment of the present invention dwells momentarily at a specific frequency and then slews the receiver local reference D225 to time division multiplex the system over a wider bandwidth.

Systems typically require that the transmitter leader be long enough in duration to allow for the receiver to sample all available frequencies in order to achieve synchronization and data demodulation. One embodiment of the present invention dwells on up to 4 such frequency passbands. Changes to transmitter leader length or acquisition time can change the ratio as required.

Figure 53:
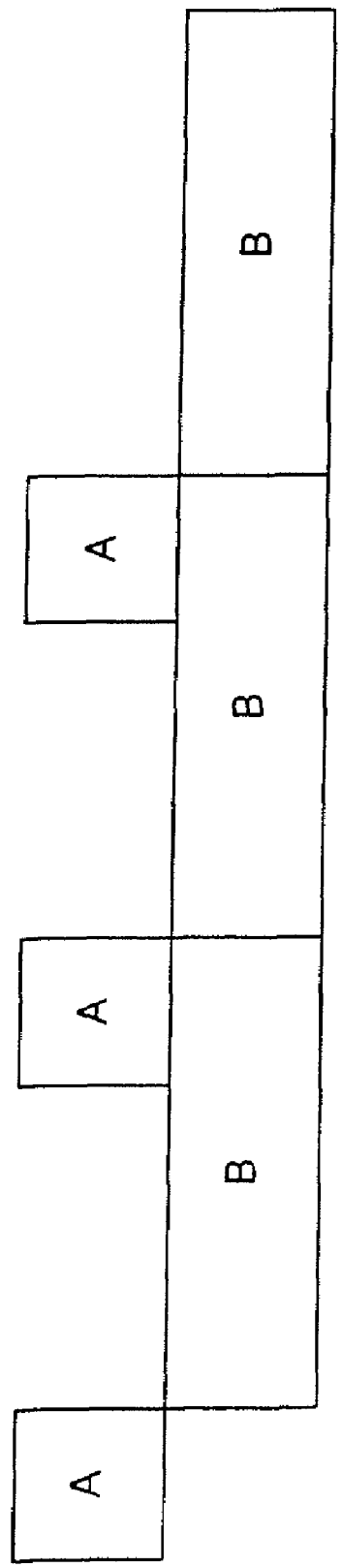
FIG. 53 is a multi-frequency pipelining diagram.

Efficient signal acquisition may provide for pipelined processing of data while slewing frequency as depicted in FIG. 53. The local reference, element D225, should be tasked to the next frequency and allowed to settle while processing the data collected at the present frequency.

A method for extending the frequency resolving range of the receiver is to tune the local reference, element D225. By stepping the local reference in frequency steps, the subsequent digitization, signal detection and signal acquisition may be performed at the bandwidth set by the IF filter D240, while maintaining the ability to search over a wider range than the IF filter bandwidth.

Multi-Channel Receiver

The receiver architecture of the present invention lends itself to multiple configurations described herein. Each configuration has application in different communication scenarios.

Figure 52:
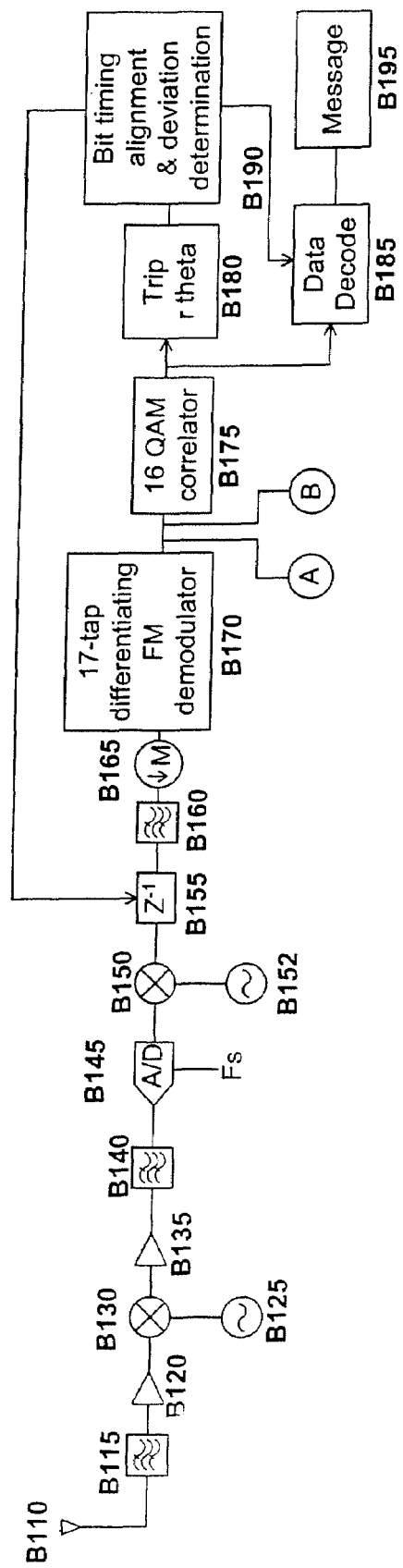
FIG. 52 illustrates a 7FSK/16QAM receiver with a "dual-mode" correlator.

FIG. 52 illustrates one embodiment of a receiver according to the present invention. In this embodiment, the receiver contains only the components necessary to receive the M-ary FSK signal as described above. FIG. 52 illustrates a receiver architecture that may detect and decode data from a compatible transmitter described above. As shown in FIG. 52, a typical heterodyne RF architecture is used to present the collected signal to a digitizer. Heterodyne downconversion techniques are well known in the art, and thus detail will not be provided herein Element B110 represents an antenna or group of antennas used to collect radio frequency (RF) energy for use in the receiver. The signal is band limited in element B115 prior to subsequent downconversion. The function of B115 is to remove the alias image produced by the heterodyne downconversion process. Filter element B115 must remove energy outside the passband of interest to avoid undesired mixing against the frequency reference.

Either high-side injection or low-side injection techniques can be used in the downconversion process. High-side injection is when the local reference B125 is higher in frequency than the desired signal to be received at antenna B110. Low-side injection is when the local reference B125 is lower in frequency than the desired signal to be received at antenna B110. In either case, the frequency separation between the local reference and the desired signal is equal to the desired IF center frequency.

Elements B120 and B135 represent distributed gain sufficient to establish noise floor and signal sensitivity. Implementation for gain is not described herein, as it is a well known practice in the art. Element B125 and Element B130 frequency downconvert the desired RF signal to an analog intermediate frequency (IF) whose output is filtered by element B140 prior to digitization in element B145. Filter element B140 must be sufficient to provide anti-alias protection in the digitizer B145, sufficiently rejecting images produced in the mixer B130 element caused by downconversion. The sample frequency applied to the digitizer B145 is chosen to enable the use of bandpass sampling techniques, thus creating a digitized IF as an output of the digitizer B145. Bandpass sampling and IF center frequency selection are both well known techniques in the art and not described herein.

The resulting digitized IF signal will have sufficient bandwidth to allow for the desired signal, plus all frequency errors due to relative reference uncertainty, to pass without distortion observing at least Nyquist bandwidths of the sampler. More specifically, the desired signal, including all tolerable system errors, is passed without aliasing. All signal degradation contributors must be managed including, but not limited to, unacceptable quantization or noise floor degradation due to noise aliasing.

Element B150 performs a final complex downconversion to center the desired passband digital IF signal at baseband using a complex downconversion input B152. Element B155 performs a time delay of the incoming digitized baseband samples. The time delay is adjusted by the receive algorithm following trip (signal acquisition) to achieve data symbol alignment (synchronization) to enable data demodulation.

Element B160 performs a channel filter function to noise limit the baseband digitized IF signal to match the maximum desired signal bandwidth including anticipated frequency uncertainty typically set by transmitter and receiver frequency reference errors. Typically, the sample rate of the digitized baseband IF signal is an order of magnitude higher than the desired passband IF signal to be subsequently applied to the FM demodulator B170. The output of the channel filter can be decimated by block B165 to a minimum of the Nyquist bandwidth of the signal plus frequency uncertainty to save computation in the FM demodulator B170.

The FM demodulator B170 can be any of several methods to translate the time domain sampled data into modulation domain referred to herein as a function of omega or notated as ω(n). Block B170 depicts a multi-tap differentiator similar in structure as that taught by Frerking, M. E., "Digital Signal Processing in Communication Systems," ISBN 0-442-01616-6, Kluwer Academic Publishers, Sixth Printing, 1994, pp. 249-257, the entire contents of which is incorporated herein by reference. One embodiment of the present invention implements a 17 tap differentiator which has several features that enhance system performance. First, an odd number of taps provides for a center tap to extract the undifferentiated, delayed data path used in the demodulator. Second, extending the differentiator provides for a wider linear region, thus allowing larger frequency error in the signal. One embodiment of the present invention ensures that the largest frequency error present in the signal creates less than 1 dB of compression in the FM demodulator due to non-linearities in the multi-tap demodulator.

The output of the FM demodulator B170 is passed to a QAM demodulator B175 which translates the modulation domain data into a quadrature constellation in I and Q (real and imaginary). The modulation domain signal contains a multi-level FSK with a DC offset that is proportional to system frequency error. The QAM demodulator removes the inherent DC offset that is present in the modulation domain signal. The techniques and advantages of the QAM correlator were discussed above.

The output of the QAM correlator B175 is processed by a trip algorithm B180 to detect and acquire the signal during the leader of the message using the r-theta trip algorithm discussed above. Block B190 determines proper symbol alignment timing and data decision threshold values based on detected frequency deviations of the signal during the leader portion of the received message. Outputs of block B190 drive the delay element B155 to achieve symbol synchronization and drives B185 to decode the QAM data resulting in data bits for message decode in block B195.

The system of FIG. 52 provides for a receiver that can detect and demodulate an ideal M-ary FSK/QAM transmitter. One embodiment of the present invention adds additional elements shown in FIG. 54 to compensate for the non-ideal elements present in the optimally cost advantageous transmitter previously defined. Equalizer EQ1 B281 is inserted between the FM demodulator B170 and the trip and acquisition QAM correlator B175. Equalizer EQ2 (B282) is inserted between the FM demodulator B170 and the data QAM correlator B175. Both equalizers compensate for distortions present in the transmitted signal due to cost saving techniques previously described herein. The equalizers each address specific non-linearities present in the received signal caused by low cost methods for creating the signal. The transmitter PLL time constant which is roughly equal to the FSK symbol rate conserves battery life but produces a bandpass modulation transfer function that steeply rolls off below the symbol rate resulting in impact to system sensitivity via intersymbol interference. The equalizer B282 compensates for the transmitter non-ideal elements recovering most of the signal degradation loss created by the cost saving measures in the transmitter.

Similarly, equalizer B281 compensates for the IIR frequency response produced in the transmitter due to cost saving techniques previously disclosed. Equalizer B281 compensates for the non-ideal elements that left alone would dramatically impact intersymbol interference and reduce system sensitivity. Both equalizers are unnecessary if the transmitter produces a signal without the non-ideal elements discussed.

Figure 55:
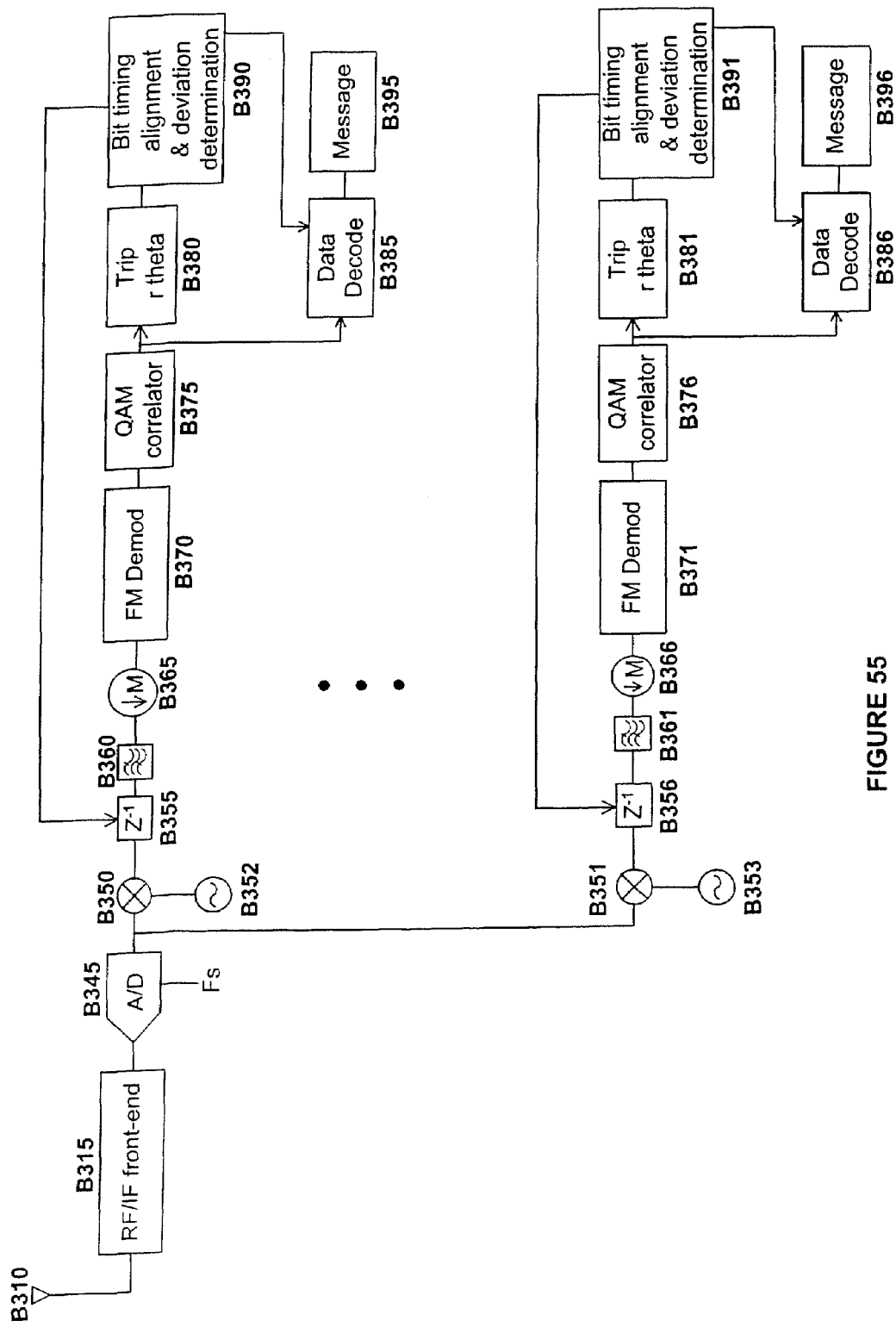
FIG. 55 illustrates a receiver architecture using a single RF front-end, single A/D and multiple channel demodulation.

In another embodiment of the present invention, this one slightly more complex, the receiver architecture can simultaneously process multiple signals by duplicating a portion of the receive thread. FIG. 55 illustrates a typical implementation for this embodiment of the present invention when implementing a base station style of receiver architecture capable of performing cellular or redundant cellular function.

FIG. 55 includes a simplified RF downconversion block B315 which includes all the components previously discussed in the context of FIG. 52 (B115, B120, B125, B130, B135, and B140). Block B315 can be any method for downconverting the signal from RF to IF as discussed in regard to FIG. 52 or otherwise. Figure elements B350, B352, B355, B360, B365, B370, B375, B380, B385, B390 and B395 form the same processing function as described in regard to FIG. 54. Similarly, the architecture presented in FIG. 55 contains at least one more signal processing thread (notated as B351, B353, B356, B361, B366, B371, B376, B381, B386, B391 and B396) denoting a separate demodulation capability. Together, the architecture provides the ability to simultaneously detect and demodulate at least two signals separated by at least the bandwidth of the signal of interest plus allowable frequency error.

Figure 56:
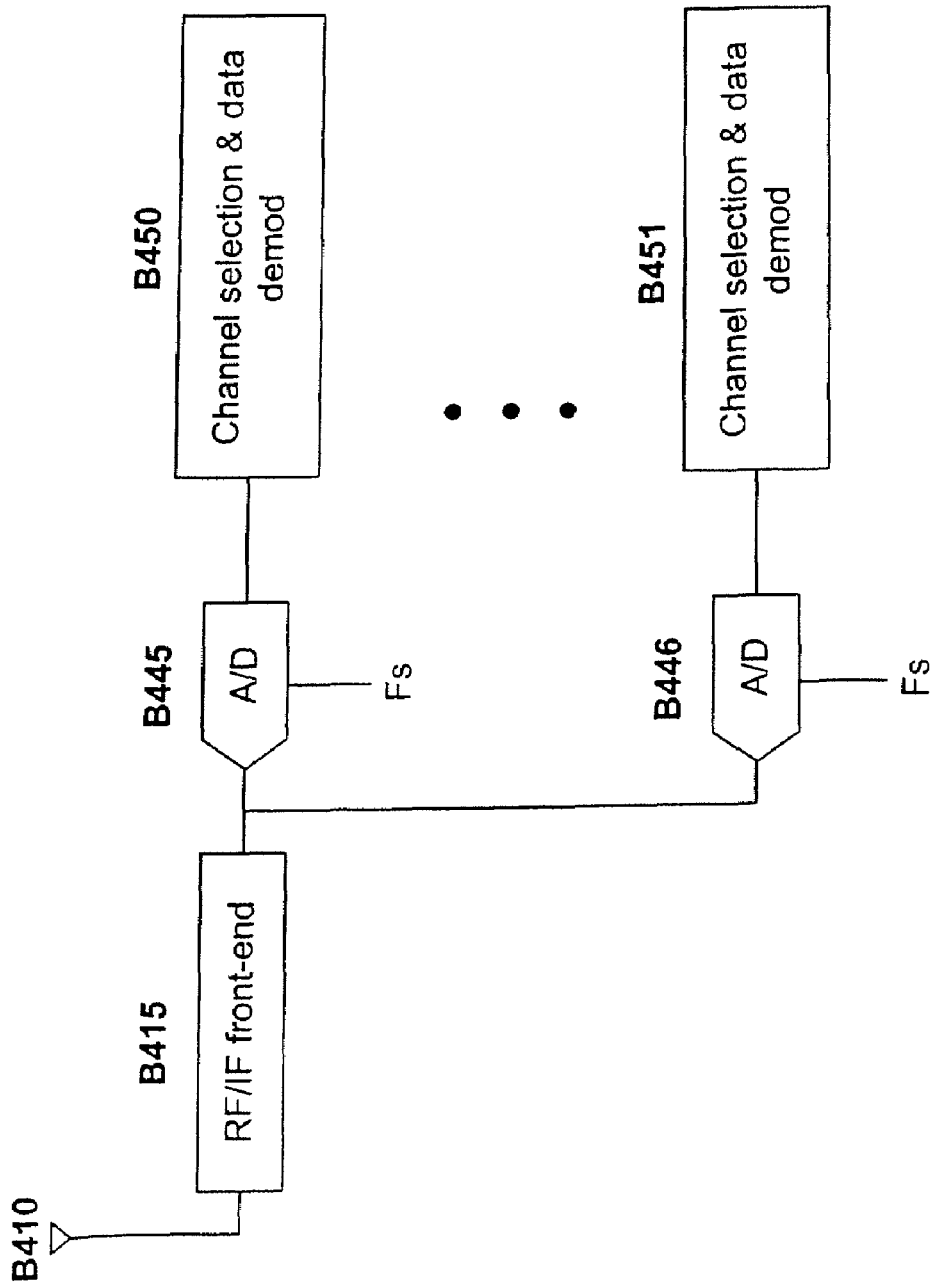
FIG. 56 illustrates a receiver architecture including a single RF front-end with multiple A/D and channel demodulation.

The number of simultaneously decodable channels is limited only by the Nyquist bandwidth of the digitizers and the processing capability to perform the bandlimiting channel filters of each processing thread. In some instances where the processing element includes a digitizing capability, or the proximity of the digitizer to the processing element is favorable, the digitizer may be duplicated per processing channel. FIG. 56 illustrates such an implementation. In this case, the processing element B415 performs a function similar to that of B315 described above. Digitizing elements B445 and B446 are tightly coupled to the processing thread B450 and B451 respectively which each perform the functions described in regard to FIG. 52, elements B150, B152, B155, B160, B165, B170, B175, B180, B185, B190, B195.

Architectures

Figure 57:
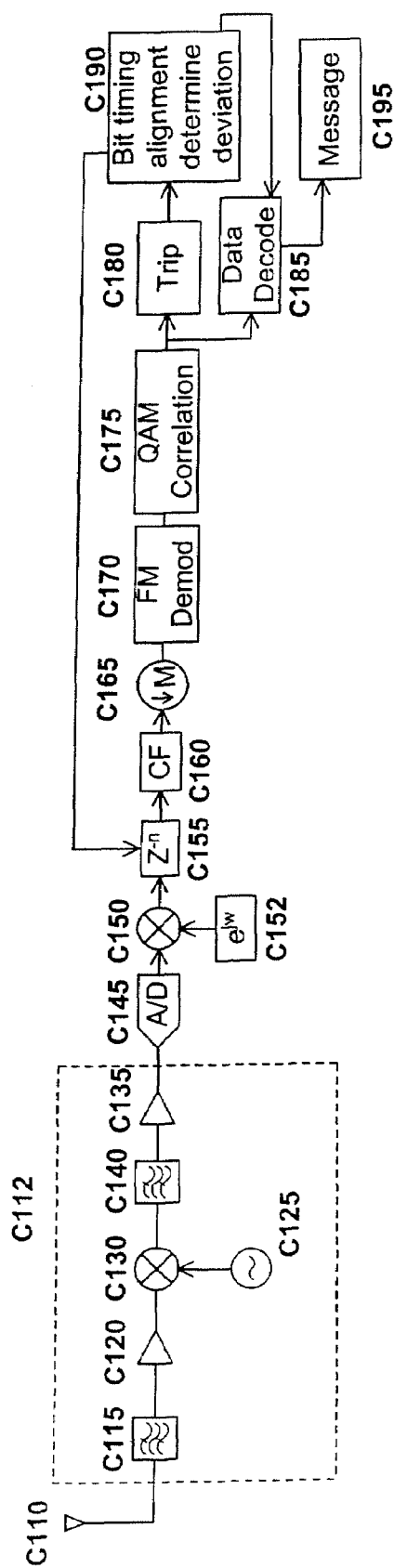
FIG. 57 illustrates a basic receiver block diagram.

FIG. 57 illustrates a minimum differentiated system that provides the receiver performance desirable as described earlier herein according to one embodiment of the present invention. Element C110 represents an antenna or group of antennas with the purpose of collecting RF energy for use in the receiver. Block 112 collects elements C115, C120, C125, C130, C135 and C140, which together form a heterodyne downconversion architecture with the purpose of frequency translating the signal at RF to an IF signal prior to digitizing the signal in element C145. The digitized IF spectrum from element C145 is further downconverted to baseband in mixer element C150 using the complex downconversion tone denoted by C152. This baseband downconversion tone is typically performed in hardware or firmware using digital signal processing techniques known in the art.

The resulting baseband digitized signal is presented to delay element C155 which will subsequently be used to achieve symbol alignment and synchronization. The delay element C155 presents the digitized baseband IF signal to channel filter C160 whose function is to noise limit the IF signal prior to FM demodulation in block C170. It is possible to perform a decimation step prior to FM demodulation if the sample rate is higher than necessary to satisfy the signal bandwidth plus frequency uncertainty. In this case, a decimation in time step is desirable as depicted in symbol C165. Preferably, the output effective sample rate from the decimation element is such that the Nyquist bandwidth of the signal stream perfectly matches the desired signal bandwidth plus maximum anticipated frequency uncertainty, such frequency uncertainty is set by errors in transmitter and receiver frequency references and any other temporal error to frequency caused by system design issues such as Doppler.

Figure 58:
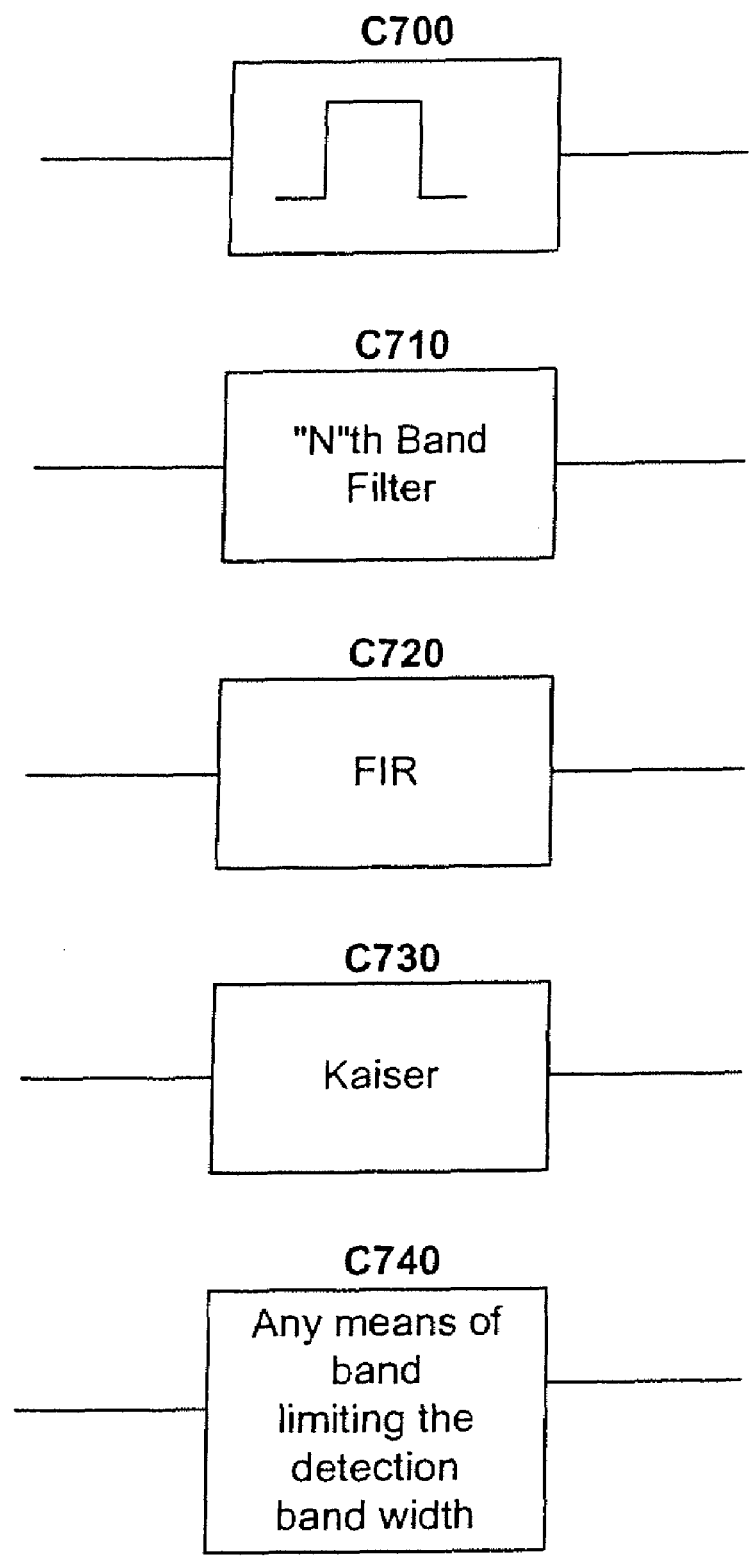
FIG. 58 illustrates channel filter options.

One embodiment of the present invention implements the channel filter C160 using cascaded Kaiser filters. FIG. 58 depicts a set of replacement filters for C160 including the Kaiser embodiment implementation C730. Any means of band limiting the signal prior to FM detection performs the same function, but care must be taken to ensure that passband group delay does not cause undesired compression in the modulation domain. For this reason, flat group delay filters are preferred when possible, such filters to include FIR and Sinc as examples. IIR filters or filters with wide group delay swings may be used as long as they are approximately linear in the frequency band where the desired signal will operate.

The FM demodulator block, C170, performs a classical FM discriminator function translating the time domain input signal to a modulation domain output. Such FM discriminators are known in the art and generically represented here. The resulting modulation domain signal is presented to a QAM correlator, C175, where the M-ary FSK modulation domain signal is translated into a QAM constellation. The resulting signal is now in complex (I, Q) space and can be translated into polar notation for subsequent processing as r, Θ by the symbol alignment (synchronization) and data decision threshold determination functions.

Signal acquisition is performed in block C180 using the outputs of the QAM correlator using the r theta trip algorithm previously described herein. Synchronization alignment terms and data decision thresholds are performed in block C190 following successful signal acquisition in block C180. Alignment terms are fed back to block C155. Data decision threshold terms are fed forward to the data decode block C185. Data is ultimately decoded in block C185 presenting the data for message creation in block C195.

Figure 59:
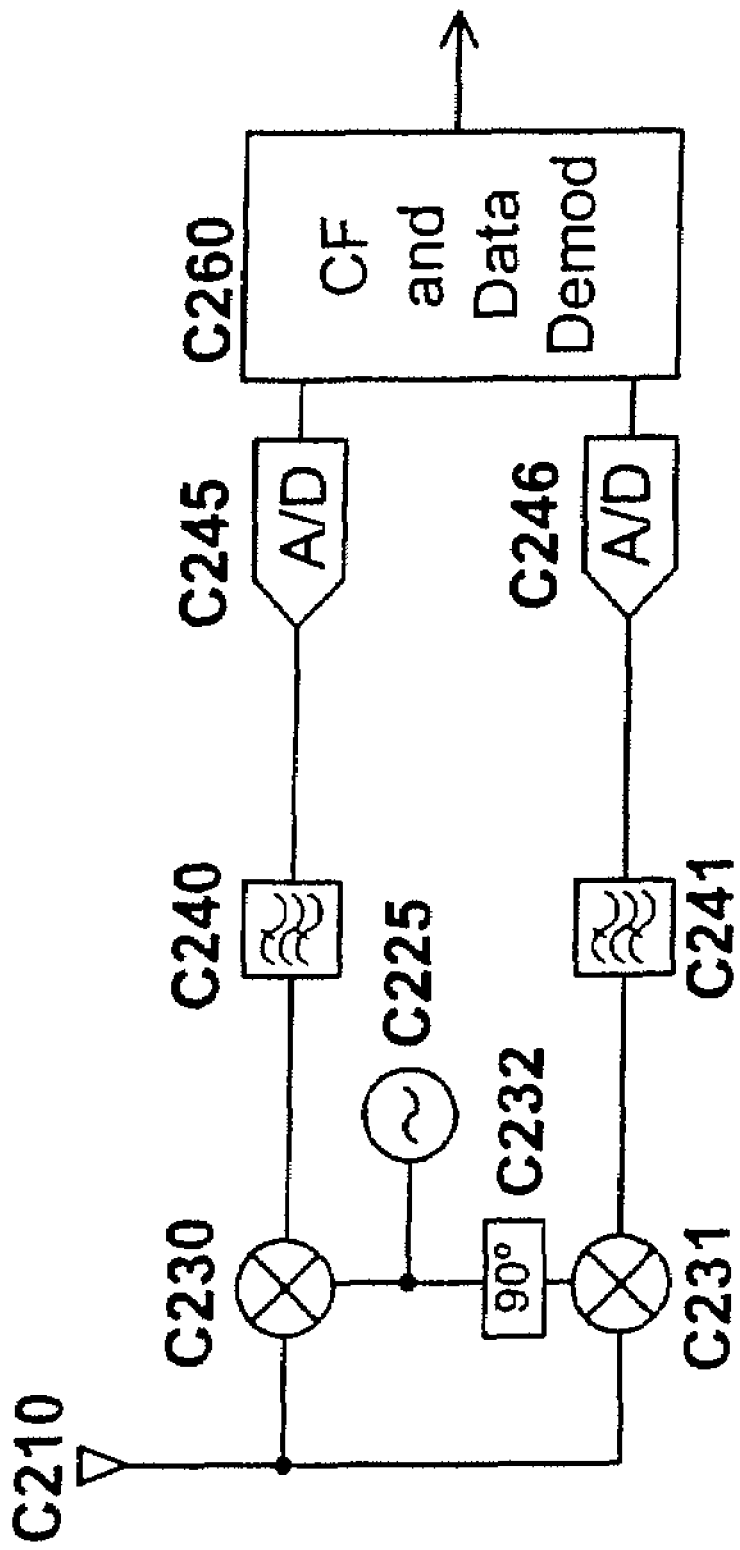
FIG. 59 illustrates the receiver of FIG. 57 with image rejecting analog downconversion.

In another embodiment of the present invention, the heterodyne downconversion C112 function of FIG. 57 may be performed using an image rejecting analog downconversion step illustrated in FIG. 59. An image rejecting architecture allows for direct downconversion from RF at antenna element C210 using a pair of mixers C230, C231 that use a reference frequency C225 shifted 90 degrees in phase C232 on one of the mixers. The quadrature downconversion produces a single image centered in the passband filters C240 and C241, which serve as anti-alias filters for the digitizing elements C245 and C246. The digitized complex IF signal is presented to the channel filter and data demod block C260 that performs the functions previously disclosed to demodulate the M-ary FSK/QAM signal structure.

Figure 60:
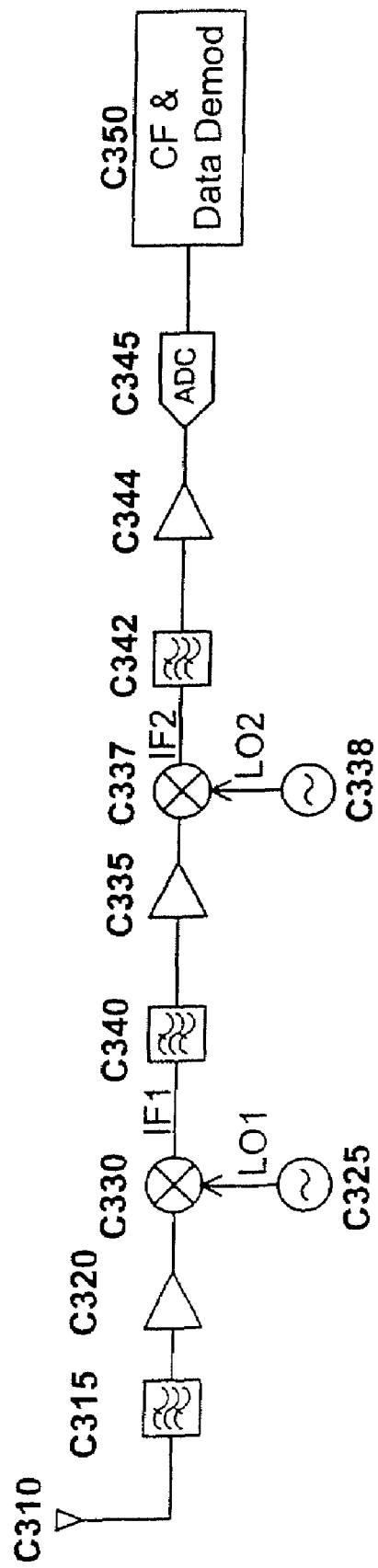
FIG. 60 illustrates a receiver using multiple downconversions.

In yet another embodiment, the heterodyne downconversion C112 can be replaced with a cascaded downconversion architecture using more than 1 mixer as shown in FIG. 60. FIG. 60 illustrates two downconversion stages but standard practice dictates that any number or stages could be employed paying special consideration to image frequencies produced to ensure signal quality is not degraded. The system illustrated in FIG. 60 shows the antenna C310 coupled to the first stage of the downconversion thread with the first heterodyne stage containing elements C315, C320, C330 and C325. The output of the first heterodyne stage feeds a second stage with elements C340, C335, C337, C338, C342 and C344. The resulting analog IF signal output is finally presented to digitizer C345 prior to processing by the channel filter and data demodulator block C350 which performs the functions previously disclosed to demodulate the M-ary FSK/QAM signal structure.

Another embodiment of the system shown in FIG. 57 uses a multi-tap FM demodulator instead of the generic FM demodulator block. Extending the time baseline in the demodulator and adding points can extend the frequency error processing of the system. The specific implementation for a multi-tap demodulator is known in the art and described in detail in Frerking as noted previously.

Figure 61:
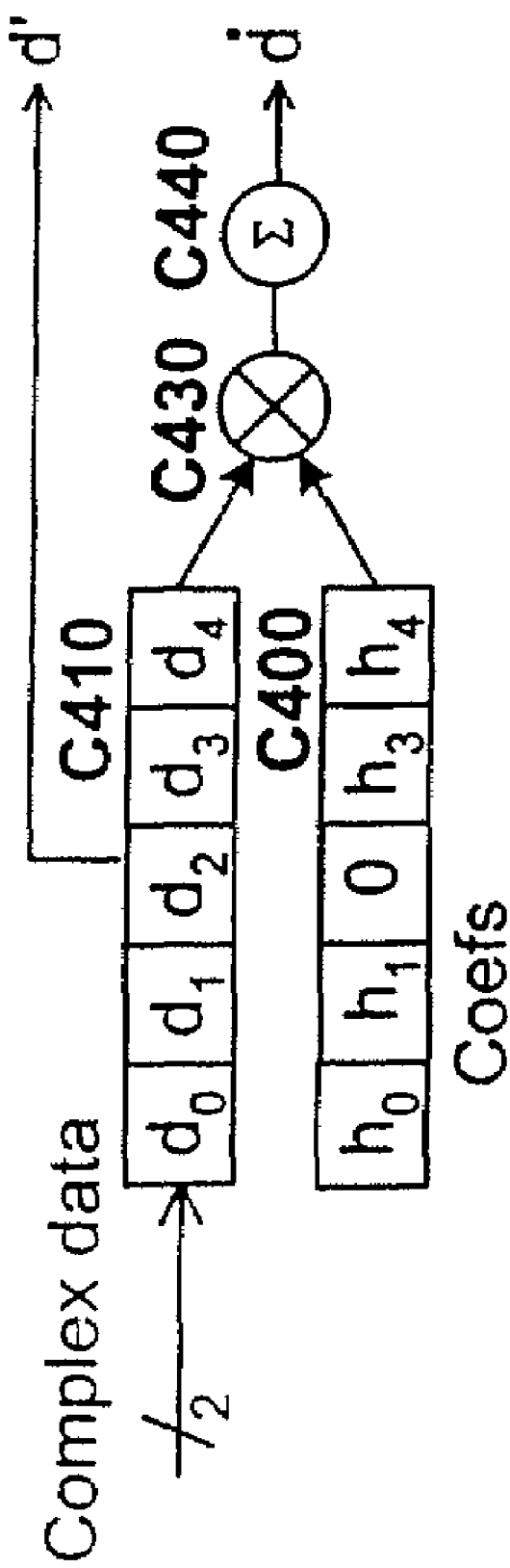
FIG. 61 illustrates a five-tap differentiator.

FIG. 61 illustrates a 5 tap differentiator style FM demodulator. Elements C410 and C420 depict the 5 tap delay lines, each holding complex data and coefficients accordingly. Data is transitioned through element C410 while coefficients are static in C420. The center coefficient holds a 0 value with a preferred length being odd. An odd length differentiator provides for uniform group delay between the product-summation (C430, C440) and the d' (d-prime) delayed path created from the center tap of the data delay path C410. The 5 tap differentiator is a specific implementation of a known technique that yields superior performance to a simple two tap model. Extending the taps provides one tactic for improving frequency uncertainty range.

Figure 62:
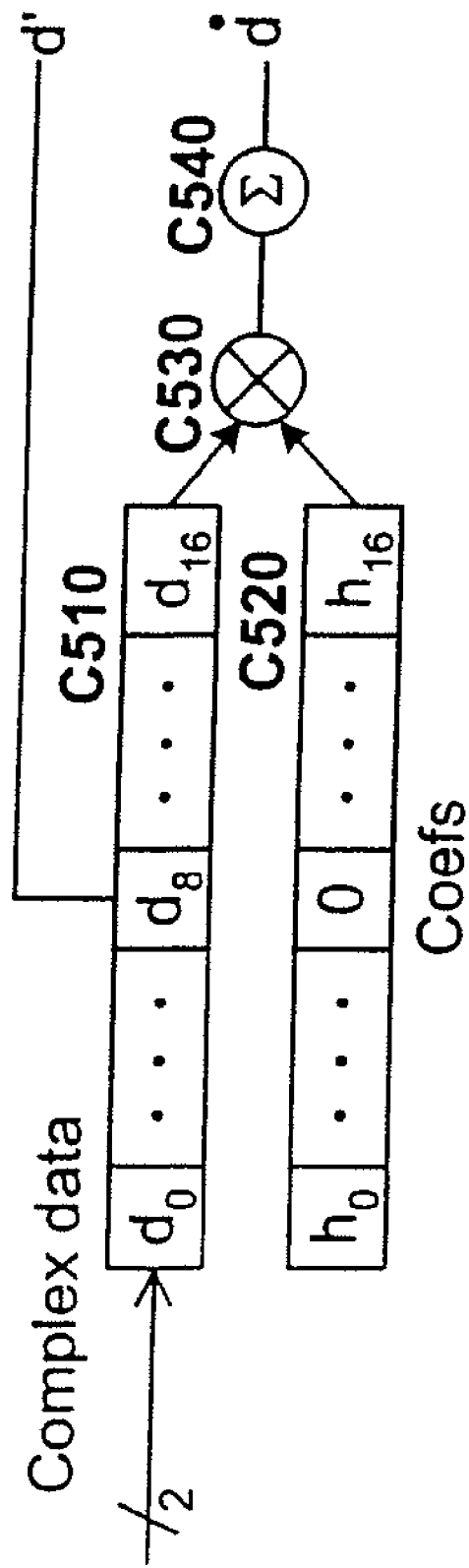
FIG. 62 illustrates a seventeen-tap differentiator.

One embodiment of the present invention implements a 17 tap differentiator illustrated in FIG. 62. Similar to the 5 tap differentiator, data is passed through element C510 with a center tap providing the delayed d' data output. Coefficients are stored statically in element C520 with each new complex data input fed into the data delay element C510 creating a product-sum in elements C530 and C540. Further modifications to the demodulator taps (e.g., to length N) may further improve performance. One embodiment of the present invention implements a QAM correlator which translates the M-ary FSK input to a quadrature constellation for post processing. More specifically, the present invention translates 7 level FSK into a 16QAM constellation. The QAM correlator uses sequential time intervals of the 7 level FSK to encode the QAM constellation. Still more specifically, the 7 specific frequency tones are patterned over 4 successive time intervals to encode 16 discrete symbols as encoded in FIG. 63.

Each of the 7 frequency tones are represented in FIG. 63 as −3, −2, −1, 0, 1, 2 or 3. Classical FSK rules apply such that each tone is uniformly spaced to maximize receive sensitivity. 16 unique symbols are encoded by transitioning four tones over time. Furthermore, each defined symbol uses a set of tones which are centered about the center frequency, thus producing an inherent whitening element useful in the transmitter section as described earlier herein. Each symbol, when translated to its binary equivalent, is so arranged as to provide for single bit error correction due to a gray code allocation. A constellation error in either the real or imaginary direction produces a single bit error which is correctable using a simple cyclical redundant correction (CRC) code embedded in the message.

PSK and ASK Modulation Method

In further embodiments of the present invention, rather than using an FSK modulation, phase shift keying (PSK) or amplitude shift keying (ASK) is used to modulate the data onto a carrier frequency. PSK and ASK modulation techniques are well known to those of ordinary skill in the communications art. In these embodiments, the PSK or ASK modulator is coupled to the QAM encoder and decoder to leverage the concepts described herein for other modulation techniques.

Figure 64:
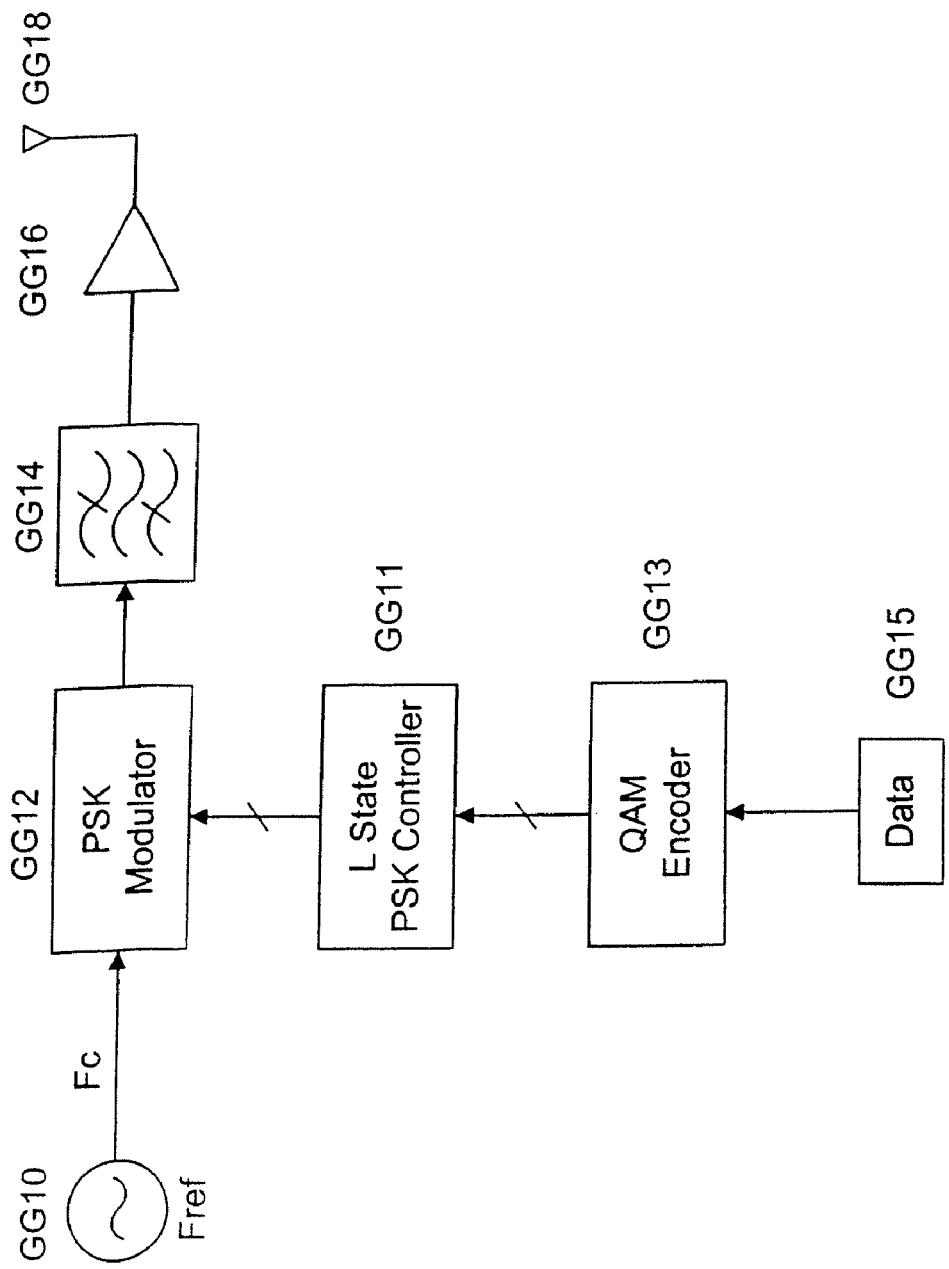
FIG. 64 is a block diagram of a basic PSK transmitter according to one embodiment of the present invention.

FIG. 64 illustrates that the FSK modulator of the present invention may be replaced by, for example, a PSK modulator. FIG. 64 is a block diagram of a simple transmit device demonstrating an implementation of the PSK modulator according to one embodiment. As shown in FIG. 64, an oscillator GG10 generates a carrier frequency used to transmit a signal. The oscillator GG10 represents a frequency generation capability at the transmission frequency. In practice, the transmission frequency may be created using any one of several known techniques including, but not limited to, upconversion, synthesis, phase locked loops, or any number of other techniques known in the art. For the purposes of this disclosure, the generation of the transmission frequency is simplified to demonstrate that the transmitter creates a frequency that is subsequently modulated to carry data. The PSK modulator of element GG12 induces a discrete phase shift for the carrier frequency created by the oscillator GG10. The phase shift may be induced by a configurable time delay or other mechanism to provide a fixed phase shift in frequency controllable by the L-State PSK controller GG11. The output of the PSK modulator GG12 is provided to a bandpass filter GG14 to manage spectral growth due to phase shifting of the carrier signal. In practice, this spectral re-growth may be managed directly by the PSK modulator GG12 by controlling the phase transition boundaries to limit phase discontinuities.

As would be understood by those of ordinary skill in the communications art, the filtering process can be illustrated as an independent element, such as bandpass filter GG14, while being implemented in another component of the transmit system. The bandpass filter GG14 is optional, since it merely limits adjacent channel interference. The gain element GG16 provides the power amplification necessary to transmit the signal. In practice, the gain may be distributed across several elements in the device of the transmit thread. Finally, the signal leaves the transmitter through a radiating element GG18, such as an antenna.

Data is modulated on the carrier at the PSK modulator of GG12. Serialized data from the data source GG15 is encoded by the QAM encoder GG13. The QAM encoder GG13 breaks the serial data into symbols using whatever forward error correction or data packet method is desired. In one embodiment of the present invention, the data is gray encoded into a QAM substructure. While in one embodiment of the present invention a 16 QAM substructure is implemented, other constellations are also feasible. The 16 QAM encoder GG13 of the present invention breaks the serial data into nibbles, gray encodes it onto the 16 QAM constellation, and presents a word of data to the L-State PSK controller GG11.

The L-State PSK controller GG11 accepts the word of data from the QAM encoder GG13 and produces a signal that is usable by the PSK modulator GG12. This signal may be analog or digital. The L-State PSK controller GG11 drives the PSK modulator GG12 with a series of signals that shift the phase of the carrier frequency in a predetermined pattern based on the QAM submodulation approach.

In one embodiment of the present invention, seven discrete phase shifts in a unique set of patterns map to the 16 QAM states. Other phase shifts and QAM submodulation constellation patterns are also possible.

Figure 65:
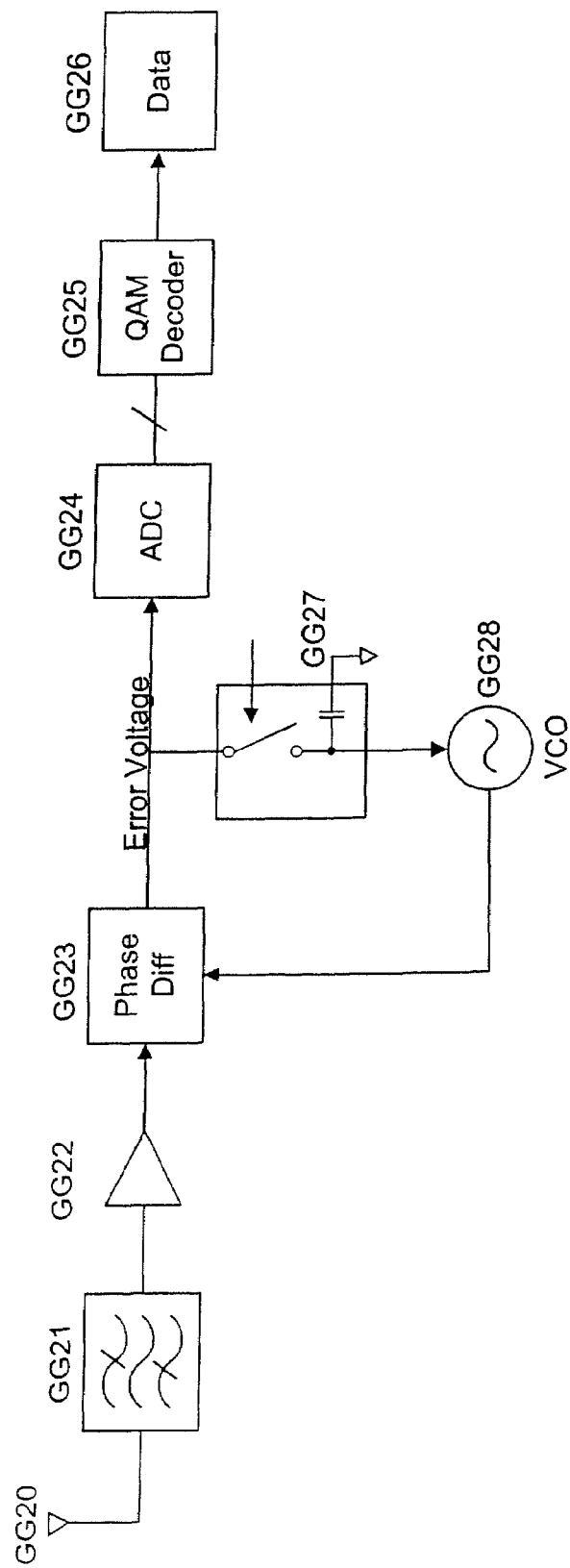
FIG. 65 is a block diagram of a basic PSK receiver according to one embodiment of the present invention.

FIG. 65 illustrates an exemplary receiver embodiment capable of receiving and demodulating a signal from a PSK/QAM transmitter. As with the transmit device described above in the context of FIG. 64, this figure illustrates a generic architecture for the purposes of demonstrating an approach to demodulating a PSK signal that is coupled with a QAM submodulation according to the present invention. The antenna GG20 collects the signal which is subsequently filtered by a passband filter GG21. The passband filter GG21 is an optional element, but typical in receiver architectures, and primarily serves to band limit the input signal for intermodulation protection in subsequent mixer or amplification elements. A receiver typically has at least one downconversion element, as would be understood by those of ordinary skill in the digital communication art. However, for brevity, the downconversion has not been shown in FIG. 65, and is not discussed herein. Gain element GG22 represents a distributed gain for the receiver that is sufficient to operate subsequent differentiation and data demodulation. A phase differentiator GG23 compares the received signal phase with that of a local reference GG28. The local reference may be a VCO or other frequency generation mechanism. In the example of FIG. 65, the local reference is a VCO that has two modes of operation. While the signal is in acquisition mode, the track and hold element GG27 is configured to track. The error voltage created in the phase differentiator GG23 is fed back to the VCO to track out error and create a coherent receiver architecture. The diagram is not necessarily complete, as most feedback error correction techniques that are known in the art employ filtering to limit oscillations. Once the signal is acquired, the track and hold element GG27 is configured to hold for the duration of the message reception. Changes in input phase due to data modulation beyond the leader, appear on the error voltage node for digitization by the analog to digital conversion (ADC) block GG24. Data demodulation in the QAM decoder GG25 operates on the sequence of phases measured by the ADC element. The QAM decoder GG25 correlates the series of phases into a serial data stream GG26.

This feedback, closed loop architecture represents a coherent decoding method. In another embodiment, a non-coherent decoding method is used. A non-coherent decoding method simply monitors the DC voltage on the error node during the leader portion of the message and derives data relative to that node voltage. Either method results in a method for demodulating data from the phase differentiator relative to the detected phase during the leader portion of a message.

The QAM decoder GG25 correlates the sequence of received phases (voltages) into symbols that reside on the QAM constellation. The output of the QAM decode block is serial or symbol-grouped data.

Figure 66:
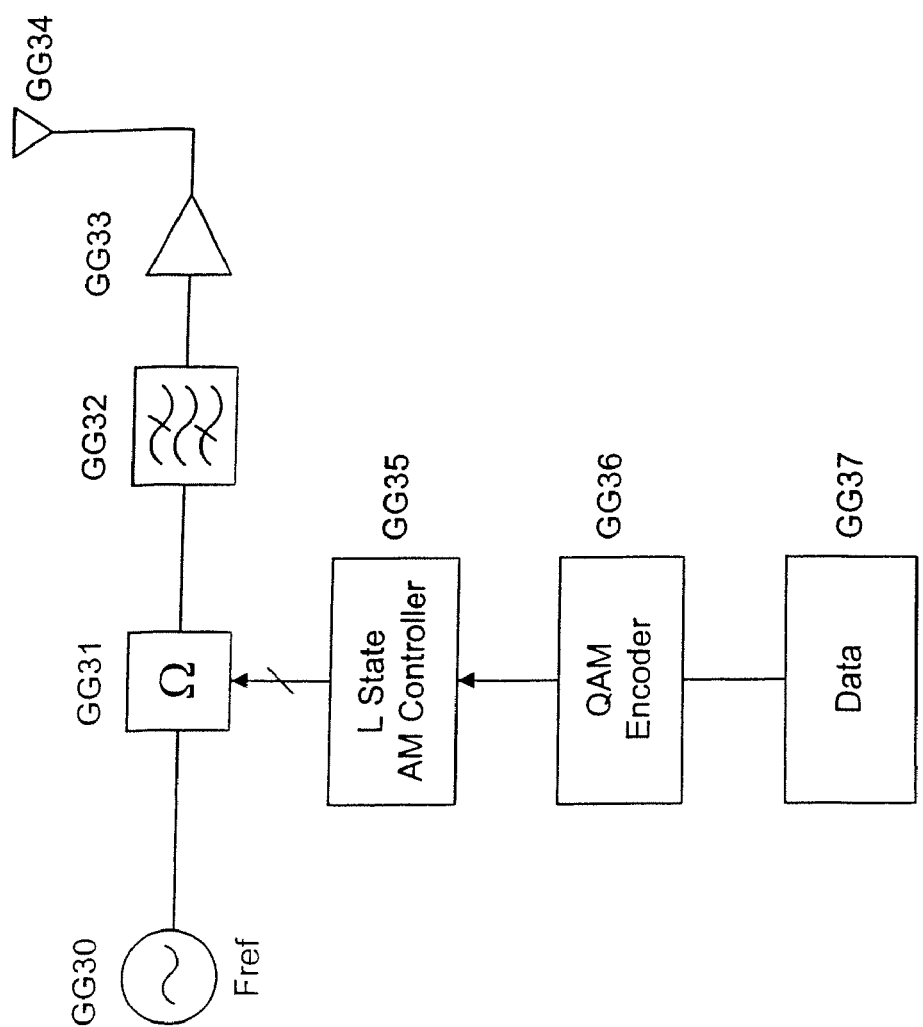
FIG. 66 is a block diagram of a basic ASK transmitter according to one embodiment of the present invention.
Figure 67:
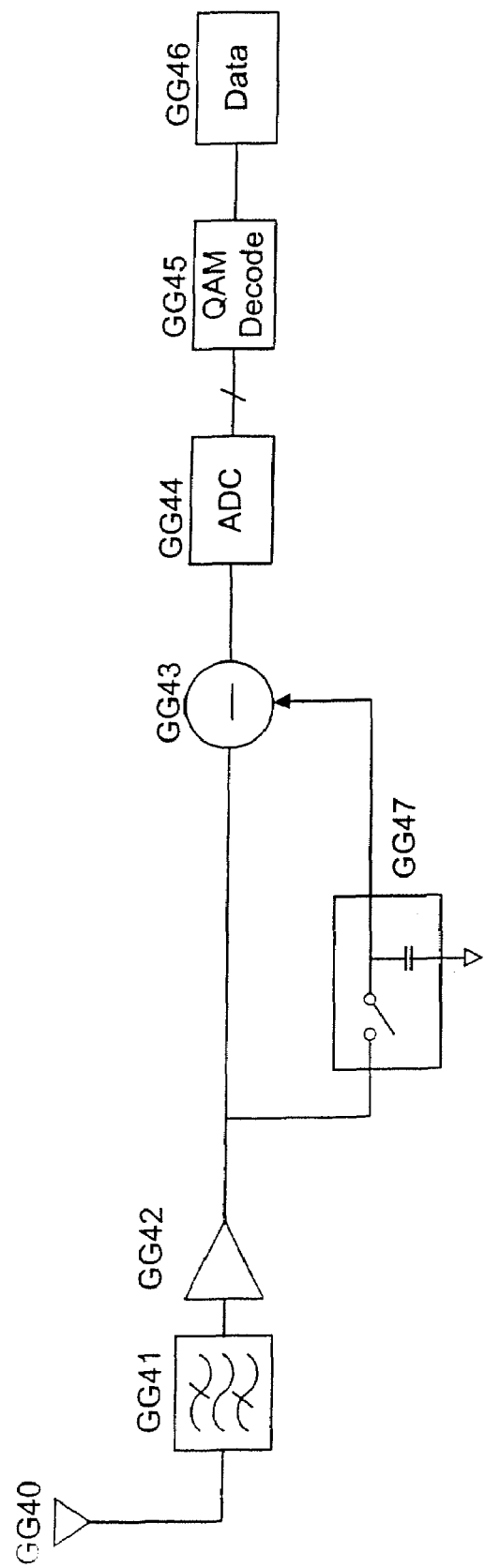
FIG. 67 is a block diagram of a basic ASK receiver according to one embodiment of the present invention.

In yet another variation of the present invention, amplitude shift keying is coupled to the QAM submodulation to modulate the data. FIGS. 66 and 67 illustrate an exemplary transmitter and receiver that use this technique. Amplitude shift keying has some operational limitations compared to FSK and PSK due to typical fading characteristics found in radio communication systems. However, for conducted communication systems, the ASK method may have utility.

FIG. 66 illustrates an exemplary transmit device configured to use an ASK/QAM modulation technique. As shown in FIG. 66, a local oscillator GG30 sets a transmission frequency and can be implemented by, for example, a direct oscillator, or a combination of devices where a signal is generated and upconverted. A configurable attenuation element GG31 is direct modulated to output the carrier frequency attenuated by data. A filter GG32 is used to limit the spectral growth due to instantaneous amplitude shift keying. As in the PSK system described above, this filtering may be accomplished in several ways including direct slew limiting in the attenuation element GG31. For illustration purposes, the filter GG32 is included as a reminder that without filtering, some undesirable spectral growth may occur. Adjacent channel requirements of the system set the bandpass parameters for the filter. The gain element GG33 represents the amplification necessary to transmit the signal at power via the radiating element GG34. In practice this gain is often distributed throughout the transmit thread of components.

The data source GG37 provides data to be encoded by the QAM encoder GG36 similar to the systems described above for FSK and PSK transmitters. In the ASK case, a series of L amplitudes are used to encode the QAM constellation. In one embodiment of the present invention, 16 discrete constellation points are mapped to 7 discrete amplitudes to create a modulation method where DC components on the transmitted AM waveform are zero. The QAM encoder GG36 performs this function for a given data symbol to ensure the selected set of L state amplitudes have no DC mean. The L state controller GG35 merely steps out the sequence of amplitudes corresponding to the encoded symbol from the QAM encoder GG36.

FIG. 67 illustrates an exemplary receiver capable of demodulating a signal transmitted by an ASK/QAM transmitter. The antenna element GG40 collects the signal and provides it to a filter GG41 to remove energy outside the frequency of desired signal reception. The filter GG41 is used to limit intermodulation in subsequent downconversion or amplification mechanisms. A feedback error tracking system is used to measure the received amplitude of the signal during the leader and to use the measured amplitude as a reference during the data portion of the message. This is accomplished using a sample and hold circuit GG47 that measures the RMS voltage during the leader portion of the signal with the switch closed, and holds that voltage during the data portion of the message with the switch open. Alternatively, the DC mean of the signal can be measured in the data, subtracting out the offset to correct in an open loop system, thus reducing the need for sample and hold or correction circuits altogether.

A difference node GG43 subtracts the RMS voltage captured during the leader from the signal to produce a DC removed data signal to be sampled by the analog to digital converter (ADC) GG44.

An amplitude detector, for example the ADC GG44, measures the RMS amplitude of the signal and produces a voltage proportional to the amplitude of the signal. The ADC GG44 or other comparison mechanism can be used to differentiate discrete states in amplitude. The ADC GG44 measures the voltage changes which are relative to data modulation in the signal and produces a series of amplitudes that are provided to the QAM decoder GG45 where the constellation symbols are decoded to serial data GG46.

The ADC GG44 must have sufficient input range to eliminate the difference block and sample and hold elements. The QAM decoder can simply measure the ADC GG44 output during the leader and perform data demodulation relative to the measured ADC GG44 output.

As discussed above, the transmit and the receive hardware diagrams, FIGS. 64-67, are simplified diagrams that build on the principles described herein in the context of an FSK modulation technique. The diagrams are illustrative of different techniques for coupling data modulation to the QAM subcarrier. As in the case of the FSK/QAM method, the encoding and decoding mechanism can be accomplished without inducing DC into the modulation mechanism.

Frequency Uncertainty Resolution

In one embodiment of the present invention, a variety of compensation techniques are provided to deal with frequency uncertainty in a transmit to receive communication system. The various techniques have previously been disclosed herein, but not necessarily together. The following will serve to bring together the techniques and discuss their usefulness for receiver systems with a variety of transmitter models.

When the transmitter and receiver components have tightly controlled frequency references, frequency uncertainty is small and very slight accommodation is necessary. As discussed above, one embodiment of the present invention includes a receive architecture whereby a simple, two tap FM differentiator is sufficient to pass the received signal, provided it was centered in the most linear region of the demodulator.

As the transmitter or receiver endpoints relax their frequency reference requirements, it becomes necessary to extend the linear region of the FM detector to accommodate the DC offset of in the modulation domain. The subsequent QAM demodulators have inherent DC removal in the implementation. The system limitation remains the linearity of the FM demodulator as it discriminates the signal with frequency uncertainty. The previous discussion disclosed methods implemented in various embodiments of the present invention to reasonably extend the linear region of the FM demodulator to accommodate frequency uncertainty.

As the frequency uncertainty between transmitter and receiver continues to grow beyond the reasonable expansion of the FM demodulator, embodiments of the present invention use a method to process and a plurality of channelized filters with voting mechanisms to select and direct a favorable channel to a FM demodulator for use. This technique works well to balance the processing requirements of the FM processing thread with sample rate and passband components in the system.

As the frequency uncertainty between the transmitter and receiver continues to grow beyond the desirable or possible plurality of filters to resolve, it is possible to step the receiver local reference and block translate a bandwidth of signal for processing in a deterministic search method as previously discussed. This type of frequency resolution method has system impact which can be accommodated by several approaches including extending the transmitter leader as an example.

Together, the present invention provides for multiple methods of resolving frequency uncertainty. The present invention implements all of these techniques toward different system implementations as dictated by application requirements.

The present invention is applicable to a variety of applications that have heretofore been prohibitive or impractical due to associated infrastructure, wiring, and/or labor costs. For example, on a small scale, the present invention enables many LAN-based applications. These applications are typically installed within an environment that is either owned or controlled by a user, such as, for example, a house, an office building, or a campus environment. These systems tend to support applications where the information gathered is time sensitive, and the information may be used for automating control. Applications include, but are not limited to, fire alarms, access control, security, HVAC/Energy management, lighting control, process control/industrial sensing, equipment monitoring (e.g., for vibration), remote moisture sensing/irrigation control, train health monitoring, local slow frame closed circuit television, local asset tracking through an RF identifier, halon dispensing, nurse call, tank leak detection, or reefer container temperature monitoring.

As another example, on a larger scale, the present invention enables many WAN-based applications. These applications are typically geographically distributed over an area that is not owned or controlled by any one user. These systems tend to support less time-critical applications where the information gathered is for management, billing, or some human action. Applications include, but are not limited to, utility meter reading, tank level monitoring (e.g., for re-supply scheduling), termite detection, vending machine status monitoring, equipment service monitoring, vibration monitoring (e.g., for failure prediction), various GPS applications (e.g., location or routing), "home" arrest, package tracking, wide area asset tracking, intermodal freight health, credit card verification, remote access HVAC control, or various quick response applications (e.g., chiller down).

The present invention may be deployed using different frequency bands as shown below in Table 1. Table 1 provides an exemplary list of several frequency bands at which the present invention may operate. However, the present invention is not limited to operation within the frequency bands listed in Table 1.

TABLE 1

| FROM | TO |
| --- | --- |
| 176 MHz | 185 MHz |
| 216 MHz | 218 MHz |
| 218 MHz | 219 MHz |
| 220 MHz | 222 MHz |
| 223 MHz | 235 MHz |
| 868 MHz | 872 MHz |
| 902 MHz | 928 MHz |
| 955 MHz | 960 MHz |

TABLE 1-continued

| FROM | TO |
|---|---|
| 2.4 GHz | 2.4835 GHz |
| 5.725 GHz | 5.85 GHz |

Figure 68:
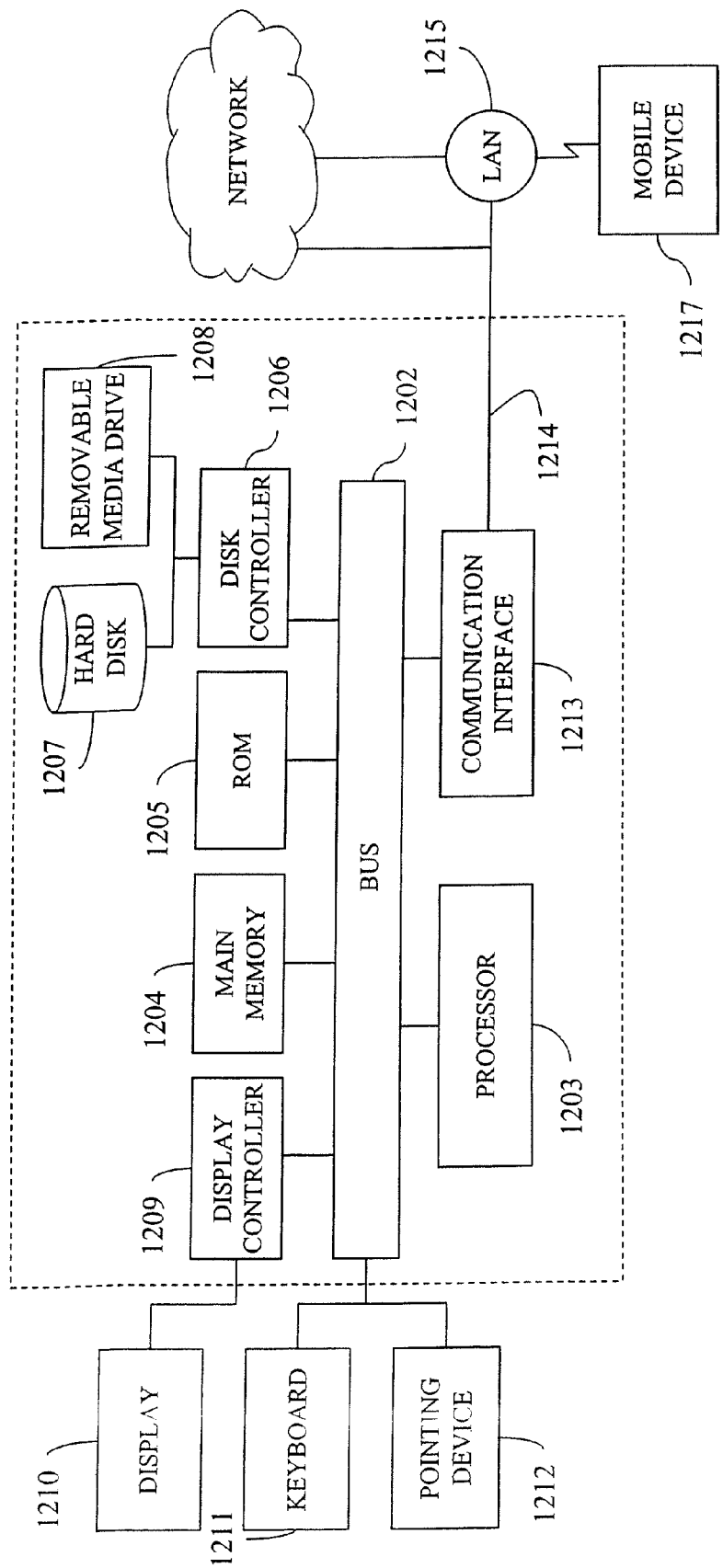
FIG. 68 is an exemplary computer system programmed to perform one or more of the special purpose functions of the present invention.

FIG. 68 illustrates a computer system 1201 upon which an embodiment of the present invention may be implemented. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to a another computer through a local network 1215 (e.g., a LAN) or through equipment operated by a service provider, which provides communication services through a communications network 1216. In preferred embodiments, the local network 1214 and the communications network 1216 preferably use electrical, electromagnetic, or optical signals that carry digital data streams. The signals through the various networks and the signals on the network link 1214 and through the communication interface 1213, which carry the digital data to and from the computer system 1201, are exemplary forms of carrier waves transporting the information. The computer system 1201 can transmit and receive data, including program code, through the network(s) 1215 and 1216, the network link 1214 and the communication interface 1213. Moreover, the network link 1214 may provide a connection through a LAN 1215 to a mobile device 1217 such as a personal digital assistant (PDA) laptop computer, or cellular telephone. The LAN communications network 1215 and the communications network 1216 both use electrical, electromagnetic or optical signals that carry digital data streams. The signals through the various networks and the signals on the network link 1214 and through the communication interface 1213, which carry the digital data to and from the system 1201, are exemplary forms of carrier waves transporting the information. The processor system 1201 can transmit notifications and receive data, including program code, through the network(s), the network link 1214 and the communication interface 1213.

Obviously, numerous modifications and variations of the present invention are possible in light of the above teachings. It is therefore to be understood that within the scope of the appended claims, the invention may be practiced otherwise than as specifically described herein.

What is claimed is:

1. A mobile multifrequency transmitter, comprising:
a self-locator configured to determine a current self location without transmitting an outgoing signal, and to provide the current self location to a frequency selector;
the frequency selector configured to select a usable frequency based on said current self location;
a timer configured to generate a wake-up event; and
a communication unit configured to transmit on said selected usable frequency in response to the wake-up event generated by the timer.

2. A mobile multifrequency transmitter according to claim 1, wherein the self-locator is a Global Positioning System receiver, configured to calculate the current self location based on a signal from a Global Positioning System satellite.

3. A mobile multifrequency transmitter according to claim 1, wherein the self-locator is an inertial navigation system.

4. A mobile multifrequency transmitter according to claim 1, further comprising a database configured to store geographic locations associated with usable frequencies, from which the frequency selector selects the useable frequency associated with a current geographic location.

5. A mobile communication method, comprising:
obtaining a current self location from a self-locator without transmitting an outgoing signal;
retrieving from a database, an allowable frequency band corresponding to the current self location;
generating a wake-up event by an internal timer; and
transmitting on the allowable frequency band in response to the wake-up event generated by the internal timer.

6. A mobile multifrequency transmitter according to claim 1, wherein the communication unit is further configured to suspend transmitting on the selected usable frequency when the multifrequency transmitter moves to a new location and no new usable frequency can be selected based on the new location.

7. A mobile multifrequency transmitter, comprising:
an inertial navigation system configured to determine a current self location without transmitting an outgoing signal and without receiving a radio frequency signal, and to provide the current self location to a frequency selector;
the frequency selector configured to select a usable frequency based on said current self location; a timer configured to generate a wake-up event; and
a communication unit configured to transmit on said selected usable frequency in response to the wake-up event generated by the timer.

8. The mobile multifrequency transmitter according to claim 7, further comprising a database configured to store geographic locations associated with usable frequencies, from which the frequency selector selects the useable frequency associated with a current geographic location.

9. The mobile multifrequency transmitter according to claim 7, wherein the wake-up event is caused by an external sensor.

10. The mobile multifrequency transmitter according to claim 7, wherein the timer is an internal timer.

11. The mobile multifrequency transmitter according to claim 7, wherein the communication unit is further configured to suspend transmitting on the selected usable frequency when the multifrequency transmitter moves to a new location and no new usable frequency can be selected based on the new location.

* * * * *